United States Patent [19]
Yamada et al.

[11] Patent Number: 6,118,319
[45] Date of Patent: *Sep. 12, 2000

[54] TIMING SIGNAL GENERATION CIRCUIT

[75] Inventors: Toshio Yamada, Kadoma; Masashi Agata, Osaka, both of Japan

[73] Assignee: Matsushita Electric Industrial Co., Ltd., Kadoma, Japan

[*] Notice: This patent is subject to a terminal disclaimer.

[21] Appl. No.: 09/017,363

[22] Filed: Feb. 2, 1998

Related U.S. Application Data

[62] Division of application No. 08/658,931, May 31, 1996, Pat. No. 5,892,384.

[30] Foreign Application Priority Data

Aug. 18, 1995 [JP] Japan ..................................... 7-210889
Apr. 26, 1996 [JP] Japan ..................................... 8-108278

[51] Int. Cl.[7] ...................................................... G06F 1/04
[52] U.S. Cl. ................................ 327/291; 327/298; 327/3
[58] Field of Search ................................... 327/2, 3, 7, 8, 327/10, 18, 20, 227, 229, 291, 293, 295, 298

[56] References Cited

U.S. PATENT DOCUMENTS

| | | | |
|---|---|---|---|
| 4,710,653 | 12/1987 | Yee ........................................... | 327/38 |
| 5,059,838 | 10/1991 | Motegi et al. ........................... | 307/603 |
| 5,204,564 | 4/1993 | Ochiai ...................................... | 327/262 |
| 5,268,594 | 12/1993 | Huang ...................................... | 327/172 |
| 5,306,963 | 4/1994 | Leak et al. ............................... | 327/14 |
| 5,467,041 | 11/1995 | Baba et al. ............................... | 327/276 |
| 5,578,945 | 11/1996 | Flora ........................................ | 327/156 |
| 5,646,568 | 7/1997 | Sato ......................................... | 327/277 |
| 5,668,491 | 9/1997 | Higashisaka et al. ................... | 327/277 |
| 5,892,384 | 4/1999 | Yamada et al. .......................... | 327/277 |

OTHER PUBLICATIONS

A. Young et al., IEEE Journal of Solid–State Circuits, vol. 27, No. 11, pp. 1599–1607, 1992. A PLL Clock Generator with 5 to 110 Mhz of Lock Range for Microprocessor.

*Primary Examiner*—Toan Tran
*Attorney, Agent, or Firm*—Renner, Otto, Boisselle & Sklar

[57] ABSTRACT

A timing signal generation circuit according to the present invention includes: a delay circuit for transmitting an input clock signal while delaying the clock signal, the delay circuit having a plurality of intermediate taps capable of outputting the clock signal at their corresponding positions in the delay circuit; a detection delay circuit for transmitting the clock signal while delaying the clock signal, the detection delay circuit having a plurality of intermediate taps capable of outputting the clock signal at their corresponding positions in the detection delay circuit; a plurality of sample/hold circuits each having a sampling signal terminal, the sampling signal terminals being connected to corresponding ones of the plurality of intermediate taps of the detection delay circuit; a plurality of boundary delay circuits for detecting an edge of the clock signal, the boundary detection circuits being connected to respective output terminals of the sample/hold circuits; and an output selection circuit for extracting the clock signal via at least one of the plurality of intermediate taps selected in accordance with an edge position of the clock signal detected by the boundary detection circuits, the output selection circuit outputting the extracted clock signal as a timing signal.

7 Claims, 45 Drawing Sheets

Operating mechanizm of semi-digital implimentations

|   | 1 | 2 | ... | i−1 | i | i+1 | i+2 |
|---|---|---|-----|-----|---|-----|-----|
| A | 1 | 1 | 1 | 1 | 0 | 0 | 0 |
| xA | 0 | 0 | 0 | 0 | 1 | 1 | 1 |
| B | 1 | 1 | 1 | 1 | 1 | 1 | 0 |
| nwr discharge | | | | | ↙ | ↙ | |

Timing diagram (Small-amplitude repeater of two-phase clocks using NDC)

(Operation waveform of small-amplitude repeater of two-phase clocks using NDC)

PMOS

6,118,319

TIMING SIGNAL GENERATION CIRCUIT

This is a division of application Ser. No. 08/658,931, filed May 31, 1996, and U.S. Pat. No. 5,892,384.

BACKGROUND OF THE INVENTION

1. Field of the Invention

The present invention relates to the generation of timing signals (or internal clock signals) used in semiconductor integrated circuits (ICs), and more particularly to a timing signal generation circuit and a data transfer circuit, etc., utilizing the timing signal generation circuit.

2. Description of the Related Art

In recent years, semiconductor ICs such as microprocessors and high-speed memories are expected to operate at inconceivably high speeds, e.g., 80 MHz or 100 MHz, and even 150 MHz or 200 MHz. However, circuit chips required to operate at such high speeds are susceptible to the problem of phase shifting of clock signals, which hinders their high-speed operation capabilities.

This problem will be described with reference to FIGS. 33 and 47 below.

FIG. 46 is a schematic diagram showing a manner in which clock signals are input to conventional semiconductor ICs (semiconductor chips). A clock signal generation circuit receives an external clock signal from a timing signal generation circuit located on the same circuit board, via an external clock signal input terminal. The clock signal generation circuit generates an internal clock signal which is in synchronization with the external clock signal. The generated internal clock signal is supplied to various circuits in the semiconductor chip. The external clock signal output from the timing signal generation circuit on the circuit board is also supplied to the external clock signal input terminals of other semiconductor chips on the same circuit board. Various processes are performed by the semiconductor chips using the internal clock signal (generated by the clock signal generation circuit) as a timing signal. For example, data may be input from an output circuit to the signal input terminals of other semiconductor chips via a data output terminal, in accordance with a timing signal.

FIG. 47A shows the waveform of an external clock signal generated by the above-mentioned timing generation circuit on the circuit board. FIGS. 47B and 47D show a signal waveform taken at a clock terminal of an output circuit. Specifically, FIG. 47B describes the case with only a small internal delay. FIG. 47D describes the case with a large internal delay. FIG. 47C shows an output waveform from a semiconductor chip having a small internal delay. FIG. 47D shows an output waveform from a semiconductor chip having a large internal delay. In FIG. 47C, the output from the semiconductor chip becomes stable by the time a subsequent semiconductor chip makes an access for reading out a signal. On the contrary, in FIG. 47E, the output from the semiconductor chip is not stable or established yet by that time.

As shown in FIG. 46 and FIGS. 47A to 47E, the data in an output signal from an output circuit of one semiconductor chip can be stably read by a subsequent semiconductor chip in synchronization with a clock signal on the circuit board as long as the cycle of the clock signal is sufficiently longer than the internal delay time of the clock taken at the output circuit of the former semiconductor chip. On the other hand, when the cycle of a clock signal is not sufficiently longer than the internal delay time of the clock (taken at the output circuit of the former semiconductor chip), the data in the output signal from that output circuit is not stabilized yet when it is read by a subsequent semiconductor chip.

In order to solve the above-mentioned problem of internal delay, a circuitry technique called PLL (PhaseLocked Loop) is conventionally employed in many cases. This technique will be described below. (See literature such as IEEE Journal of Solid state Circuits vol. 27, no 11, November 1992, p. 1599 for conventional PLL techniques.)

The main cause for the internal delay time of a clock signal, taken at an output circuit of a semiconductor chip, is the delay time of a clock driver. The delay time of a clock driver is typically increased by a large capacitance resulting from a large number of destinations of clock driver lines, which increases the time required for charging/discharging of the clock driver. FIG. 48 shows the schematic configuration of a PLL circuit for eliminating the delay time of a clock driver. Conventional PLL circuits adopt the configuration shown in FIG. 48 in order to minimize such delay in a clock driver.

First, as shown in FIG. 48, an external clock signal is input to one end of a phase difference detection circuit. Another end of the phase difference detection circuit is coupled to the output of a clock driver (i.e., a clock driver line). A voltage controlled oscillator (VCO) is controlled by the output of the phase difference detection circuit. The output of the VCO controls the clock driver. Specifically, the phase difference detection circuit controls the voltage at a control terminal of the VCO so that the entire circuit becomes stable when the output of the clock driver matches the external clock signal in terms of both phases and cycles. In that state, the apparent delay time caused by the clock driver becomes zero. Thus, conventional PLL circuits can provide a large advantage of eliminating the apparent delay time caused by the clock driver.

However, the above-described conventional technique has a problem of a long "setup time", which is defined as the time required from the beginning of the generation of a given clock signal till it becomes possible to stably generate the clock signal. The setup time can take several dozen clocks to several thousand clocks (amounting to several microseconds to several milliseconds in some extreme cases). Until the setup time elapses, normal operation cannot be expected.

SUMMARY OF THE INVENTION

A timing signal generation circuit according to the present invention includes: a delay circuit for transmitting an input clock signal while delaying the clock signal, the delay circuit having a plurality of intermediate taps capable of outputting the clock signal at their corresponding positions in the delay circuit; a detection delay circuit for transmitting the clock signal while delaying the clock signal, the detection delay circuit having a plurality of intermediate taps capable of outputting the clock signal at their corresponding positions in the detection delay circuit; a plurality of sample/hold circuits each having a sampling signal terminal, the sampling signal terminals being connected to corresponding ones of the plurality of intermediate taps of the detection delay circuit; a plurality of boundary delay circuits for detecting an edge of the clock signal, the boundary detection circuits being connected to respective output terminals of the sample/hold circuits; and an output selection circuit for extracting the clock signal via at least one of the plurality of intermediate taps selected in accordance with an edge position of the clock signal detected by the boundary detection circuits, the output selection circuit outputting the extracted clock signal as a timing signal.

Alternatively, a timing signal generation circuit according to the present invention includes: a first delay line and a second delay line for transmitting a clock signal while delaying the clock signal; an input section for inputting the clock signal to the first delay line and the second delay line; a detection circuit for detecting an edge position of the clock signal in the first delay line responsive to an edge of the clock signal; and means for extracting the clock signal from the second delay line, the clock signal being shifted from the detected edge position by a distance corresponding to a predetermined delay time.

Alternatively, a timing signal generation circuit according to the present invention includes: a base delay line for transmitting a clock signal while delaying the clock signal; a delay time determination delay circuit for effecting a delay corresponding to a negative delay time; an input section for inputting the clock signal to the base delay line and the delay time determination delay circuit; a post-delay delay line for receiving an output of the delay time determination delay circuit; a means for detecting an edge position of the clock signal in the post-delay delay line responsive to an edge of the clock signal; and a means for extracting the clock signal in the base delay line at a position corresponding to the detected edge position.

In another aspect of the present invention, a fundamental unit for a timing signal generation circuit is provided, a plurality of fundamental units being interconnected with one another to constitute at least a portion of the timing signal generation circuit, wherein the fundamental unit includes: a unit delay circuit included in a post-delay delay line for transmitting a clock signal while delaying the clock signal, the clock signal having been previously delayed by a pre-determined amount of time; a sample/hold circuit for sampling a state of the clock signal on the post-delay delay line; tap output means for outputting an output of the sample/hold circuit; a boundary detection circuit for detecting a boundary between different states of the clock signal based on an output of the sample/hold circuit and an output of the tap output means of the preceding sample/hold circuit; a clock output circuit controlled by an output of the boundary detection circuit; a clock termination control output circuit controlled by the output of the boundary detection circuit; and a base delay unit delay circuit whose output is coupled to the clock output circuit and base delay output means and whose input is coupled to base delay input means.

In one embodiment of the invention, the timing signal generation circuit includes a number N (wherein N is an integer equal to or greater than 3) of the said fundamental units interconnected with one another in series, wherein the timing signal generation circuit further includes: a minus delay time determination delay circuit for receiving a clock signal generated from an external clock signal, delaying the clock signal by a predetermined amount of time, and inputting the clock signal to post-delay delay line input means of the postdelay delay line in the first fundamental unit; means for generating a sampling signal from the clock signal and supplying the sampling signal to the sample/hold circuits of the respective fundamental units; clock signal output means for receiving an output clock of each fundamental unit and outputting the clock signal as a timing signal, and wherein the base delay input means of the $i^{th}$ (1<i<N) fundamental unit is coupled to the base delay output means of the $(i-1)^{th}$ fundamental unit, the base delay input means of the $1^{st}$ fundamental unit receiving the clock signal generated from the external clock signal and transmitting the clock signal to the base delay input means of the subsequent fundamental unit; the post-delay delay input means of the $i^{th}$ fundamental unit is coupled to the post-delay delay output means of the $(i-1)^{th}$ fundamental unit, the post-delay delay input means of the $1^{st}$ fundamental unit receiving the clock signal output from the minus delay time determination delay circuit and transmitting the clock signal to the post-delay delay input means of the subsequent fundamental unit; tap output means of the $i^{th}$ fundamental unit is coupled to the tap input means of the $(i-1)^{th}$ fundamental unit; and the clock termination control output circuit of the $i^{th}$ fundamental unit is coupled to the clock termination control output circuit of the $(i-1)^{th}$ fundamental unit and any subsequent fundamental unit.

Alternatively, a timing signal generation circuit according to the present invention includes: first delay means for delaying an input clock signal by a predetermined amount of time and outputting the delayed clock signal; time difference measurement means for measuring a time difference between the clock signal and an output signal from the first delay means; storage means for storing the measured time difference; second delay means for receiving the clock signal, delaying the received clock signal by a time corresponding to the time difference stored in the storage means, and outputting the clock signal; and output means for outputting the output of the second delay means as a timing signal.

In one embodiment of the invention, the timing signal generation circuit further includes updating means for updating the time difference stored in the storage means, wherein the time difference measurement means updates the time difference during a cycle or period different from a cycle or period of the clock signal including a time at which the time difference measurement means measures the time difference.

In another embodiment of the invention, the measurement by the time difference measurement means and an operation of the second delay means are performed in a pipe-line manner.

Alternatively, timing signal generation circuit according to the present invention includes: means for receiving a clock signal and generating first timing signals by dividing the received clock signal; a plurality of first delay means for receiving the first timing signals, delaying the first timing signals by a predetermined time, and outputting the delayed first timing signals; time difference measurement means for measuring time differences between the first timing signals and an output from the first delay means; storage means for storing the measured time differences; a plurality of second delay means for receiving the first timing signals, delaying the first timing signals by a time corresponding to the time difference stored in the storage means, and outputting the delayed first timing signals; and output means for switching between outputs of the plurality of second delay means and selectively outputting at least one of the outputs of the plurality of second delay means as a timing signal.

In one embodiment of the invention, the storage means stores the time difference as a potential difference.

Alternatively, a timing signal generation circuit according to the present invention includes: timing signal generation means for generating a timing signal having a pseudo-negative delay time with respect to an input clock signal; and clock adjustment means for receiving the timing signal generated by the timing signal generation means and the clock signal so as to select one of the timing signal and the clock signal which has been received earlier as an output clock edge.

Alternatively, a timing signal generation circuit according to the present invention includes: a first delay line including a plurality of first delay elements serially connected with one another, the first delay elements being capable of taking either one of two states, and the first delay element delaying and transmitting change in the states of the first delay elements during a predetermined period; a second delay line including a plurality of second delay elements serially connected with one another, the second delay elements being capable of taking either one of two states, and the second delay element delaying and transmitting change in the states of the second delay elements; a plurality of wired OR circuits having control terminals connected to corresponding ones of the delay elements in the first delay line and the second delay line, the plurality of wired OR circuits connecting output sections with a wire having a first potential when a state of one of the delay elements in the first delay line matches with a state of a corresponding one of the delay elements in the second delay line; an output circuit connected to the output sections of the plurality of wired OR circuits; and an activation circuit for activating the change in the states of the first delay line and the second delay line, wherein an output of the output circuit is output as a timing signal.

In one embodiment of the invention, the first delay line and the second delay line each includes a plurality of units serially connected to one another, each one of the plurality of units including a clocked inverter circuit, and inverter circuit coupled to an output of the clocked inverter circuit, and means for feeding back an output of the inverter circuit to an input of the inverter circuit, whereby the unit transmits an input signal to a next unit while delaying the input signal, during a period in which the clocked inverter circuit is activated, and the timing signal generation circuit further includes means for resetting states of the outputs of the clocked inverter circuits.

A clock signal generation device according to the present invention includes: means for generating a delayed clock signal which is delayed by a predetermined time from a reference clock signal; means for measuring a time difference between the reference clock signal and the delayed clock signal during a first half of a period of the reference clock signal and outputting a clock signal which is earlier than the reference clock signal by a time substantially equal to the predetermined time during a second half of the period of the reference clock signal based on the measured time difference.

In one embodiment of the invention, a duty ratio of the reference clock is substantially 50%.

Alternatively, a clock signal generation device according to the present invention includes: division means for dividing a delayed clock signal which is delayed with respect to a reference clock signal by a predetermined time; first sampling means for receiving the divided clock signal, the first sampling means being controlled by the reference clock signal; second sampling means for receiving the divided clock signal, the second sampling means being controlled by the reference clock signal; first timing signal generation means for receiving a first output clock signal output from the first sampling means and generating a first timing signal; second timing signal generation means for receiving a second output clock signal output from the second sampling means and generating a second timing signal; interleaving means for receiving the first timing signal and the second timing signal and selectively outputting at least one of the first timing signal and the second timing signal; clock process means for outputting an earlier one of an output signal from the interleaving means and the reference clock signal; and buffer means for transmitting an output signal from the clock process means.

In one embodiment of the invention, the first timing signal generation means and the second timing signal generation means each measure a time difference between the first output clock signal and the second output clock signal during a first half of a period of the first or second output clock, and output a clock signal which is earlier than the first or second output clock signal by a time substantially equal to the predetermined time during a second half of the first or second output clock signal based on the measured time difference.

A data transfer circuit according to the present invention includes: at least one data transmission means for outputting data in synchronization with a first clock signal; a data transfer path connected to the data transmission means; and data receiving means for detecting data on the data transfer path in synchronization with a second clock signal, the data transfer circuit further including data transfer control means for controlling operation timing of the data transmission means and operation timing of the data receiving means, wherein the data transfer control means transmits the first clock signal to the data transmission means and transmits the second clock signal to the data receiving means as a signal having a negative delay with respect to the first clock signal.

A method for transferring data from data transmission means to data receiving means via a data transfer path connected to the data transmission means and the data receiving means according to the present invention includess the steps of: transmitting a transmission control signal for controlling timing of data transmission by the data transmission means from data transmission control means to the data transmission means, and transmitting a receiving control signal for controlling timing of data reading by the data receiving means to the data receiving means before the transmission control signal is transmitted.

In one embodiment of the invention, the data transfer path transfers a differential signal.

In another embodiment of the invention, a signal amplitude of data on the data transfer path is reduced to a half or less of an amplitude of the receiving control signal.

In still another embodiment of the invention, an interval between a time at which the receiving control signal is transmitted and a time at which the transmission control signal is transmitted increases as an electrical distance between the data transmission means and the data receiving means increases.

In still another embodiment of the invention, the data transfer circuit further includes capacitance shielding means between the data transmission means and the data transfer path, wherein the capacitance shielding means electrically connects a selected one of the data transmission means to the data transfer path and electrically disconnects non-selected ones of the data transmission means from the data transfer path.

Alternatively, a signal generation circuit according to the present invention includes: first signal generation means for generating a signal having a pseudo-negative delay time with respect to an input signal; second signal generation means for generating a signal having a positive delay time with respect to the input signal; signal transmission means interconnecting the first signal generation means and the second signal generation means; and output means for selectively outputting either an output signal from the first signal generation means or an output signal from the second signal generation means.

A clock control circuit according to the present invention includes: a plurality of timing signal generation circuits each generating a signal having a pseudo-negative delay time with respect to an input clock signal; switch means for selectively inputting a clock signal to at least one of the plurality of timing signal generation circuits; mother clock supply means for supplying a mother clock signal to the switch means; and external clock input means for inputting an external clock signal to the mother clock supply means.

In another aspect of the present invention, a method for controlling a memory using a memory device having a memory space is provide, wherein the memory space includes compressed stored information capable of being output to image output means and stored information capable of being output to means other than the image output means; and a control clock signal supplied to the memory device when accessing to the compressed stored information has a first cycle which is different from a second cycle of a control signal supplied to the memory device when accessing to the stored information capable of being output to means other than the image output means.

In one embodiment of the invention, the first cycle and the second cycles are substantially the same.

A state storage circuit according to the present invention includes: at least one sampling input terminal; a control terminal for receiving a timing signal; a retention terminal outputting a predetermined signal for a predetermined period in accordance with the timing signal; and retention means connected to the retention terminal, wherein the state storage circuit further includes: first MOS transistor means of a first conductivity type having a gate connected to the sampling input terminal and a source connected to a wire having a first potential; an intermediate terminal connected to drains of the respective first MOS transistor means; second MOS transistor means of a second conductivity type having a source connected to the intermediate terminal, a drain connected to a wire having a second potential, and a gate connected to the control terminal; third MOS transistor means of the first conductivity having a source connected to the wire having the first potential, a gate connected to the intermediate terminal, and a drain connected to the retention terminal; fourth MOS transistor means of the second conductivity having a gate connected to the intermediate terminal; and fifth MOS transistor means of the second conductivity type having a gate connected to the control terminal, ground potential, and wherein the fourth and fifth MOS transistor means are connected in series between the retention terminal and the wire having the second potential.

A semiconductor integrated circuit according to the present invention includes the said state storage circuit as clock signal receiving means.

Alternatively, a data transfer circuit according to the present invention includes: a plurality of data buses; at least one trigger signal path; at least one data transmission means coupled to the plurality of data buses via capacitor means and connection means; trigger signal transmission means coupled to the trigger signal path via the connection means, the trigger signal transmission means capable of transmitting a trigger signal to the trigger signal path responsive to a timing signal having a pseudo-negative delay; and amplification means for receiving data on the plurality of data buses responsive to the trigger signal.

In one embodiment of the invention, the trigger signal is transmitted from the trigger signal transmission means before the data is transmitted from the data transmission means to the plurality of data buses.

Alternatively, a data transfer circuit according to the present invention includes: data transmission means for outputting data in synchronization with a first clock signal, the data transmission means including a data transfer driver for outputting the first data signal and an inverted data transfer driver for outputting a second data signal obtained by inverting the first data signal; a first data path for receiving the first data from the data transfer driver; a second data path for receiving the second data from the inverted data transfer driver; and data receiving means for detecting data on the first and second data paths in synchronization with the second clock signal, the data transfer circuit further includes: data transfer control means for controlling operation timing of the data transmission means and the data receiving means; first data transfer capacitance coupling means provided between the data transfer driver and the first data path; second transfer capacitance coupling means provided between the inverted data transfer driver and the second data path; and switch means for selectively conducting the first data path and the second data path with each other.

In one embodiment of the invention, the data transfer circuit further includes further switch means for selectively conducting an output section of the data transfer driver and an output section of the inverted data transfer driver with each other.

In another embodiment of the invention, the data transfer control means transmits the second clock signal to wiring connected to the data receiving means.

In still another embodiment of the invention, the data transfer control means transmits the first clock signal to the data transmission means, and transmits the second clock signal to the data receiving means as a signal having a negative delay with respect to the first clock signal.

A data receiving circuit according to the present invention includes: a pair of MOS transistors whose respective gates are coupled respectively to a pair of differential signal lines for transferring data and whose sources are coupled to potential supply means; a latch type sense circuit having sense nodes coupled to respective drains of the pair of MOS transistors; and initial voltage setting means connected to a line for supplying an initial voltage and the sense nodes of the latch type sense circuit, the initial voltage setting means thereby conducting a precharging operation for setting potentials of the sense nodes at the initial voltage, wherein the precharging operation is stopped responsive to a strobe signal, thereby activating the latch type sense circuit.

A multi-phase clock signal relay/transfer device according to the present invention includes: an input section for receiving multi-phase clock signals; an output section for outputting the multi-phase clock signals; phase adjustment means for reducing the phase difference between the multi-phase clock signals; a circuit element interposed between the input section and the output section; and a negative delay circuit for compensating for a delay of the multi-phase clock signals generated in the circuit element.

In one embodiment of the invention, the phase adjustment means includes: latch means having an input terminal and an output terminal; and switch means for supplying the input terminal and the output terminal of the latch means with a predetermined potential difference.

In another aspect of the present invention, there is provided a circuit control device for controlling a circuit clock block starting a process operation responsive to a clock edge, the circuit block selectively taking either one of: a stand-by state capable of operating at a first speed at a first power consumption level; and a high-speed operation state capable of operating at a second speed faster than the first speed at a second power consumption level larger than the first power consumption level, wherein the circuit block shifts from the stand-by state to the high-speed operation state a predetermined time before a clock edge for inputting data to be processed by the circuit block, the predetermined time being shorter than one clock, and the circuit block shifts back from the high-speed operation state to the stand-by state when the process in the circuit block is finished.

A circuit system according to the present invention includes a plurality of circuit blocks, the circuit system further including: variable power supply means capable of varying the amount of current supplied to at least one particular circuit block among the plurality of circuit blocks; control means for transmitting a control signal for increasing or decreasing the amount of current supplied to the at least one particular circuit block by the variable power supply means to the at least one particular circuit block responsive to an edge of the clock signal; and a negative delay circuit for receiving an external global clock signal and generating a clock signal having a negative delay with respect to an edge of the global clock signal, the clock signal being supplied to the control means.

In one embodiment of the invention, the control means transmits the control signal to the at least one particular circuit block responsive to a signal indicating a time at which data to be processed in the at least one particular circuit block is input to the at least one particular circuit block.

In another embodiment of the invention, the variable power supply means includes first switching means connected between a first power supply line having a first potential and the at least one particular circuit block, and second switching means connected between a second power supply line having a second potential and the at least one particular circuit block, the second potential being lower than the first potential, and the first switching means and the second switching means increase or decrease the amount of current flowing into the second power supply line from the first power supply line via the at least one particular circuit block responsive to the control signal.

A semiconductor integrated circuit according to the present invention includes: an MOS transistor formed on a semiconductor substrate; capacitance means for varying a substrate bias of the MOS transistor; and control means for varying a threshold value of the MOS transistor by controlling a voltage applied to the capacitance means.

In one embodiment of the invention, the capacitance means is an MOS type capacitor.

In another embodiment of the invention, the capacitance means is a junction capacitance formed in the semiconductor substrate.

In still another embodiment of the invention, the control means controls the voltage applied to the capacitance means via further capacitance means connected to the capacitance means.

Alternatively, a semiconductor integrated circuit system according to the present invention includes: a plurality of semiconductor integrated circuit chips each including data receiving means for reading data responsive to a strobe signal; and a data transfer path for transferring data among the plurality of semiconductor integrated circuit chips, wherein each of plurality of semiconductor integrated circuit chips is connected to the data transfer path via capacitor means.

In one embodiment of the invention, the strobe signal is generated by strobe signal generation means and transferred to the plurality of semiconductor integrated circuit chips via a strobe signal line, and the strobe signal generation means includes a negative delay circuit.

In another embodiment of the invention, an element for reducing reflection is connected to the data transfer path and the strobe signal line.

In still another embodiment of the invention, an element for reducing reflection is connected between the semiconductor integrated circuit chip and the data transfer path, and between the semiconductor integrated circuit chip and the strobe signal line.

In still another embodiment of the invention of the timing signal generation circuit according to the present invention, the first delay line and the second delay line each include a plurality of delay elements connected in series with one another, and respective delay times of the plurality of delay elements in at least either the first delay line or the second delay line are prescribed so as to be gradually longer toward the output section of the delay line.

A method for generating layout data according to the present invention includes the steps of: designing a function by a method such as RTL (Register Transfer Level); inputting a result of the function designing to a logic synthesis tool, thereby generating a net list; inserting a data transfer circuit including a clock transfer circuit into a net list, the clock transfer circuit being based on a negative delay circuit; conducting automatic wiring based on the net list, thereby generating mask data; extracting capacity and wiring resistance from the mask data obtained through automatic wiring; determining the magnitude of negative delay to be provided by the negative delay circuit, thereby generating layout data; re-extracting parameters from the layout data, thereby performing a checkup test.

Thus, the invention described herein makes possible the advantages of (1) providing a timing signal generation circuit capable of stably outputting a clock signal having a phase which is desirable relative to the phase of a reference clock signal, the clock signal being output in an extremely short period of time; and (2) providing a circuit with various functions which cannot be realized by conventional PLL techniques.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of the timing signal generation circuit according to the present invention will be described.

EXAMPLE 1

Figure 1A:
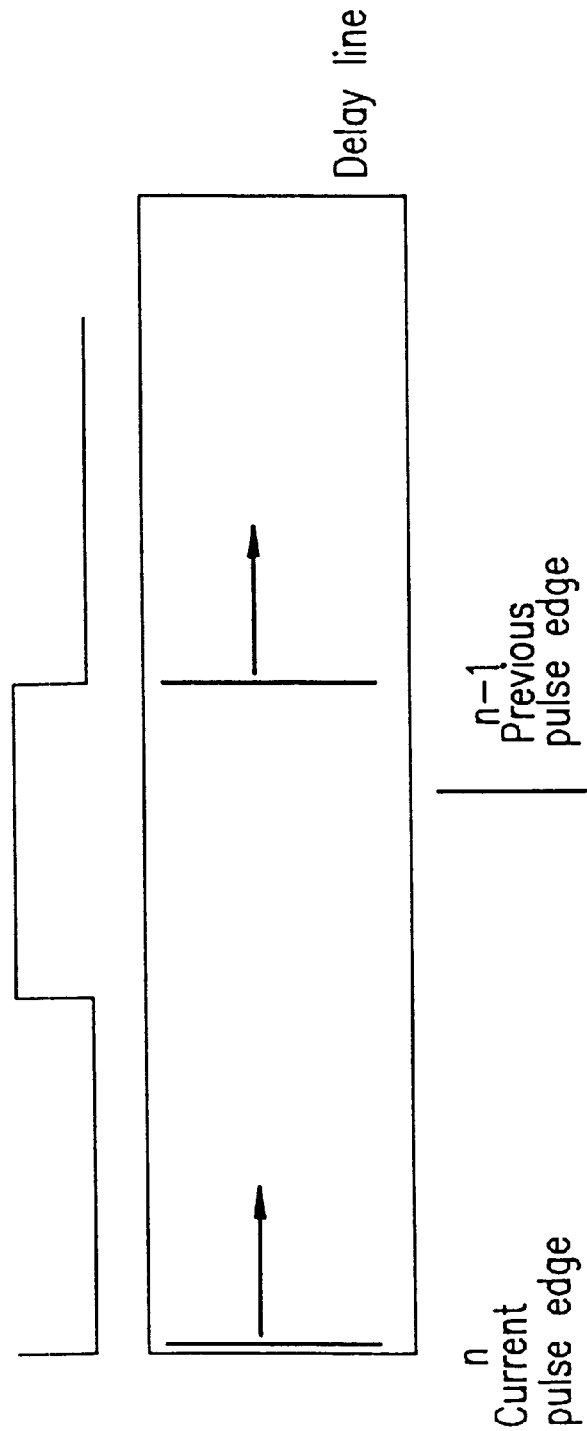
FIG. 1A is a diagram schematically illustrating the operation principle of a timing signal generation circuit according to the present invention.
Figure 1B:
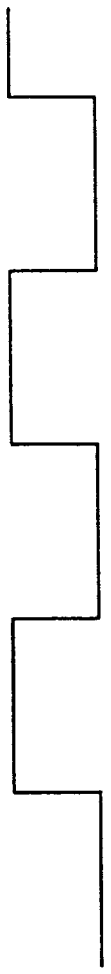
FIG. 1B is a waveform diagram illustrating an input external clock signal.
Figure 1C:
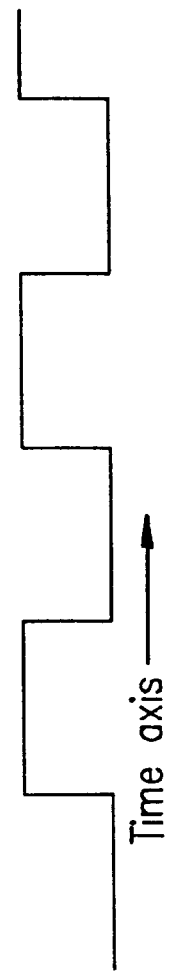
FIG. 1C is a waveform diagram illustrating an output timing clock signal.

A first example of the present invention will be described with reference to FIGS. 1A to 1C. FIG. 1A schematically shows an external clock (or system clock) signal and a delay line according to the present invention. FIG. 1A describes a state where a rise edge (indicated as pulse edge n) of the external clock signal has just been input to an input section of the delay line. The delay line, which is composed of a plurality of delay elements serially connected with one another, transmits the external clock signal received at its input section to an output section while delaying the external clock signal. Intermediate taps are provided between adjoining delay elements, so that the respective outputs of the delay elements can be taken out of the delay line via their corresponding intermediate taps.

When a rise edge (i.e., pulse edge n) of the external clock signal is input to the input section of the delay line, a pulse edge n−1, which was input to the input section one cycle before the pulse edge 1, has already advanced a certain distance from the input section in the delay line in the direction of the output section. An intermediate tap that corresponds to the location of the pulse edge n−1 at this point in time is defined as a "reference point", whereas an intermediate tap that is located a predetermined number of taps ahead (i.e., toward left in FIG. 1A) of the reference point is defined as a "selection point".

In the present example, a clock pulse output (or extracted) via the selection point is employed as a timing signal (or internal clock signal). FIGS. 1B and 1C show the waveform of the external clock pulses and the waveform of the clock pulses (timing pulses) extracted at the selection point, respectively. As seen from FIGS. 1B and 1C, the phase of the timing signal appears to be advanced with respect to the phase of the external signal by a predetermined time. Such a timing signal generated according to the present invention will be referred to as having "a pseudo-negative delay" in the present specification. The magnitude of "(pseudo) negative delay" can be adjusted by setting the selection point in a desired location with respect to the reference point. The magnitude of "negative delay" decreases as the selection point is set closer to the reference point.

In accordance with the above configuration, a desired clock pulse, serving as a timing signal, can be output before the current pulse edge reaches the output section. The location of the reference point is detected by sample/hold circuits and boundary detection circuits (described later).

Figure 2:
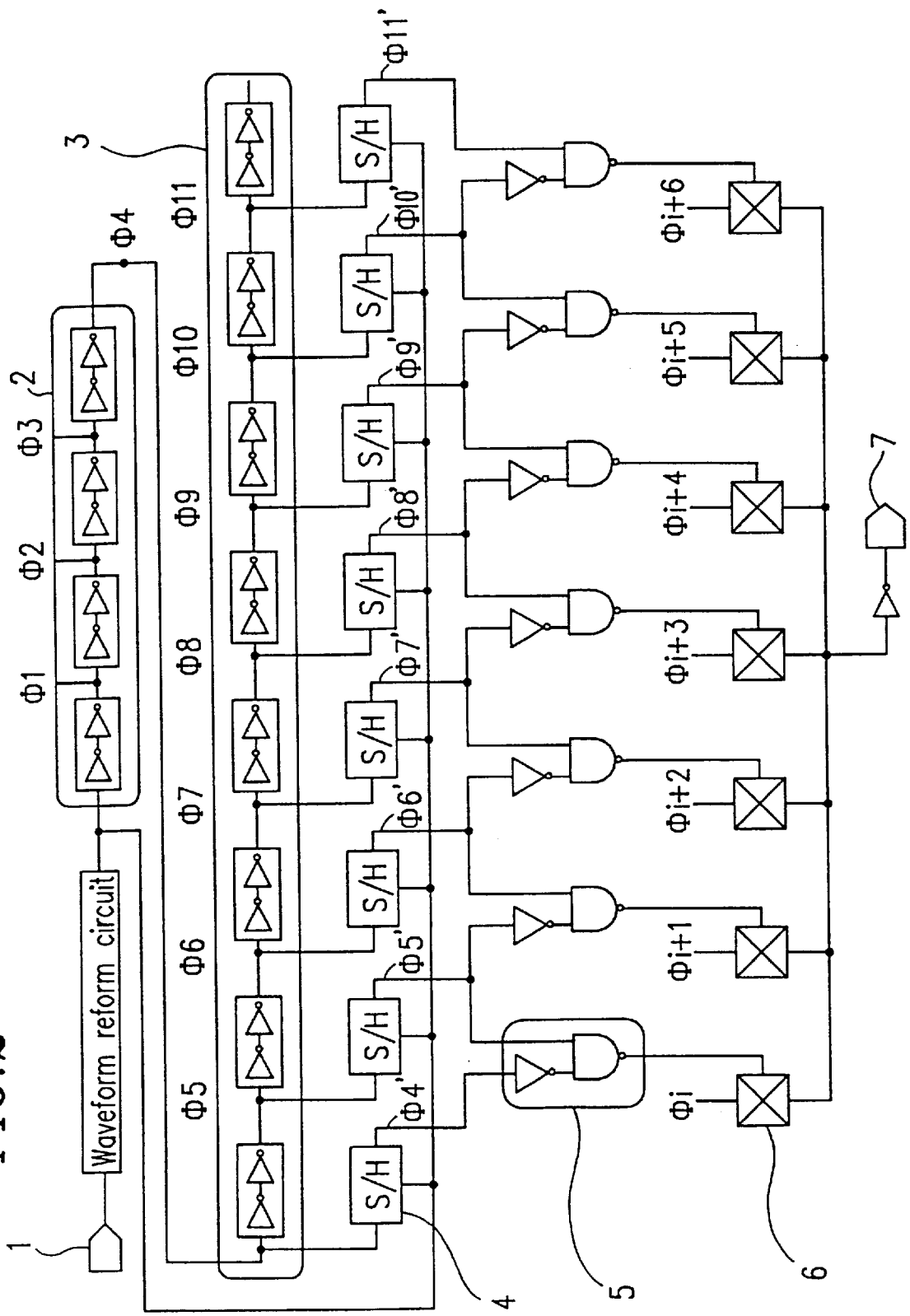
FIG. 2 is a diagram illustrating a timing signal generation circuit according to an example of the present invention.

Hereinafter, a timing signal generation circuit according to the present example of the invention will be described with reference to FIG. 2. The timing signal generation circuit shown in FIG. 2 includes an external clock signal input terminal 1 for receiving an external clock signal and a timing signal output terminal 7 for outputting a timing signal having a pseudo-negative delay. An offset delay circuit 2 and a detection delay circuit 3 having a plurality of intermediate taps are coupled to the external clock signal input terminal 1 via a waveform reform circuit. A sample/hold circuit 4 is connected to each intermediate tap of the detection delay circuit 3. A sampling signal is simultaneously provided to the sample/hold circuits 4, so that the sample/hold circuits 4 sample and hold voltages taken at the respective intermediate taps (Φ4, Φ5, . . . , Φ11) of the detection delay circuit 3 at a given moment. The signal levels of the respective intermediate taps at the moment of inputting the sampling signal to the sample/hold circuits 4 are sampled by the corresponding sample/hold circuits 4 and input to the respective corresponding boundary detection circuits 5. In the case of FIG. 2, the output of the waveform reform circuit is used as a sampling signal. The boundary detection circuits 5 detect a boundary between intermediate taps (i.e., a boundary in terms of their respectively different operations) by comparing the signal voltages of intermediate taps extracted by adjoining sample/hold circuits 4 with one another. Although each boundary detection circuit 5 is composed of an inverter and a NAND circuit, any other logic that satisfies the principle described below can be applied to compose the boundary detection circuits 5.

The offset delay circuit 2, which has a delay time that is close to one cycle of the external clock signal, provides an offset for adjusting the delay time of the clock signal. The detection delay circuit 3 fineadjusts the delay time of the clock signal.

An output selection circuit 6 outputs one or more of the signals of the intermediate taps (Φ4, Φ5, . . . , Φ11) to the timing signal-output terminal 7. If a plurality of intermediate taps are output to the timing signal output terminal 7, the signals are overlaid with one another in the output timing signal.

Figure 3:
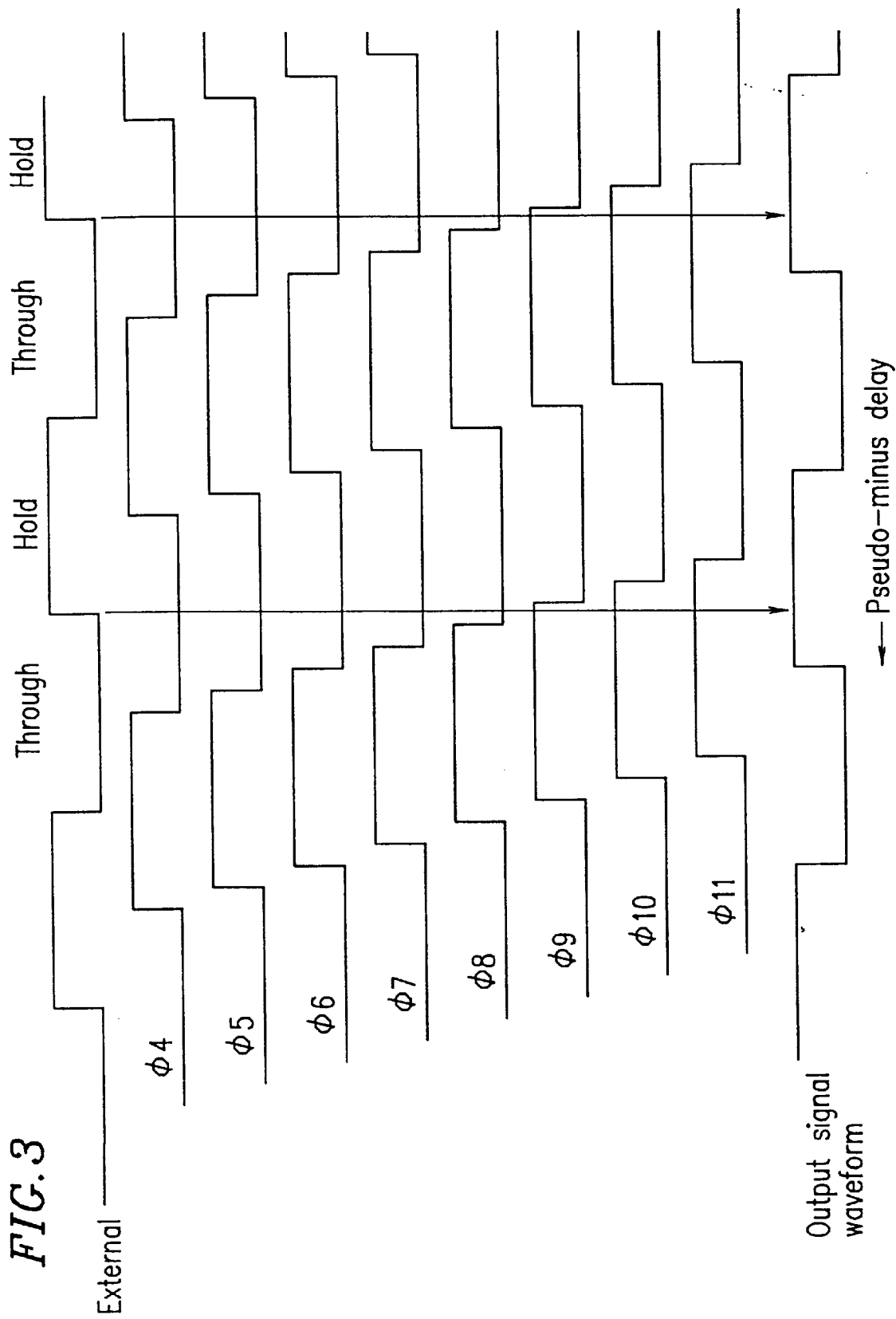
FIG. 3 is a waveform diagram illustrating signals input from intermediate taps of negative delay circuit shown in FIG. 2.
Figure 4:
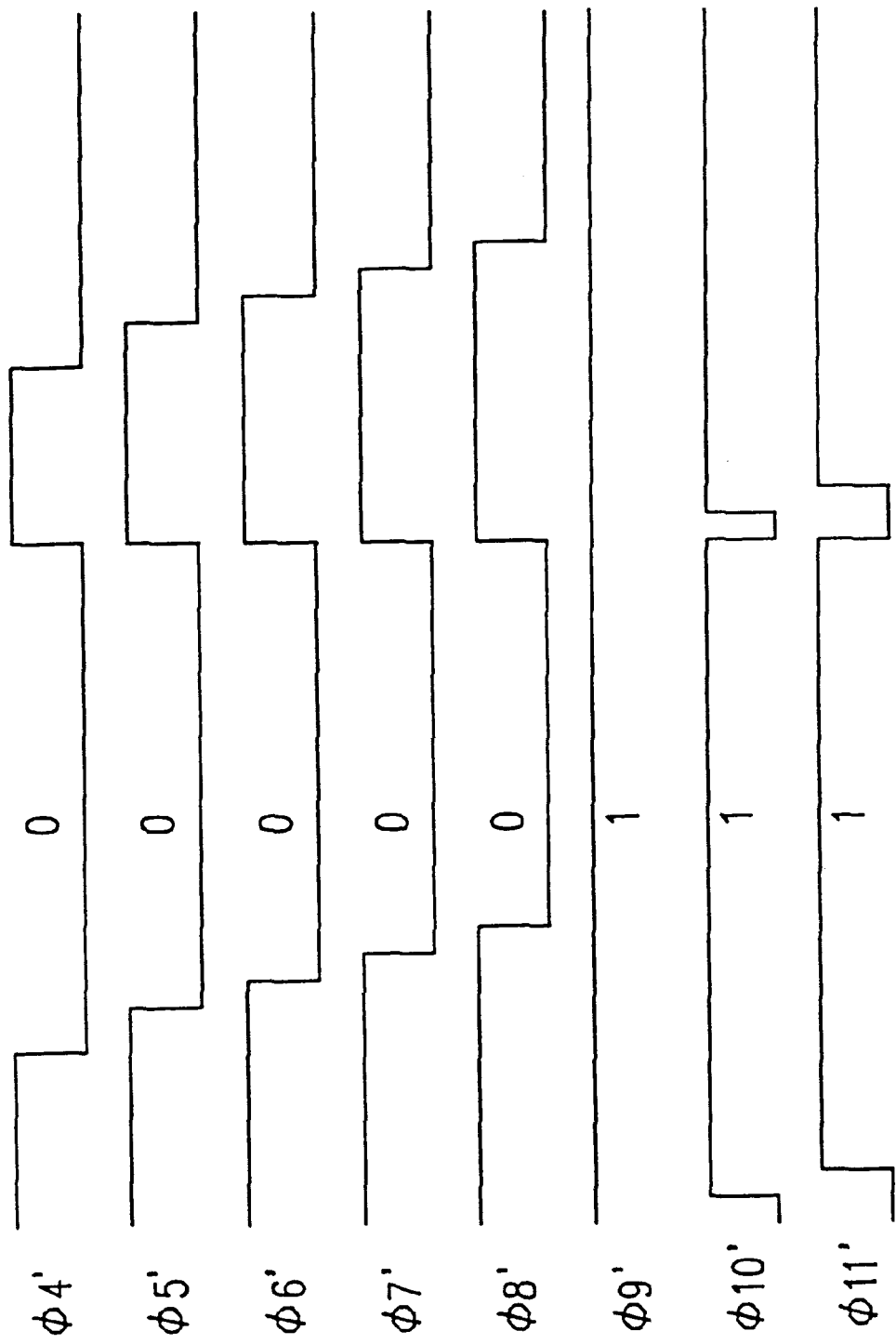
FIG. 4 is a signal waveform diagram output from sample/hold circuits shown in FIG. 2.

Hereinafter, the operation of the timing signal generation circuit in FIG. 2 will be described with reference to FIGS. 2 to 4.

The external clock signal, whose waveform has been reformed by the waveform reform circuit, is delayed as it passes through the delay circuits 2 and 3 (FIG. 2), so that signals with waveforms indicated as Φ4, Φ5, . . . , Φ11 appear at the respective intermediate taps. When a hold signal is input to the sample/hold circuits 4 at a rise of the external clock signal, signals having waveforms Φ4', Φ5', . . . , Φ11' shown in FIG. 4 are output from the respective sample/hold circuits 4. Each signal Φ4', Φ5', ..., Φ11' takes either one of the two states: "0" or "1". Based on the signals Φ4', Φ5', ..., Φ11' output from the sample/hold circuits 4, the boundary detection circuits 5 detects a boundary (hereinafter referred to as "operation boundary") between those intermediate taps which output signals indicating "0" at the time of sampling and those intermediate taps which output signals indicating "1" at the time of sampling. In the case of FIG. 4, the intermediate tap Φ8' is identified as a reference point corresponding to the operation boundary. In other words, the intermediate tap Φ8' corresponds to the pulse edge n−1 in FIG. 1A in location. A signal from the intermediate tap (corresponding to the "selection point") located a predetermined number of taps ahead (i.e., toward the left in the figure) of the intermediate tap Φ8' is extracted via the output selection circuit 6. The extracted signal is inverted so as to be output as a final timing signal from the timing signal output terminal 7. Specifically, the signal from the intermediate tap located the predetermined number of taps ahead of the intermediate tap Φ8' is extracted by inputting a signal from the intermediate tap located the predetermined number of taps ahead of the intermediate tap Φ8' to a corresponding input Φi, Φi+1, ..., or Φi+6 of the output selection circuit 6.

As described above, the present example employs a delay line (delay circuit) in order to convert the temporal relationship between phases of the waveform of a clock signal into locational information, i.e., information indicating different locations on the delay line. By detecting the phase relationship thus obtained, a clock signal having an appropriately advanced phase can be extracted at a position in the delay line. In accordance with the present example, a stable clock signal can be generated after a setup time of about 3 clocks.

EXAMPLE 2

Hereinafter, another example of the present invention will be described with reference to FIG. 5. One difference between the present example and Example 1 is that the present example utilizes two delay lines (i.e., a base delay line and a post-delay delay line), whereas only one delay line is provided in Example 1.

Figure 5:
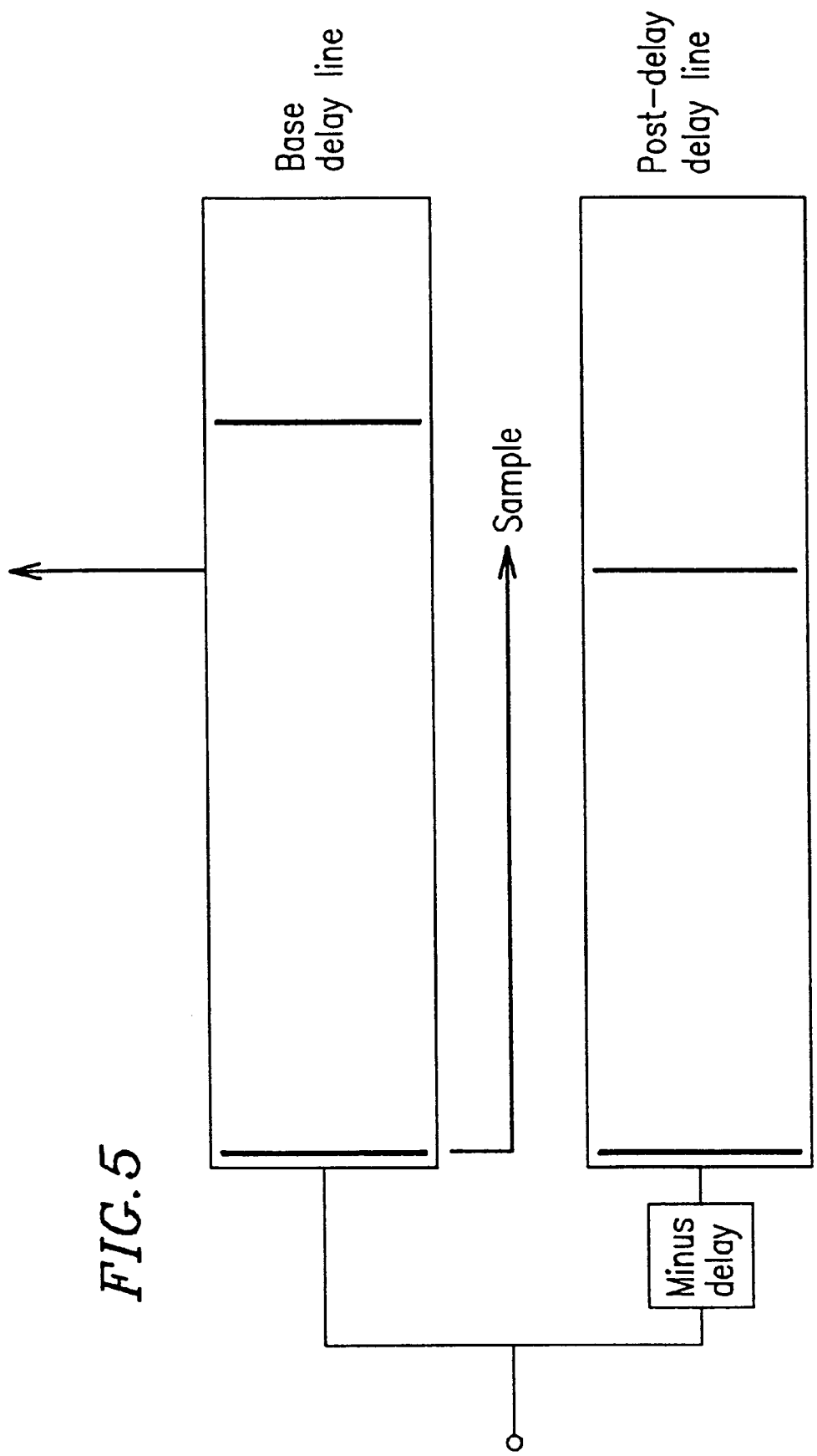
FIG. 5 is a diagram schematically illustrating another operation principle of a timing signal generation circuit according to the present invention.

FIG. 5 schematically shows the states of the base delay line and the post-delay delay line at a moment when a rise edge (i.e., pulse edge n) of an external clock signal is input to an input section of the base delay line.

Each of these two delay lines (i.e., the base delay line or the post-delay delay line) is composed of a plurality of delay elements serially connected with one another. Each delay line transmits the external clock signal received at the input section thereof to an output section while delaying the external clock signal.

When a rise edge (i.e., pulse edge n) of the external clock signal is input to the input section of the base delay line, a pulse edge n−1, which was input to the input section 1 cycle before the pulse edge 1, has already advanced a certain distance from the input section in the base delay line in the direction of the output section. The external clock signal is also input to the input section of the post-delay delay line via a further delay circuit for setting a "minus delay time". Accordingly, when the pulse edge n is input to the input section of the base delay line, the pulse edge n−1 is located closer to the input section in the post-delay line than in the base delay line.

In the present example, too, a sample signal is output in accordance with a rise edge of the external clock signal, and the location of the pulse edge n−1 in the post-delay line is determined responsive to the sample signal. As a result, the operation of a portion of the post-delay line after a point corresponding to the pulse edge n−1 is terminated by a clock enable signal. At the same time, a clock signal is output from a point in the base delay line that is forward (by a delay time predetermined by the further delay circuit for determining a minus delay time) with respect to the point corresponding to the location of the pulse edge n−1.

Hereinafter, the present example will be further described with respect to FIGS. 6 and 7.

Figure 6:
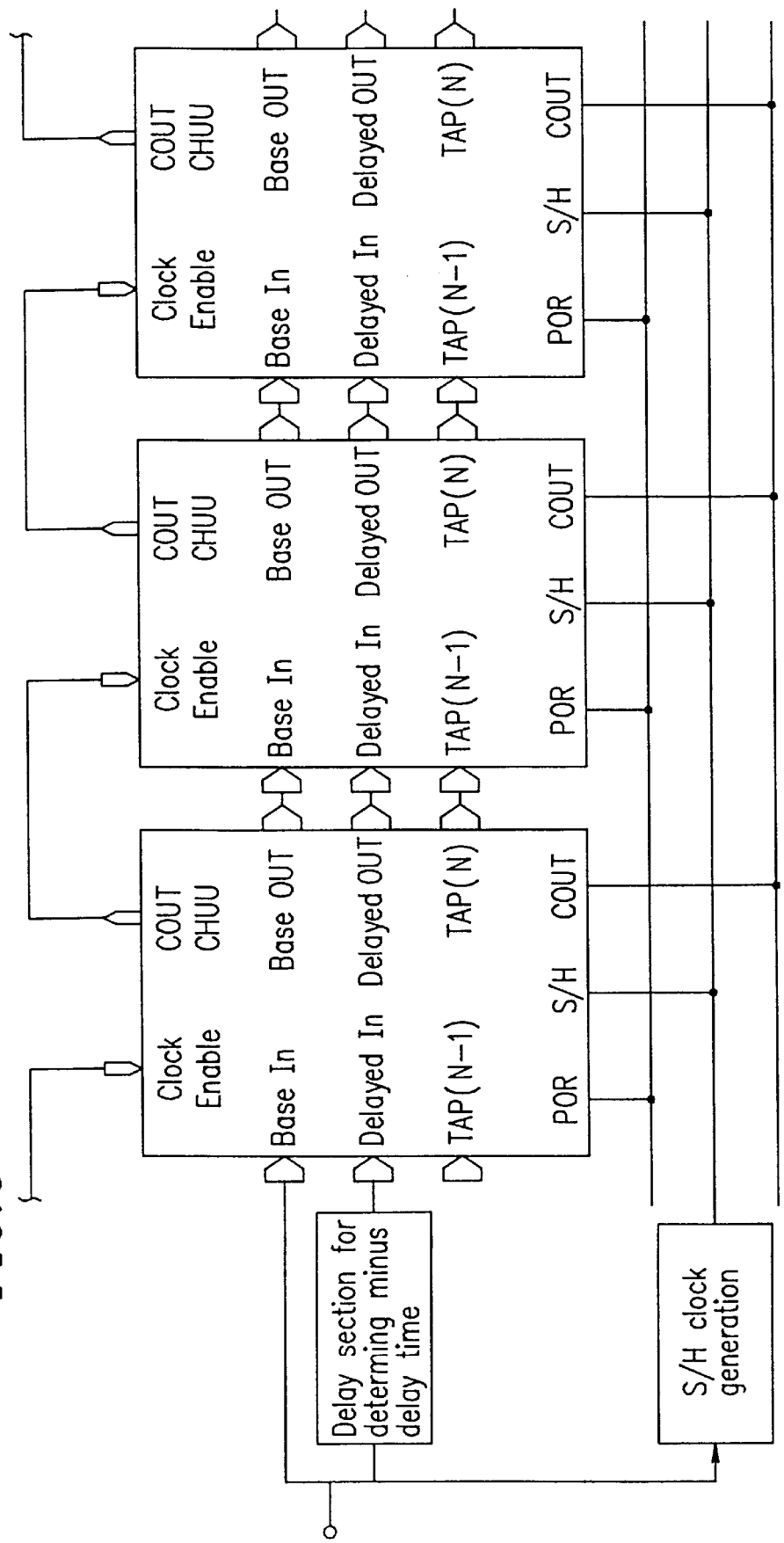
FIG. 6 is a diagram illustrating a timing signal generation circuit according to another example of the present invention.

A timing semiconductor generation circuit according to the present example is composed of a plurality of units interconnected to one another, as shown in FIG. 6. Each unit has a circuit configuration shown in FIG. 7. First, the configuration of each unit will be described with reference to FIG. 7. Each unit includes delay elements constituting the base delay line and the post-delay delay line shown in FIG. 5. Specifically, the delay elements constituting the post-delay delay line are an array of inverters coupling a delay input (Delayed In) with a delay output (Delayed OUT). The delay elements constituting the post-delay delay line are an array of inverters coupling a base input (Base In) with a base output (Base OUT). The delayed output (Delayed OUT) of an Nth unit is coupled to the delayed input (Delayed In) of an N+1$^{th}$ unit. The base output (Base OUT) of an N$^{th}$ unit is coupled to the base input (Base In) of an N+1$^{th}$ unit, as shown in FIG. 6.

Figure 7:
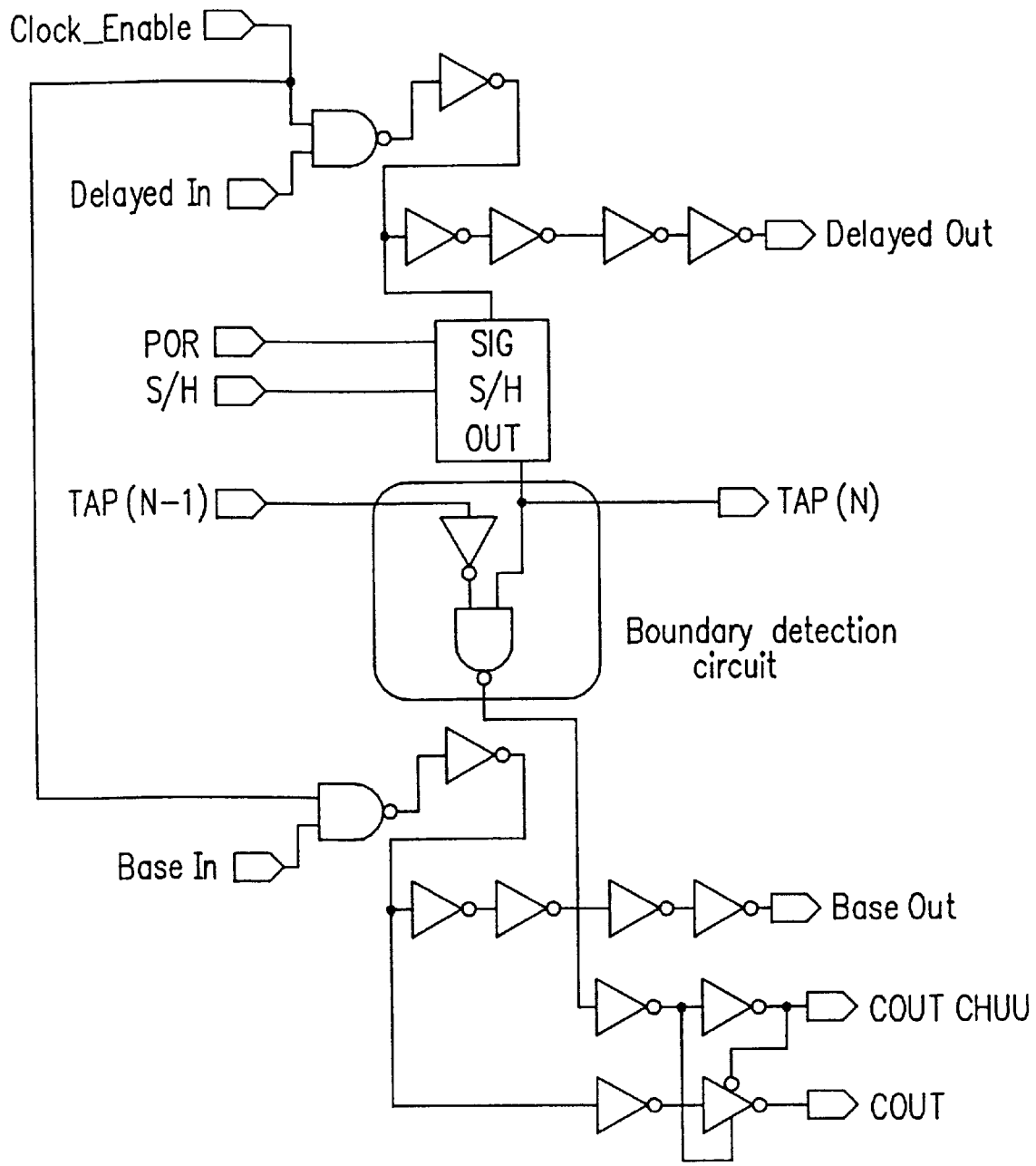
FIG. 7 is a diagram illustrating internal circuitry of each unit included in the timing signal generation circuit shown in FIG. 6.

Each unit also includes a sample hold circuit and a boundary detection circuit, as shown in FIG. 7. As in the case of the timing signal generation circuit in FIG. 2, an operation boundary between the "0" state and the "1" state is detected by a boundary detection circuit. The output (COUT) of the base delay line of a unit whose boundary detection circuit has detected such a boundary is output as a timing signal. While the output (COUT) is being output, a low level signal is output from a terminal (COUTCHUU) to the next unit, so that the subsequent units do not send out their respective outputs (COUT).

In accordance with the present example, the final timing signal is extracted at a position in the base delay line that is forward with respect to an operation boundary by a predetermined number of stages. The predetermined number (of stages) can be adjusted to a desired value according to the length of the delay time which is set by the delay circuit for determining a minus delay time.

In the present example, the delay elements included in the base delay line and the post-delay delay line all provide the same amount of delay time. However, the present invention does not require that all delay elements provide the same amount of delay time. For example, a delay element located relatively close to the input section (which receives an external clock signal) may provide a delay time which is smaller than the delay time provided by a delay element which receives the output of that delay element. For example, in one preferable modification of the present example, a longer delay time is provided by a more subsequent delay element; that is, any delay element located on the right of a given delay element in FIG. 5 provides a longer delay time. By thus arranging such a plurality of delay elements, the following advantage can be provided.

As seen from FIG. 5, the length of the base delay line is required to be such that the pulse edge n−1 is located within the base delay line when the pulse edge n is input to the input section of the base delay line. That is, the delay time (total delay time) provided by the base delay line must be prescribed longer than the time interval between the pulse edge n and the pulse edge n−1. However, in order to increase the total delay time provided by the base delay line while maintaining the delay time of all the delay elements at the same value, it is necessary to increase the number of delay elements constituting the base delay line, thus elongating the base delay line. This results in an increase in the area occupied by the delay line on a semiconductor ship, which is not desirable in view of further integration of the circuit. On the other hand, in order to increase the total delay time of the base delay line without increasing the number of delay elements constituting the base delay line, it is necessary to increase the delay time of each delay element. This results in a decrease in the resolution of the minus delay time values, that is, the difference between one selectable value of the minus delay time and another increases.

EXAMPLE 3

Figure 8:
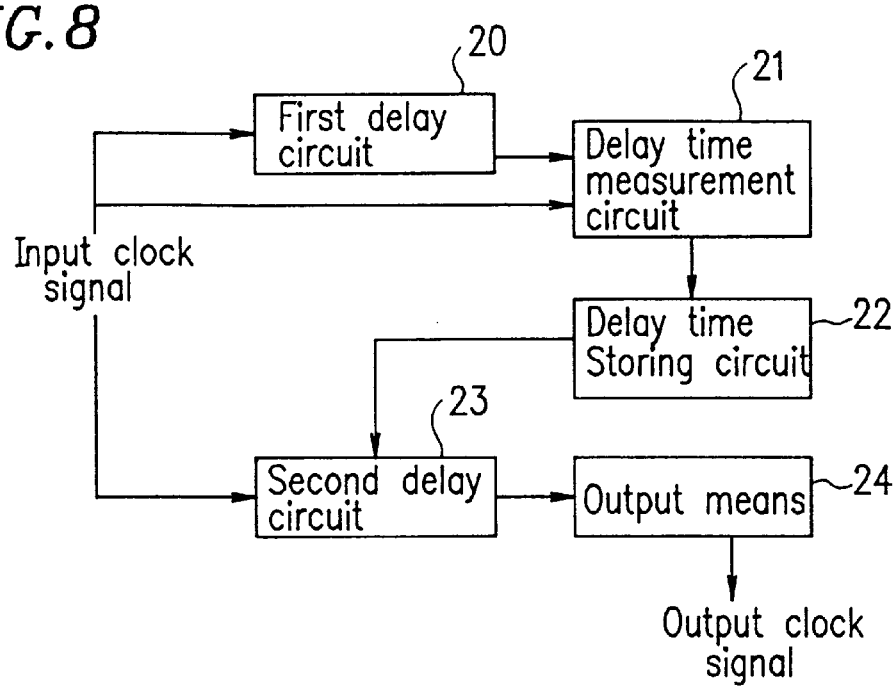
FIG. 8 is a diagram schematically illustrating another exemplary configuration of the timing signal generation circuit according to the present invention.
Figure 9:
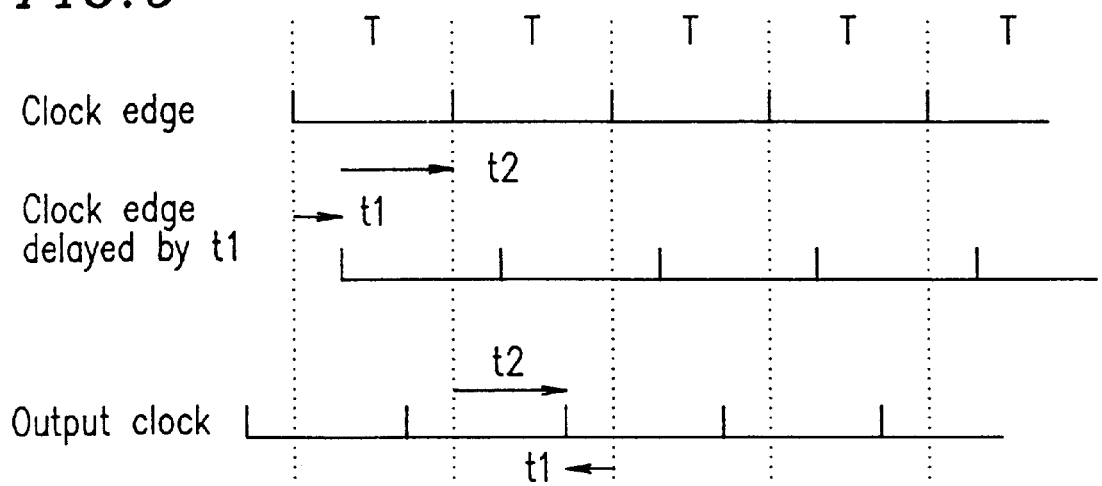
FIG. 9 is a timing diagram illustrating the operation of the timing signal generation circuit shown in FIG. 8.

Hereinafter, still another example of the present invention will be described with reference to FIGS. 8 and 9. FIG. 8 is a block diagram describing the present example. FIG. 9 is a diagram showing various operation waveforms in the present example. As shown in FIG. 8, an external clock signal is input to a first delay circuit 20 and a delay time measurement circuit 21, and a second delay circuit 23. The first delay circuit 20 is adjusted so as to output a signal which is delayed by a time t1 with respect to the input external clock signal. The delay time measurement circuit 21 measures an amount of time (delay time t2) by which a rise edge (pulse edge n+2) of the external clock signal is delayed with respect to a rise edge (pulse edge n+1) of a clock signal output from the first delay circuit 20. Specifically, the delay time measurement circuit 21 measures the amount of time which elapses from the moment when the rise edge (pulse edge n+1) of the clock signal output from the first delay circuit 20 is input to the delay time measurement circuit 21 till the moment when the subsequent rise edge (pulse edge n+2) of the external clock signal is input to the delay time measurement circuit 21. The delay time t1 and the delay time t2 satisfy the relationship t1+t2=T (where T represents the cycle of the external clock signal). The delay time t2 measured by the delay time measurement circuit 21 is stored in a delay time storing circuit 22.

Based on the delay time t2 stored in the delay time storing circuit 22, the second delay circuit 23 outputs a clock signal which is delayed by the time t2 from a rise edge (pulse edge n+3) of the external clock signal. The clock signal thus output from the second delay circuit 23 is earlier than (i.e., having a minus delay with respect to) a rise edge (pulse edge n+4) of the external clock signal by the time t1. Thus, according to the present example, it is possible to generate a clock signal having an edge rising at such a timing that the clock signal appears to have a negative delay from the external clock signal serving as a reference signal.

Next, a timing signal generation circuit described by the block diagram of FIG. 8 will be described with reference to FIGS. 10 to 14.

Figure 10:
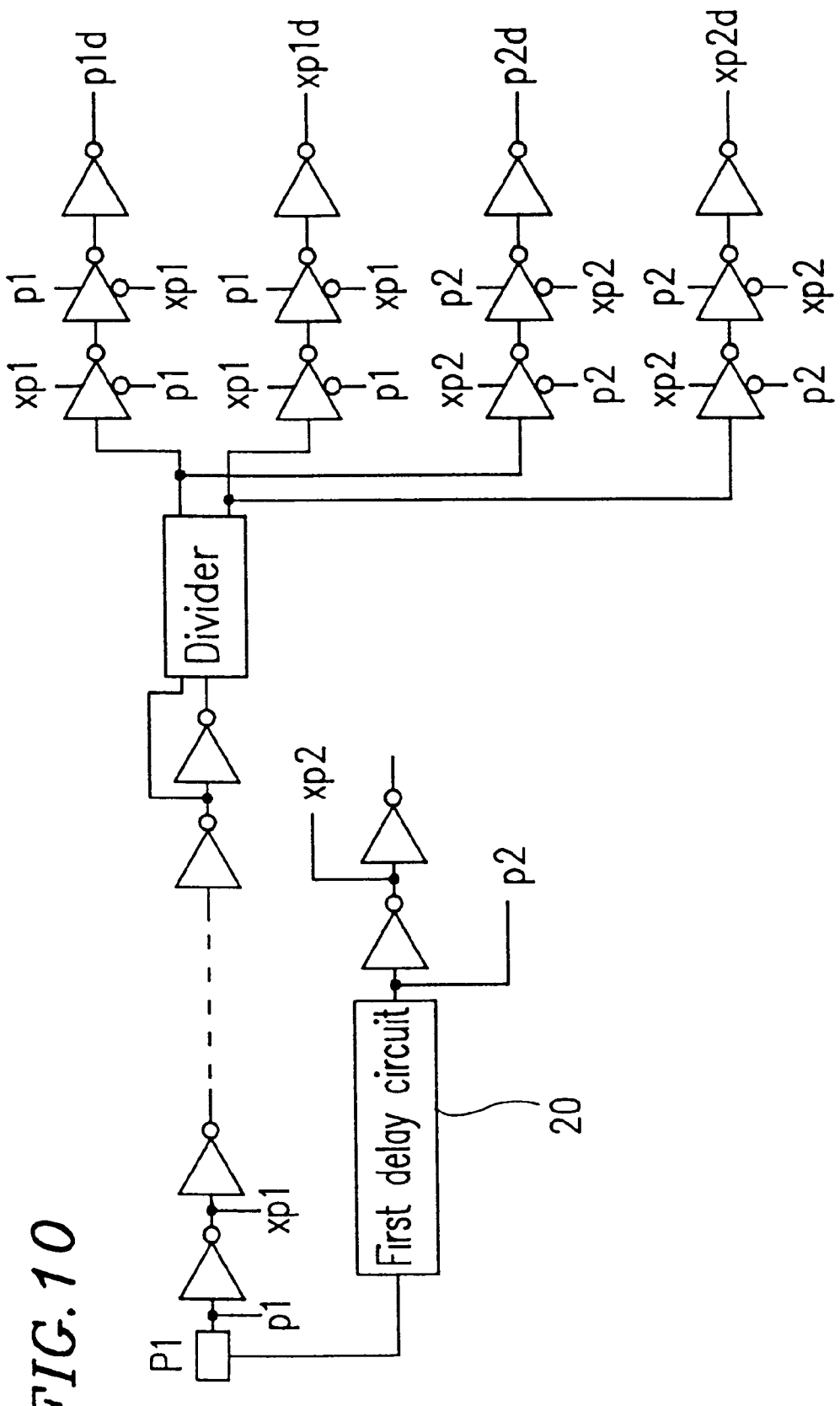
FIG. 10 is a diagram illustrating a clock control circuit used for the timing signal generation circuit shown in FIG. 8.

FIG. 10 shows a clock control circuit employed in the present example. As shown in FIG. 10, a clock signal p1 is input via an input terminal P1 to an array of inverters serially connected with one another, and to an input section of the first delay circuit 20. The first delay circuit delays the clock signal p1 by the time (t1), which corresponds to the negative delay time which is intended to be finally obtained. An output p2 of the first delay circuit is output as it is, while also being input to an inverter which generates a signal xp2. The output p2 of the first delay circuit has a waveform shown in FIG. 11. The signal xp2 (not shown) has a waveform obtained by inverting the output p2.

Figure 11:
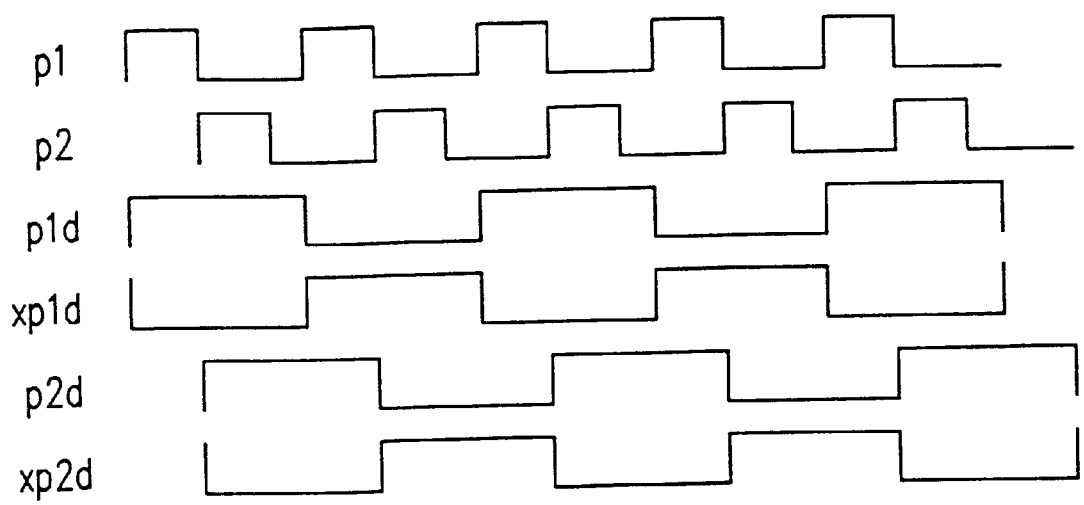
FIG. 11 is a timing diagram illustrating the operation of the clock control circuit shown in FIG. 10.

On the other hand, the external clock signal passes through the above-mentioned inverter array, and is converted by a divider into clock signals p1d, xp1d, p2d, and xp2d each having a double cycle (shown in FIG. 11). The divider generates a complimentary differential logic. The clock signals p1d and xp1d are obtained by sampling the output of the divider at a sampling circuit using the input clock signal p1 (and Xp1). The sampling circuit is employed in order to seemingly eliminate the time required for transferring signals within the divider. As a result, divided signals which depend only on the clock edges of the input clock signal p1 are obtained. Similarly, the clock signals p2d and xp2d are obtained by using a clock signal p2 (xp2) output from the first delay circuit.

The phases of the clock signals p1d and xp1d, resulting from the division of the original clock signal, are reversed with respect to each other. The clock signals p2d and xp2d are delayed by the "desired delay time (t)" from the clock signals p1d and xp1d, respectively.

Next, it will be described how a timing signal having a pseudo-minus delay can be generated by using the above-mentioned clock signal.

Figure 12:
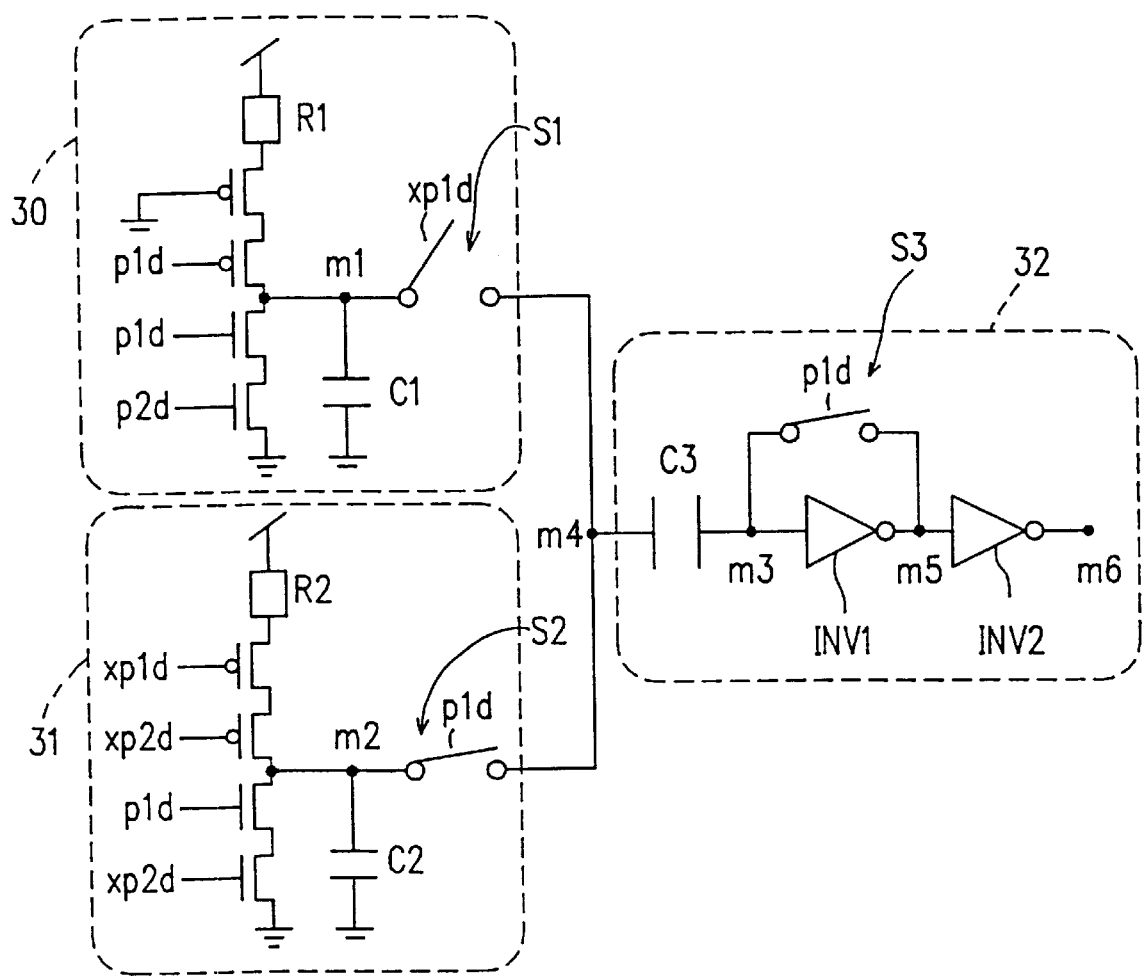
FIG. 12 is a diagram illustrating an example of the timing signal generation circuit shown in FIG. 8.

In FIG. 12, C1 to C3 denote capacitors; INV1 and INV2 denote inverter circuits; and R1 and R2 denote resistors. In this example, it is assumed that the capacitors C1 and C2 have the same capacitance value and that the resistors R1 and R2 have the same resistance value. However, the capacitors C1 and C2 may have different values, and the resistors R1 and R2 may have different values. A first switch S1 of this example is an analog switch circuit which becomes conductive when the clock signal xp1d is at the high level. A second switch S2 and a third switch S3 of this example are analog switch circuits which become conductive when the clock signal p1d is at the high level. The second and third switches S2 and S3 are turned on and off simultaneously. The first switch S1 operates with the opposite phase with respect to the switches S2 and S3.

Hereinafter, the circuit shown in FIG. 12 will be described with respect to a timing section 30, a reference section 31, and a comparison section 32.

The timing section 30 and the reference section 31 are coupled to the comparison section 32 via the first switch S1 and the second switch S2, respectively.

The circuitry of the reference section 31 operates by utilizing clock edges of signals delayed by t1 (p2d) as a "trigger" and clock edges of reference clock signals (p1d) as a "stop". In this example, a potential that is in proportion with a time difference between the "trigger" and the "stop" appears as a potential at a node m2 and is stored. This operation is realized by the transistors in the reference section 31 becoming conductive in a period from a clock edge (rise) of the clock signal p2d till a clock edge (fall) of the clock signal p1d, whereby the capacitor C2 is charged from a power line via the resistor R2.

Figure 13:
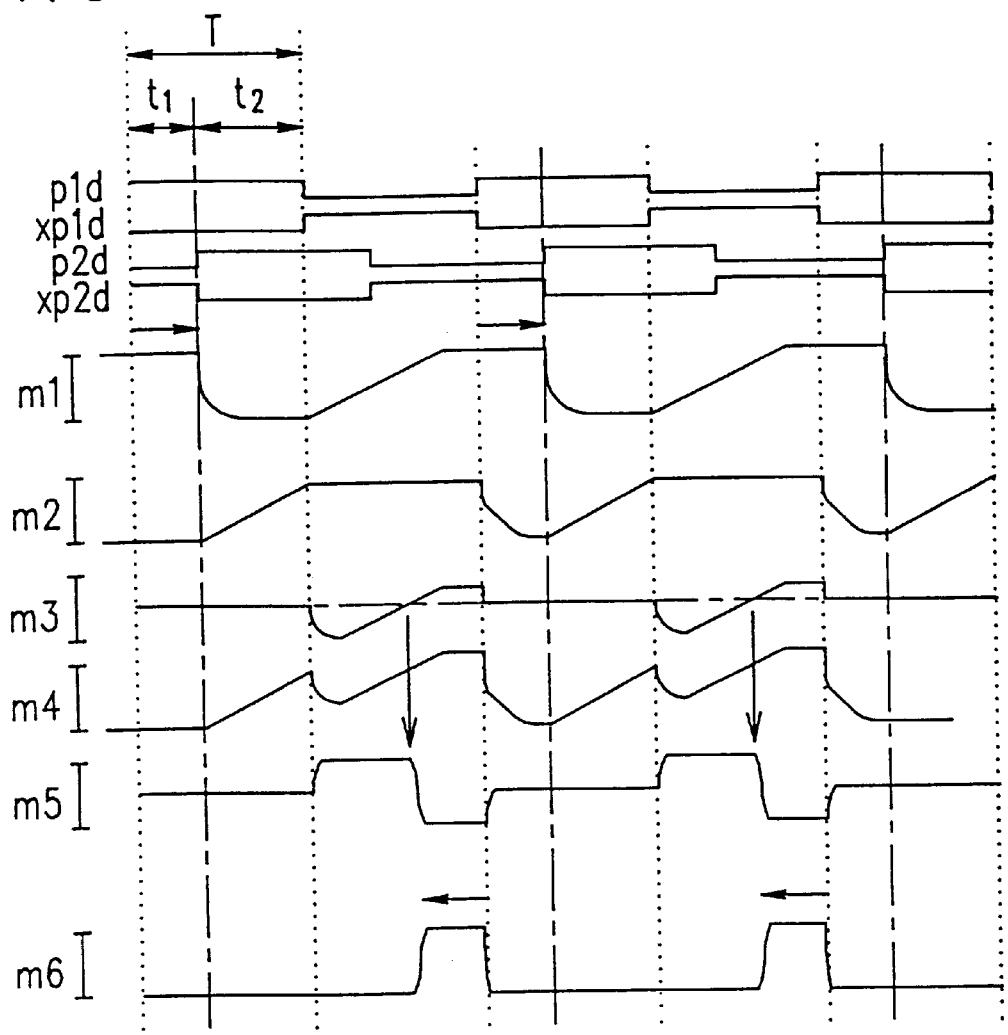
FIG. 13 is a timing diagram illustrating the operation of the timing signal generation circuit shown in FIG. 8.

Since the second switch S2 is conductive during this period, the potential of the node m2 is reflected on the potential of a node m4. Since the third switch S3 of the comparison section 32 is also conductive during this period, the nodes m3 and m5 of the comparison section have the same potential. This potential is fixed as a threshold potential of the inverter circuit INV1. In other words, a potential proportionate to the time difference between a clock edge of a p2d clock signal and a clock edge of a p1d clock signal (i.e., period T−t1=t2) is stored as an inversion threshold value of the inverter circuit INV1. At this time, the potentials of both ends of the capacitor C3 are finalized. The waveforms of the voltages taken at the nodes m1 to m6 are shown in FIG. 13 in relation to the various clock signals.

Next, the circuitry of the timing section 30 begins operation in response to a clock edge of the reference clock signal (p1d), so that the potential of the node m1 begins to increase. This operation is realized by the transistors in the timing section 30 becoming conductive, whereby the capacitor C1 is charged from a power line via the resistor R1. Since the first switch S1 is conductive during this period, the potential of the node m1 is reflected on the potential of the node m4. The switch S3 of the comparison section 32 is non-conductive at this time.

The potential of the node m4 is transmitted to the input (i.e., the node m3) of the inverter INV1. When the potential of the node m4 traverses the potential set in the reference section 31, the output of the inverter circuit INV1 is inverted. This indicates that the inverter INV1 inverts its output after a lapse of time corresponding to the stored time difference t2. The output of the node m5 thus obtained is further inverted by the inverter circuit INV2 so as to be output to the node m6. Although a penetration current occasionally flows through the inverter INV1, this current can be minimized by inputting a signal indicating a stand-by state (Standby pwrdwn=LOW; Operation pwrdwn=HIGH).

When R1 equals R2 and C1 equals C2, the above-mentioned time difference is converted into a corresponding potential. As a result, the timing signal on the node m6 is output in advance, that is, so as to have a minus delay corresponding to the time difference (t1) between the p1d signals and p2d signals, as shown in FIG. 13. Thus, the circuitry of this example generates a timing which is output in advance of a divided clock signal by a predetermined amount of time (i.e., minus delay).

Figure 14:
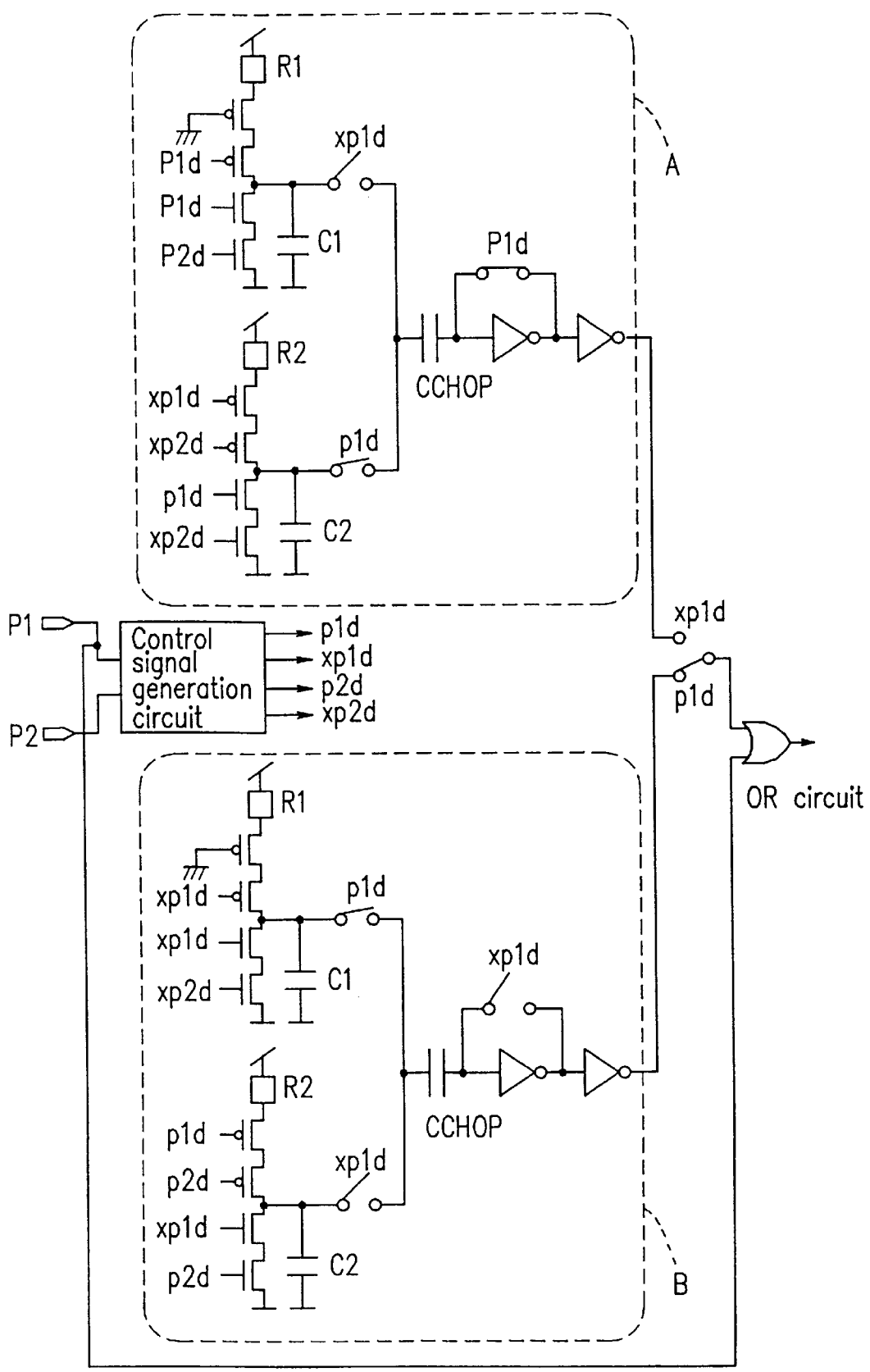
FIG. 14 is a diagram illustrating another example of the timing signal generation circuit shown in FIG. 8.

By providing two blocks of such circuitry and operating the blocks at opposite phases while interleaving the blocks, a final timing signal can be obtained. FIG. 14 shows an overall view of such circuitry. In FIG. 14, the two circuit blocks are operated in parallel with respect to each other, and the results thereof are interleaved. The respective circuit blocks perform a so-called pipeline operation, in which a reference time is measured (i.e., a potential is set) and a signal is output at the reference time. In this example, a stable clock signal can be generated after a setup time of about 3 clocks.

When the operation speed of the transistors of the circuitry are sufficiently high, no interleaving is required.

An OR circuit in FIG. 14 is provided for failsafe purposes, and functions as a clock adjusting means for selecting as a final output either the input clock signal or the output of the circuitry of FIG. 12 that is first output. The OR circuit is necessary because, for example, the circuitry of FIG. 12 does not operate at all when the time constant (determined by R1 and C1) are extremely short as compared with the cycle of the clock signal, thereby making it impossible to obtain a minus delay for the clock edge. However, this would not constitute a substantial problem in a slow operation.

Figure 15:
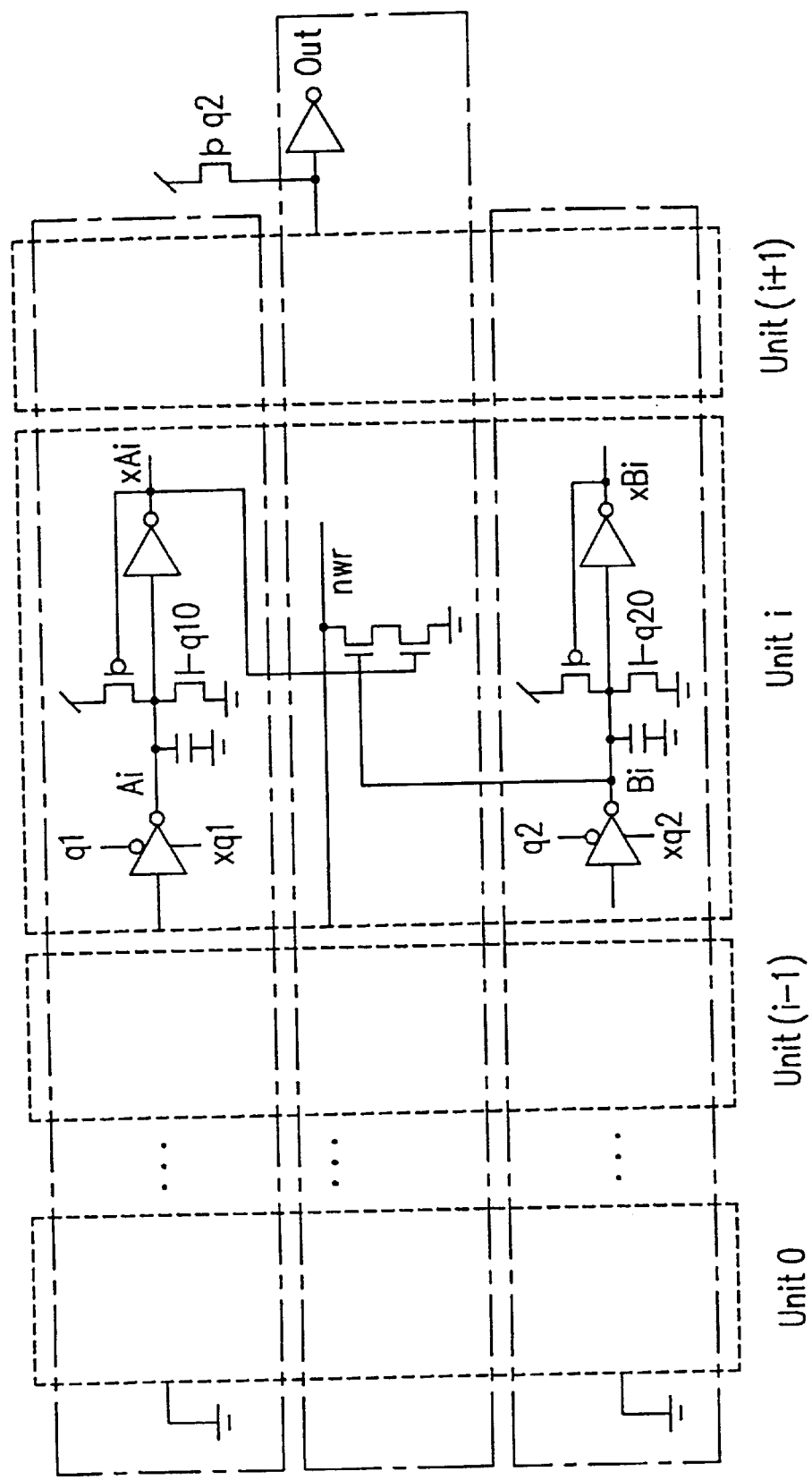
FIG. 15 is a schematic diagram illustrating still another example of the timing signal generation circuit according to the present invention.

Next, another example of the timing signal generation circuit of the present invention will be described with reference to FIG. 15. FIG. 15 shows the circuit configuration of a plurality of units serially connected with one another, with a particular emphasis on the $i^{th}$ unit.

The example shown in FIG. 15 is mainly composed of first and second delay lines each capable of suspending a delay operation and retaining the state of the suspended delay operation and common wired OR circuits connected to the first and second delay lines. Each wired OR circuit of this example is composed of NMOS transistors serially connected with each other. The wired OR circuit is coupled to a precharge circuit and an output circuit.

The operation of the above-mentioned timing signal generation circuit will be described with reference to FIGS. 15 and 16. The timing signal generation circuit employs a signal q10 for resetting the first delay line, a signal q1 for activating the first delay line, a signal xq1 obtained by inverting the signal q1, a signal q20 for resetting the second delay line, a signal q2 for activating the second delay line, and a signal xq2 obtained by inverting the signal q2. Herein, "activating" a delay line refers to the activation of clocked inverters in that delay line.

Figures 16, 17:
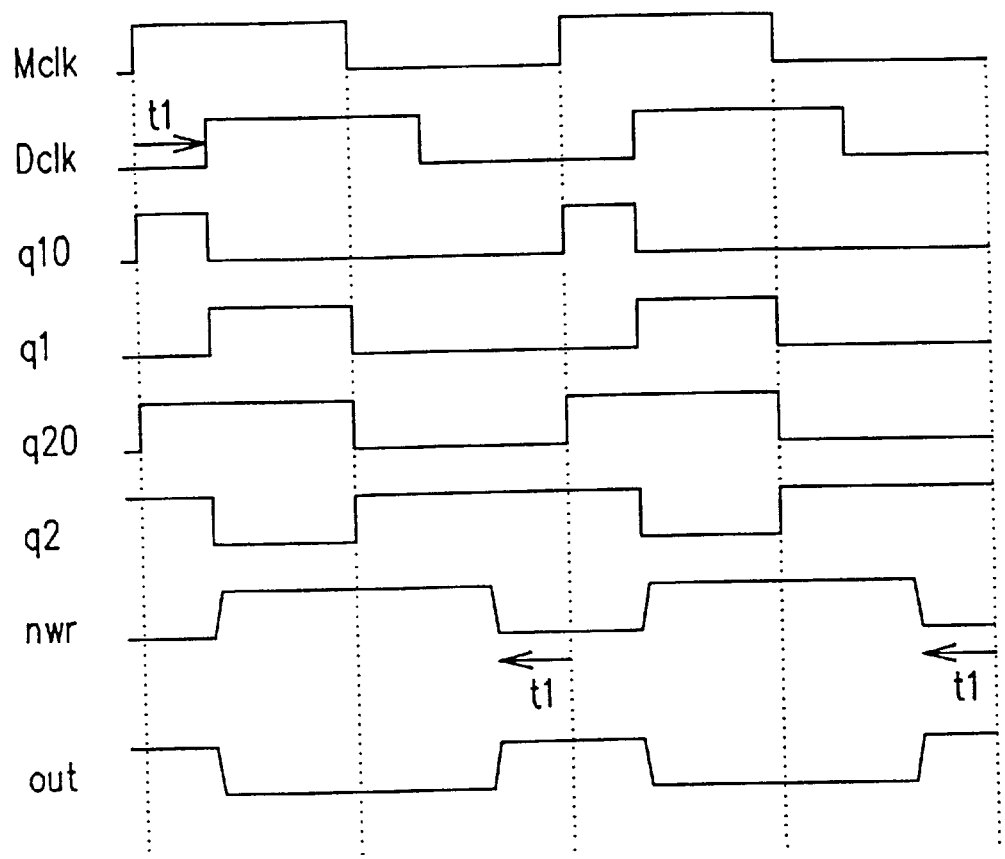
FIG. 16 is a timing diagram illustrating the operation of the timing signal generation circuit shown in FIG. 15.
FIG. 17 is a table showing various states of the timing signal generation circuit shown in FIG. 17.

As shown in FIG. 16, a clock signal whose duty ratio is substantially 50% is employed as a master clock signal Mclk. A delayed clock signal Dclk is a clock signal obtained by delaying the master clock signal Mclk by a time t1. The first delay line is reset while the master clock signal Mclk is at the high level, and the delay time between the delayed clock signal Dclk and the master clock signal Mclk is measured. An output clock signal is generated based on the measurement result while the master clock Mclk is at the low level.

The clock signals q10, q1, q20, and q2 are input to predetermined terminals of the circuit shown in FIG. 15 at the timing shown in FIG. 16. The clock signals q10, q1, q20, and q2 satisfy the following relationships with the master clock signal Mclk and the delayed clock signal Dclk:

q10=Mclk*x(Dclk)
q1=Mclk*Dclk
q20=Mclk
q2=x(Mclk*Dclk)

Herein, x(Dclk) and x(Mclk) represent inverted signals of the clock signals Dclk and Mclk, respectively.

Hereinafter, the operation of the circuit in FIG. 15 will be described.

First, the signal q10 resets a node Ai in the $i^{th}$ (where i is an integer from 1 to N) unit of the first delay line to the low level. Next, the signals q1 and xq1 activate all the clocked inverters in the first delay line.

Since the input of the first delay line is coupled to the ground level, the node A1 of the unit 1 first shifts from the low level to the high level. Then, a node xA1 of the unit 1 shifts from the high level to the low level. Such change in the states of the respective nodes sequentially continues from the unit 1 to the unit N.

Thus, the states of the nodes Ai (where i=1 . . . N) sequentially shift from the low level to the high level, starting from the left unit to the right unit in FIG. 15, like domino pieces knocking over one another. However, when the signal q1 shifts from the high level to the low level, the clocked inverters in all units are inactivated so that the change in the states of the nodes Ai (where i=1 . . . N) stops. At this time, the states of the respective nodes Ai (where i=1 . . . N) are frozen and retained as they are. FIG. 17 shows exemplary states of nodes Ai. In FIG. 17, the change in the states of the node has been propagated from the node Al to the node Ai−1, that is, a boundary position between the high level and the low level has travelled from unit 1 to unit i−1.

During this period (in which the master clock signal Mclk is at the high level), nodes Bi (where i=1 . . . N) are reset to the low level by the signal q20. Next, when the master clock signal Mclk shifts to the low level, the second delay line is activated by the signal q2. In this case, the states of the nodes Bi (where i=1 ... N) sequentially shift from the low level to the high level as in the case of the first delay line. Thus, the boundary between the high level and the low level is transmitted from left to right.

When the node Bi shifts to the high level, the two transistors of the wired OR circuit of the unit i conduct, so that a node nwr of the wired OR circuit starts discharging to the ground. The change in the states of the node Bi is sequentially transmitted from left to right. As a result, the discharging via the wired OR circuit in any unit present to the right of the unit i contributes to a drop in the potential of the node nwr, so that the potential of the node nwr precipitates. However, the starting time of discharging is determined by the position of the unit i in which the discharging first begins.

The potential of the nodes nwr is inverted by an inverter, whereby an output OUT is obtained. As shown in FIG. 16, the output OUT has an edge which rises earlier than the next rise edge of the master clock signal Mclk by t1. In other words, the output OUT has a minus delay with respect to the master clock signal Mclk.

In order to ensure accurate operation of this circuit, it is necessary to set the high level period and the low level period of the master clock signal Mclk substantially equal so that the duty ratio of the master clock signal Mclk becomes substantially 50%.

Next, an example of an improved timing signal generation circuit capable of accurate operation even in the case where a master clock signal Mclk having a duty ratio of 50% is not available will be described.

Figure 18:
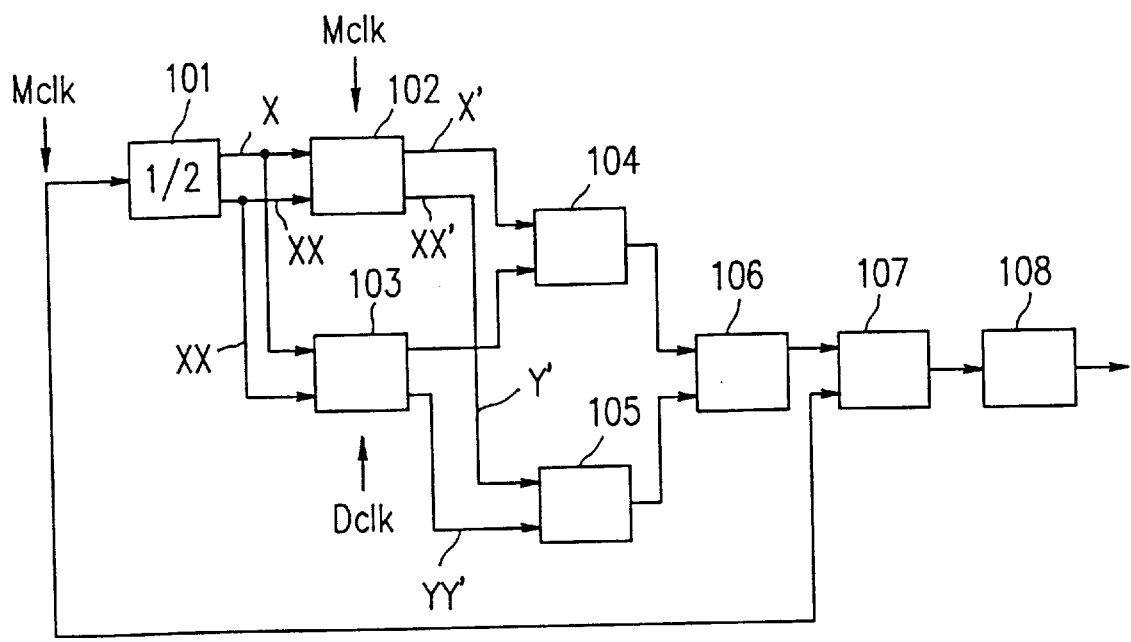
FIG. 18 is a diagram illustrating an improved modification of the timing signal generation circuit shown in FIG. 15.

In FIG. 18, a divider 101 divides an input master clock signal Mclk so as to generate a clock signal x having a cycle twice as large as that of the master clock signal Mclk and an inverted signal xx obtained by inverting the clock signal x. The duty ratio of the clock signal x and the duty ratio of the inverted signal xx are 50% even if the duty ratio of the master clock signal Mclk is 10%. However, the clock signal x and the inverted signal xx are generated with a slight delay with respect to the master clock signal Mclk owing to the characteristics of the divider 101. Sampling circuits 102 and 103 receive the clock signal x and the inverted signal xx. The sampling circuits 102 and 103, which are composed of clocked inverters and the like, are controlled by the master clock signal Mclk and the delayed clock signal Dclk. The sampling circuits 102 and 103 ensure that an edge of the clock signal x and an edge of the inverted signal xx are synchronized with an edge of the master clock signal Mclk and an edge of the delayed clock signal Dclk.

Each of circuits 104 and 105 generates a clock signal having a pseudo-negative delay as shown in FIG. 15. The circuits 104 and 105 operate with the opposite phases, and alternately output clock signals having pseudo-negative delays. These outputs are overlaid with each other in a clock selection circuit 106. Either one of the output of the clock selection circuit 106 and the master clock signal Mclk whose level varies before the other is selected by a clock process circuit 107, and is output via an output circuit 108. It is applicable to combine the clock selection circuit 106 and the clock process circuit 107 by using a simple OR circuit.

By adopting the above-mentioned configuration, it becomes possible to generate a clock signal having a pseudo-negative delay by using the circuit in FIG. 15 irrespective of the duty ratio of the master clock signal Mclk.

EXAMPLE 4

Next, a data transfer circuit and a method of data transfer incorporating the timing signal generation circuit according to the present invention will be described with reference to FIGS. 19 and 20.

Figure 19:
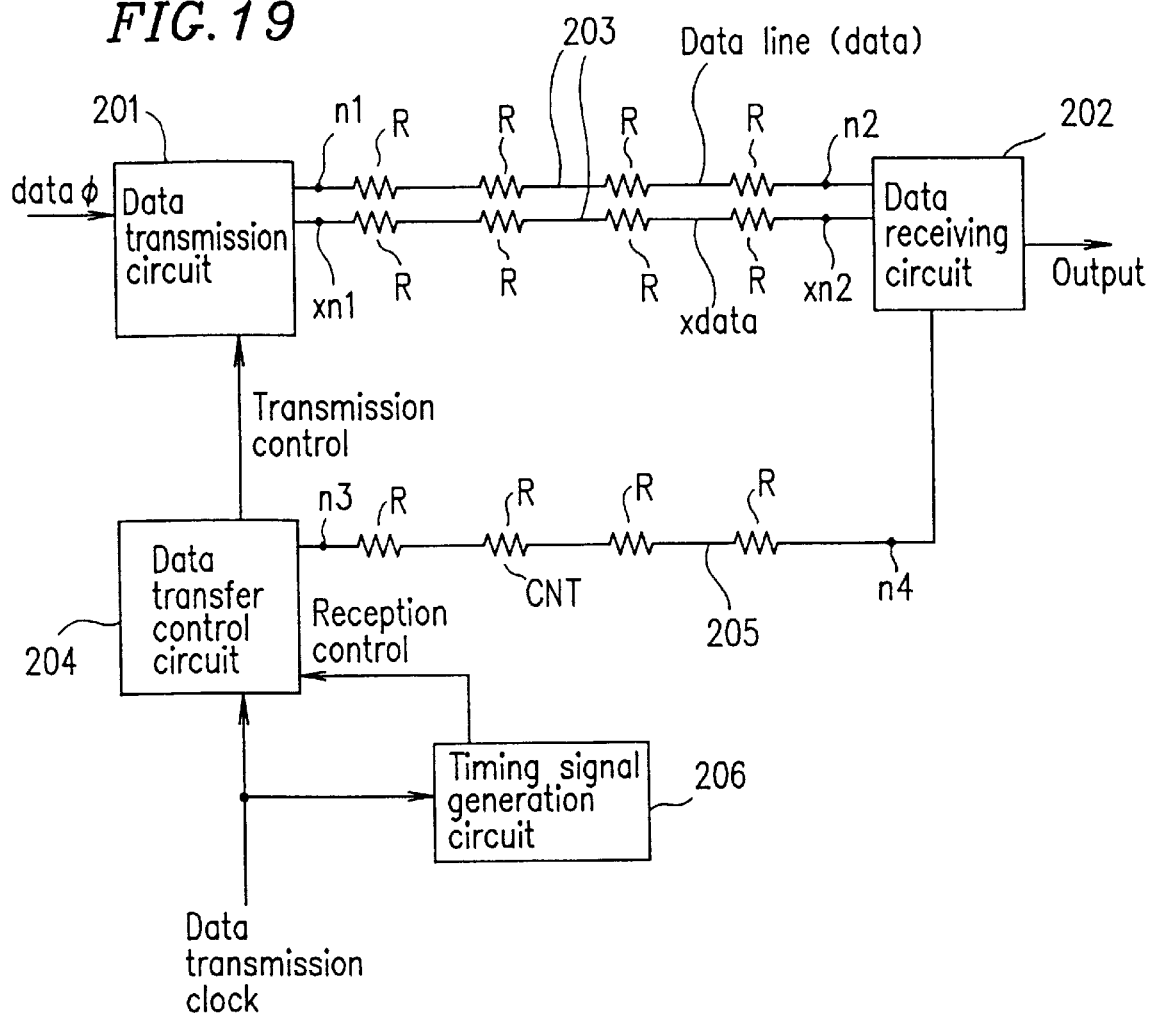
FIG. 19 is a diagram illustrating a data transfer circuit incorporating a timing signal generation circuit according to the present invention.

As shown in FIG. 19, a data transmission circuit 201 and data receiving circuit 202 are interconnected with each other via two data transfer paths 203. The data transmission circuit 201 generates data n1 and xn1, which are complementary to each other, based on input data (dataΦ) to be transferred, and transmits the data n1 and xn1 in synchronization with a data transmission signal. The transfer of data is achieved in the form of differential signals. Thus, the potentials of the data transfer paths 203 start shifting responsive to a rise edge of the data transmission signal. The data transmission circuit 202 detects potentials n2 and xn2 of nodes at the right ends of the data transfer paths 203. The potentials n2 and xn2 of the right end nodes of the data transfer paths 203 have somewhat blunter waveforms than the waveforms of the data n1 and xn1, owing to the parasitic resistance and the parasitic capacitance of the data transfer paths 203.

A data transfer control circuit 204 supplies the data transmission signal to the data transmission circuit 201, thereby controlling the timing of data transmission by the data transmission circuit 201 in accordance with a data transmission clock signal. The data transmission control circuit 204 also transfers a receiving control signal n3 to the data receiving circuit 202 via a clock transfer path 205 so as to control the timing of data detection by the data receiving circuit 202. More specifically, the data transfer control circuit 204 receives a clock signal having a pseudo-negative delay generated by a timing signal generation circuit according to any of the above-described Examples, and outputs the clock signal to the clock transfer path 205 as the receiving control signal n3. The clock transfer path 205 also has parasitic resistance and parasitic capacitance. As a result, the receiving control signal n3 becomes blunt while being transferred through the clock transfer path 205, so as to have a waveform shown as n4 in FIG. 20.

Figure 20:
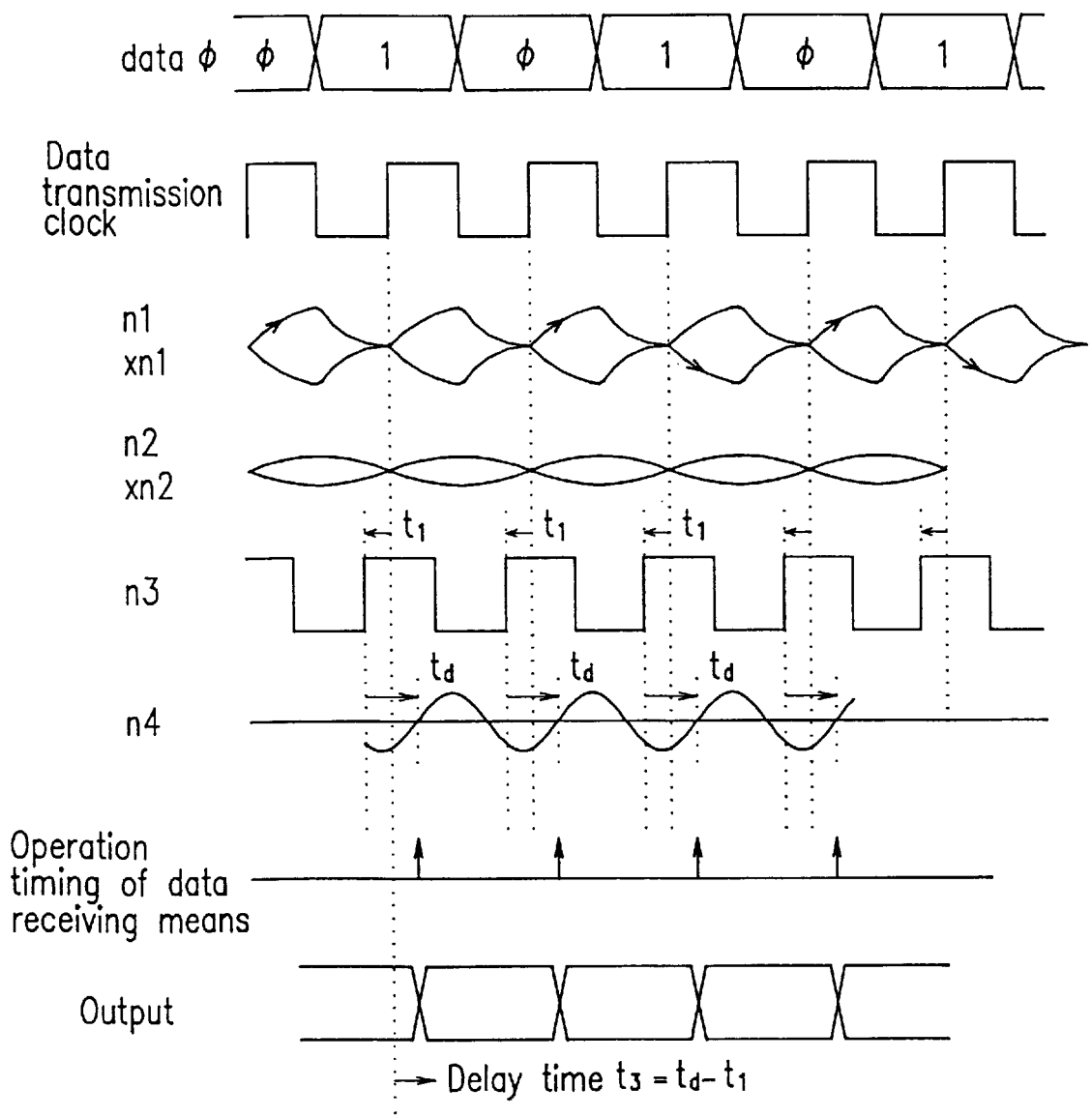
FIG. 20 is a timing diagram illustrating the operation of the circuit shown in FIG. 19.

As shown in FIG. 20, the receiving control signal is transmitted for the data receiving circuit 202 at a time which is earlier by t1 from the time at which the data transmission circuit 201 starts transmission. As a result, the potential of the clock transfer path 205 reaches a desired level earlier by the time t1. Thus, the time t3 required for data transfer as measured from a rise edge of the data transmission clock signal is reduced to (td−t1) (where td denotes a delay time). In order to attain stable data transfer, the pseudo-negative delay time (t1) should be increased as the lengths of the data transfer paths 203 and the clock transfer path 205 increase, that is, as the time required for transferring electric signals increases.

Preferably, the signal amplitude of data on the data transfer path is reduced to a half or less of the amplitude of the receiving control signal.

EXAMPLE 5

Next, another example of a data transfer circuit according to the present invention will be described with reference to FIG. 21.

In the present example, a plurality of data transmission circuits 201 and a data receiving circuit 202 are connected to each data bus 210 functioning as a data transfer path. A data transmission control circuit 204 and a timing signal generation circuit 206 for generating a clock signal having a pseudo-negative delay are connected to each data transmission circuit 201. Each data transmission control circuit 204 transmits a receiving control signal to a clock transfer path 205 connected to the data receiving circuit 202.

The functions and the structures of the data transmission circuits 201, the data receiving circuit 202, the data transfer control circuits 204, and the timing signal generation circuits 206 are the same as those of the respective circuits described in Example 4. One feature of the present example is that capacitance shielding means (s1, six, si, six, ..., sN, sNx) are provided between the data buses 210 and the respective data transmission circuits 201 (1, ..., i, ..., N). The capacitance shielding means (s1, six, si, six, ..., sN, sNx) connect or disconnect the data transmission circuits 201 (1, ..., i, ..., N) to the data buses 210 in accordance with a signal from respective block control sections 208. When the data transmission circuits 201 (1, ..., i, ..., N) are disconnected from the data buses 210, the capacitance shielding means (s1, six, ..., si, six, ..., sN, sNx) ensure that the data transmission circuits 201 have an output capacitance of substantially zero with respect to the data buses 210.

Figure 22:
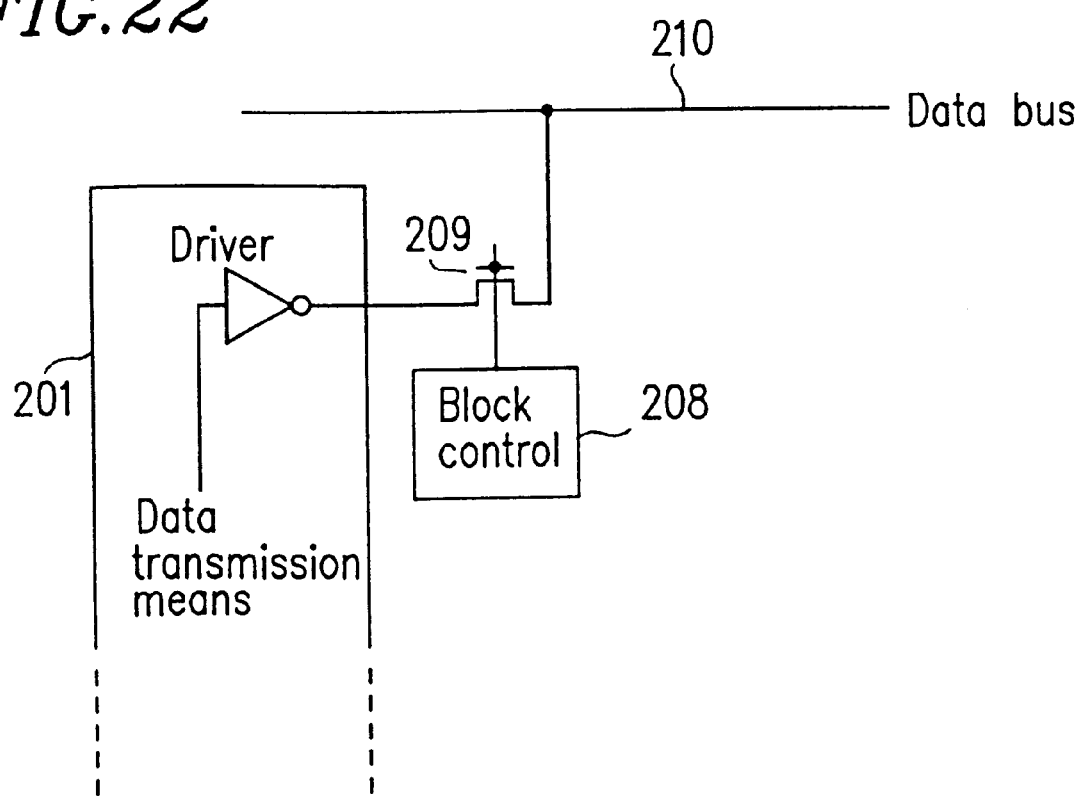
FIG. 22 is a diagram illustrating an improved modification of the data transfer circuit shown in FIG. 21.

FIG. 22 shows a case where an MOS field effect transistor (FET) 209 is employed as a capacitance shielding means. The potential of a gate of the MOS FET is controlled by the block control section 208. The MOS FET, which has a smaller capacitance than those of the output circuit of the data transmission circuits 201, connects or disconnects a corresponding one of the data transmission circuits 201 to/from either one of the data buses 210. As a result, the large load capacitance of the output circuit can be effectively shielded from the data buses 210.

Figure 21:
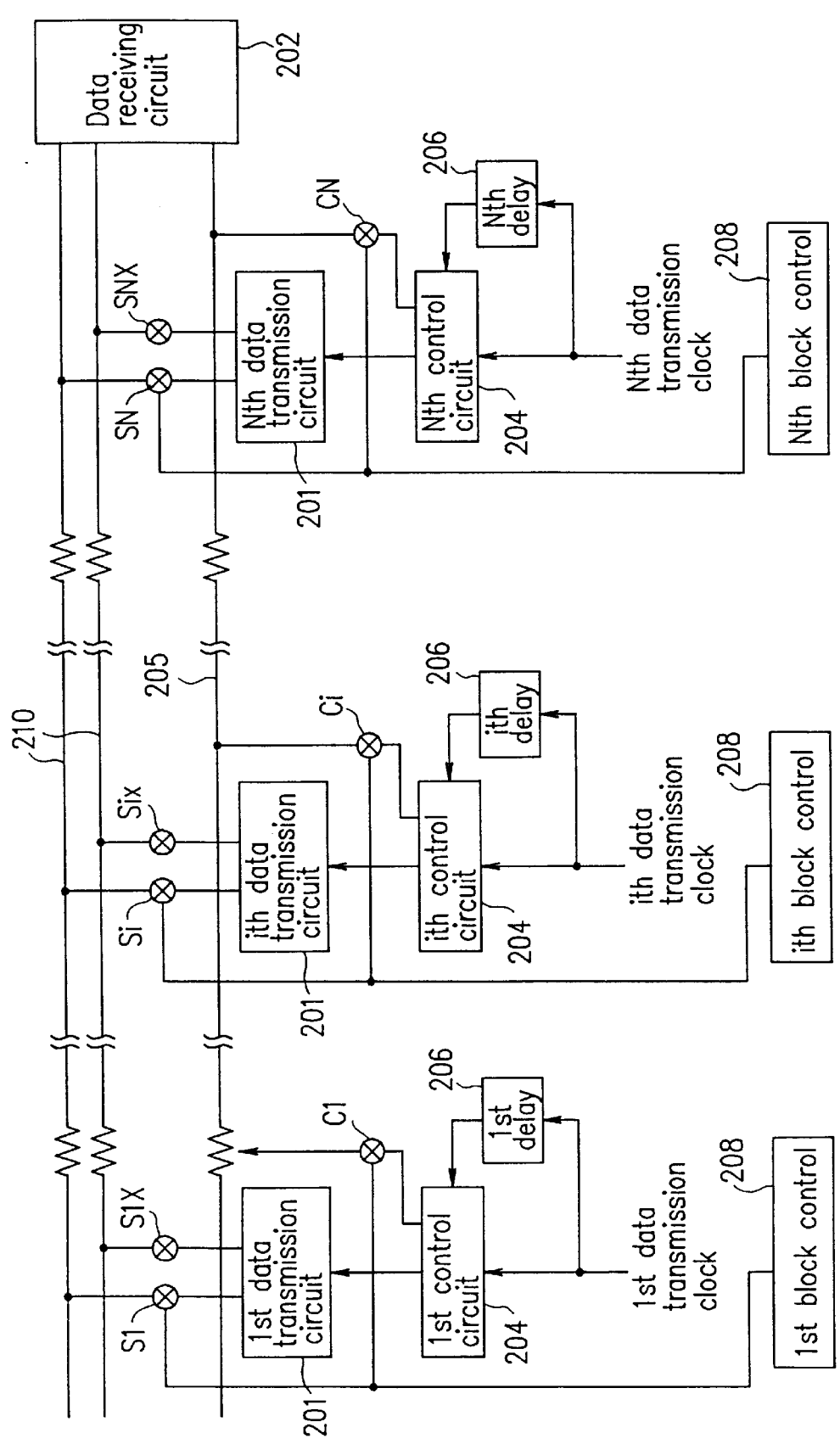
FIG. 21 is a diagram illustrating another data transfer circuit incorporating a timing signal generation circuit according to the present invention.

It is preferable to provide similar capacitance shielding means (c1, ..., cN) between the clock transfer path 205 and each data transmission control circuit 204 as shown in FIG. 21. Such capacitance shielding means (cd, ..., cN) connect or disconnect the data transmission control circuits 204 to/from the clock transfer path 205 in accordance with a signal from the block control sections 208.

By adopting the above-described configuration, it becomes possible to minimize the total parasitic capacitance of the data buses 210 and the clock transfer path 205, thereby making the operation of the device more stable.

EXAMPLE 6

Next, still another example of a timing signal generation circuit according to the present invention will be described with reference to FIG. 23.

Figure 23:
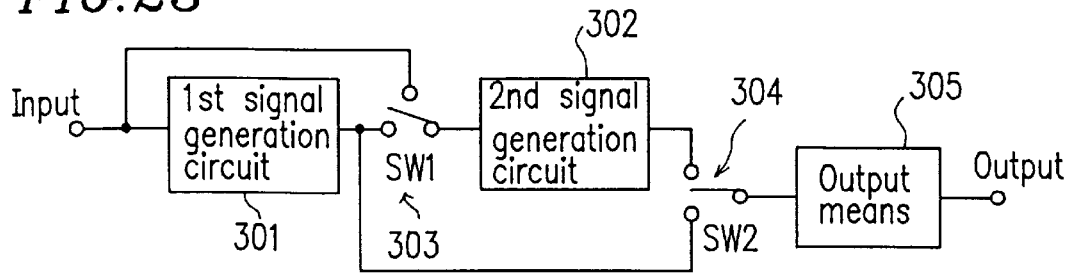
FIG. 23 is a diagram illustrating still another example of the timing signal generation circuit according to the present invention.

The timing signal generation circuit of the present example includes a first signal generation circuit 301 capable of generating a signal having a pseudo-negative delay with respect to an input signal, a second signal generation circuit 302 capable of generating a signal having a positive delay with respect to an input signal, a switch circuit 303 (SW1) connecting or disconnecting between the first signal generation circuit 301 and the second signal generation circuit 302 as shown in FIG. 23, and an output circuit 305 for selectively outputting output signals from the first signal generation circuit 301 or the second signal generation circuit 302 via a switch circuit 303 (SW2). The first signal generation circuit 301 can be implemented as any of the timing signal generation circuits described heretofore.

According to the present example, it is possible to selectively output either a signal having a pseudo-negative delay with respect to an input clock signal or a signal having a positive delay with respect to the input clock signal. Therefore, it becomes possible to freely design various timing signal generation circuits.

EXAMPLE 7

Next, still another example of a timing signal generation circuit according to the present invention will be described with reference to FIG. 24. The system of the present example includes a plurality of timing signal generation circuits 401 (indicated as timing 1, timing 2, timing 3, and timing 4) each generating a signal having a pseudo-negative delay time with respect to a single input clock signal. The timing signal generation circuits 401 can have any configuration as long as they are capable of generating signals having pseudo-negative delay as described above. Moreover, a switch circuit 402 (SWS) is provided for each timing signal generation circuit 401 so that the clock signal can be input to a selected one of the timing signal generation circuits 401. Furthermore, the system of the present example includes an original clock supply circuit 403 for supplying an original clock signal to the switch circuits 402 and an external clock input circuit 404 for inputting an external clock signal to the original clock supply circuit 403.

In accordance with the above configuration, it is possible to selectively provide a clock signal having pseudo-negative delay with respect to an external clock signal for only one (or more) of circuit blocks 405 (1, 2, 3, and 4). As a result, it is possible to operate only a minimum number of circuits at the same time, whereby the power consumption of the system as a whole can be reduced.

By thus employing a plurality of timing signal generation circuits each generating a signal having a pseudo-negative delay time with respect to a single input clock signal, it becomes possible to generate and supply to a selected circuit a desired clock signal after a very short setup time, which any conventional technique could not attain.

EXAMPLE 8

Next, a semiconductor storage device incorporating a timing signal generation circuit according to the present invention will be described with reference to FIGS. 25 and 26.

Figure 25:
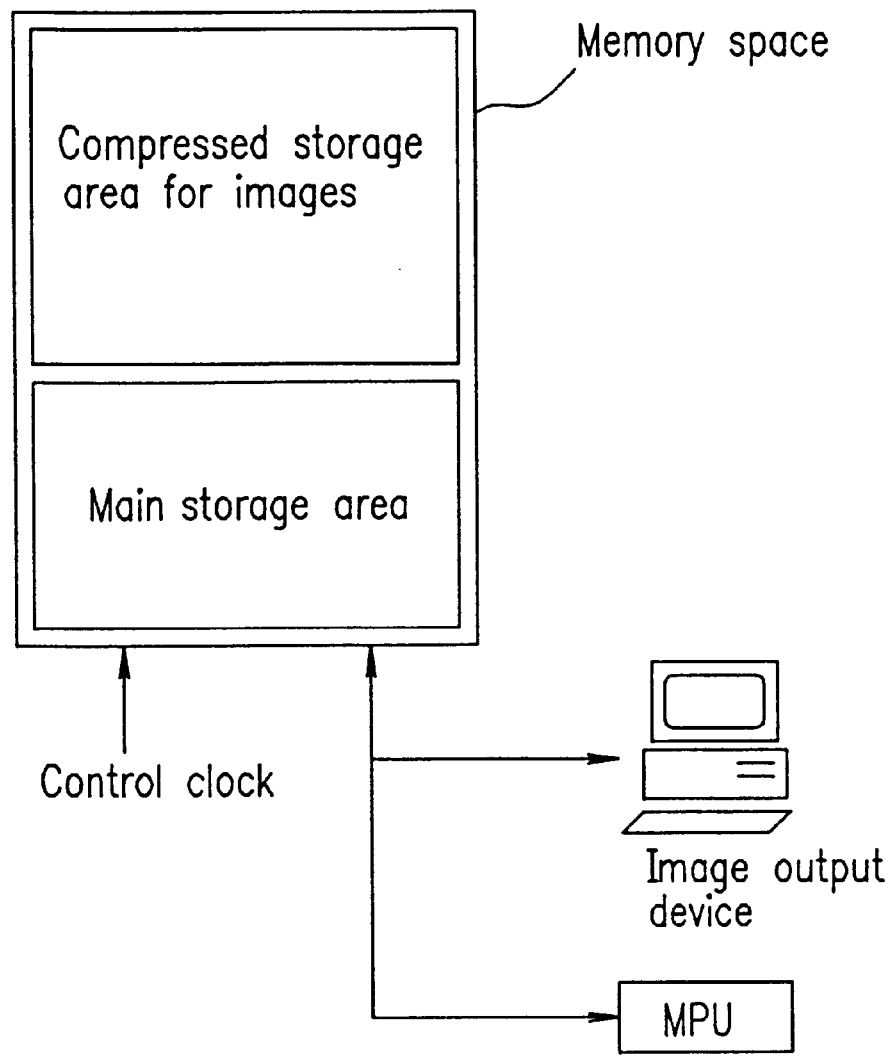
FIG. 25 is a diagram illustrating a semiconductor storage device incorporating the timing signal generation circuit according to the present invention.
Figure 26:
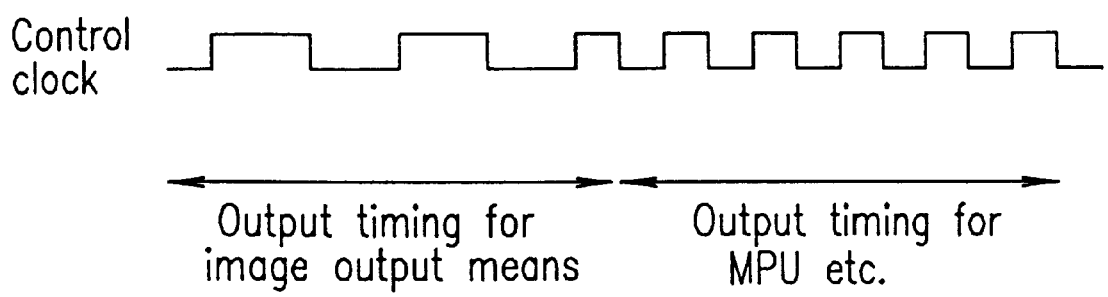
FIG. 26 is a waveform diagram illustrating a clock signal used in the semiconductor storage device shown in FIG. 25.

FIG. 25 schematically shows the memory space of a semiconductor storage device incorporating a timing signal generation circuit (not shown) according to the present invention. The memory space is logically divided into two storage areas, namely, a compressed storage area capable of outputting data to an image output means, and a storage area capable of outputting data to microprocessor units (MPU), etc. other than image output means. The semiconductor storage device handles transmission/receiving of data between an image output device and a microprocessor. It is assumed that the image output device is capable of expanding compressed data.

Figure 24:
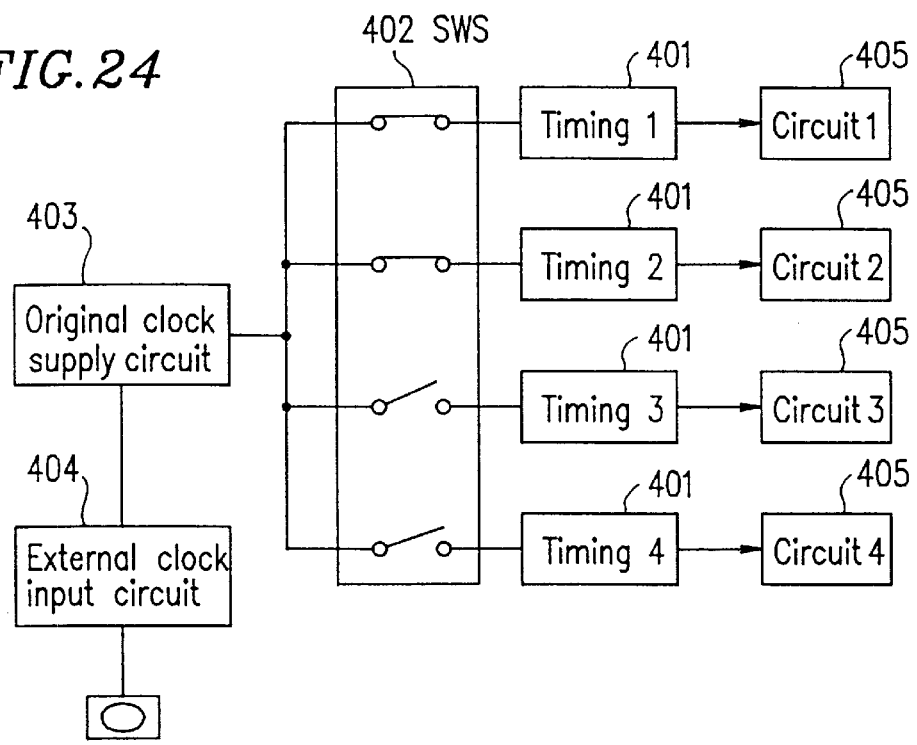
FIG. 24 is a diagram illustrating a device including a plurality of timing signal generation circuits according to the present invention.

The semiconductor storage device of the present example includes a plurality of timing signal generation circuits as shown in FIG. 24, for example. One or more timing signal generation circuits are promptly selected depending on the device to which data is to be output. Thus, when outputting data stored therein to an image output device, the semiconductor storage device operates in accordance with a control clock signal having a frequency acceptable to the image output device. When transmitting/receiving data to/from a microprocessor, etc., the semiconductor storage device operates in accordance with a control clock signal having an appropriate frequency. FIG. 26 shows a manner in which the frequency of the control clock signal changes when switching between an image output device and a microprocessor, for example. As shown in FIG. 26, the frequency of the control clock signal can be promptly changed by using the timing signal generation circuits of the present invention.

By adopting the above configuration, the storage device can function both as an image memory and as a main storage memory, whereby the cost of the entire system can be reduced. Such an "on-the-fly" switching of the frequency of a clock signal only becomes possible by utilizing pseudo-negative delay provided by the timing control circuit described in the present invention. Conventional PLL circuits or the like cannot attain such "on-the-fly" switching due to their inherent problem of a long setup time as described earlier.

EXAMPLE 9

An example of a switch circuit according to the present invention will be described with reference to FIG. 27. The switch circuit shown in FIG. 27 includes: a first p-MOS transistor having a gate connected to an input terminal, a source connected to a wire having a supply potential, and a drain connected to an intermediate terminal; a first n-MOS transistor having a source connected to the intermediate terminal and a gate connected to a control terminal; and a second n-MOS transistor having a gate connected to the input terminal, a source connected to the drain of the first n-MOS transistor, and a drain connected to a wire having a ground potential.

Figure 27:
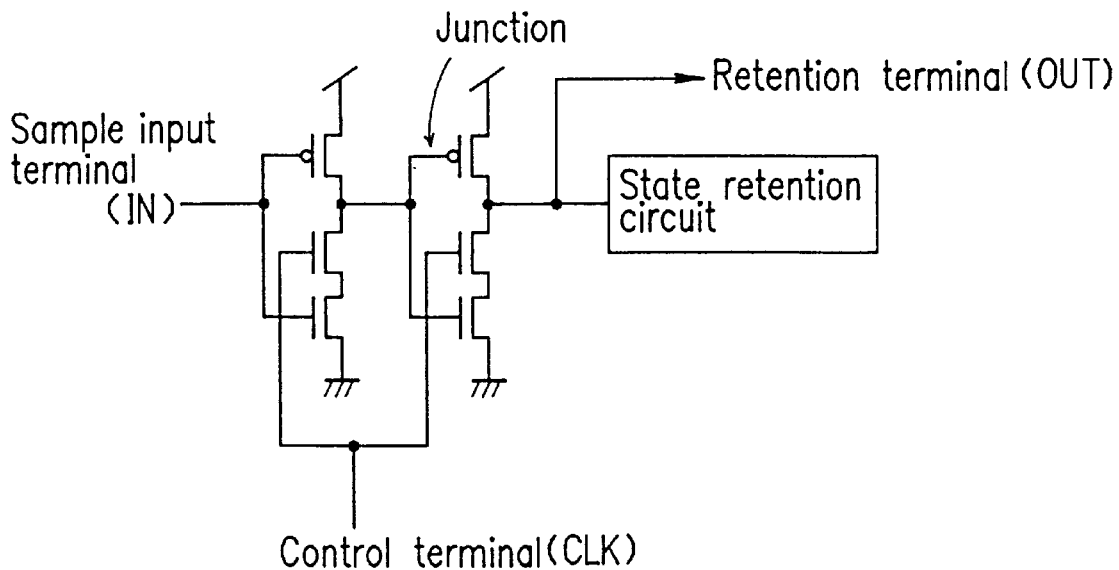
FIG. 27 is a diagram illustrating an example of a switch circuit which opens or closes responsive to a timing signal according to the present invention.

The switch circuit shown in FIG. 27 further includes: a second p-MOS transistor having a gate connected to the intermediate terminal, a source connected to a wire having the supply potential, and a drain connected to a retention terminal; a third n-MOS transistor having a source connected to the retention terminal and a gate connected to the control terminal; and a fourth n-MOS transistor having a gate connected to the intermediate terminal, a source connected to the drain of the third nMOS transistor, and a drain connected to a wire having the ground potential. The retention terminal is connected to a state retention circuit composed of a static latch and the like.

In accordance with the above configuration, a signal on the input terminal is output to the output terminal when a clock signal (CLK) supplied to the control terminal is at a high level, and the same signal is continuously output to the output terminal after the clock signal CLK shifts to a low level.

Figure 28:
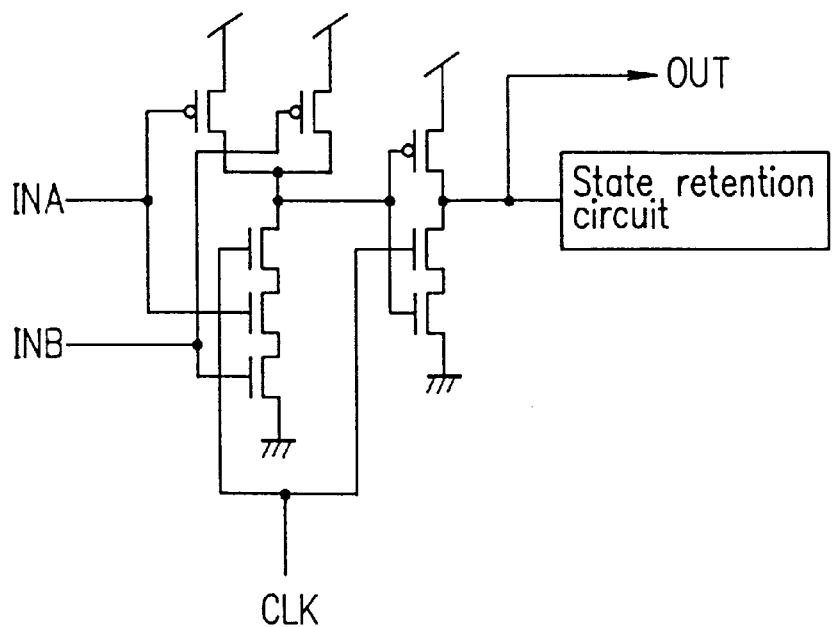
FIG. 28 is a diagram illustrating another example of a switch circuit which opens or closes responsive to a timing signal according to the present invention.

FIG. 28 shows a switch circuit which is improved from the circuit in FIG. 27. The circuit in FIG. 28 has two input terminals and two corresponding first p-MOS transistors, unlike in the circuit shown in FIG. 27. The two first p-MOS transistors are connected in parallel to a first n-MOS transistor. By adopting the above configuration, a logical OR of signals on the respective input terminals is output to the output terminal when a clock signal (CLK) supplied to the control terminal is at a high level, and the same signal (logical OR of the input signals) is continuously output to the output terminal after the clock signal CLK shifts to a low level.

Figure 29A:
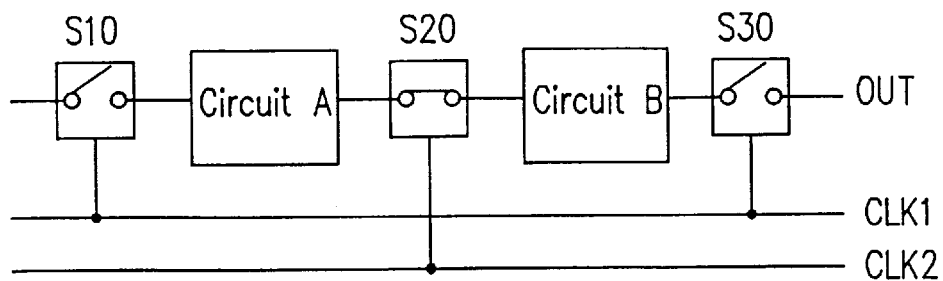
FIG. 29A is a diagram illustrating an example of a circuit incorporating the switch circuit shown in FIG. 27.

FIG. 29A shows a circuit in which a circuit A and a circuit B are connected between an input terminal (IN) and an output terminal (OUT) via switch circuits S10, S20, and S30 which are similar to the switch circuit shown in FIG. 27. A first control line (CLK1) is coupled to the control terminals of the switch circuits S10 and S30, and a second control line (CLK2) is coupled to the control terminal of the switch circuit S20.

Figure 29B:
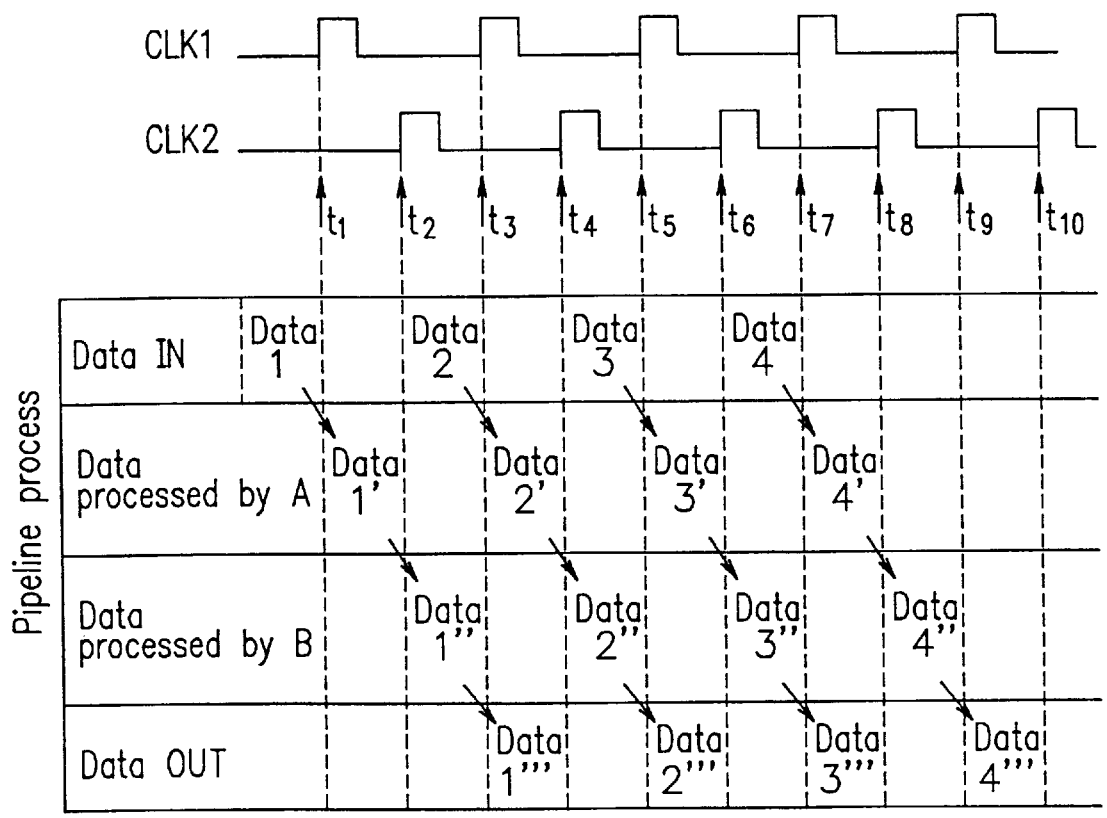
FIG. 29B is a timing diagram illustrating the pipeline operation of the circuit shown in FIG. 29A.

A pipeline process as shown in FIG. 29B is performed for data on the input terminals in accordance with a clock signal (CLK1) on the first control line and a clock signal (CLK2) on the second control line. The load capacitances of the first control line (CLK1) and the second control line (CLK2) are substantially determined by the gate capacitances of the n-MOS transistors in the corresponding switch circuits. The beginning of operation is determined by the threshold values of the n-MOS transistors in the switch circuits.

EXAMPLE 10

Figure 30:
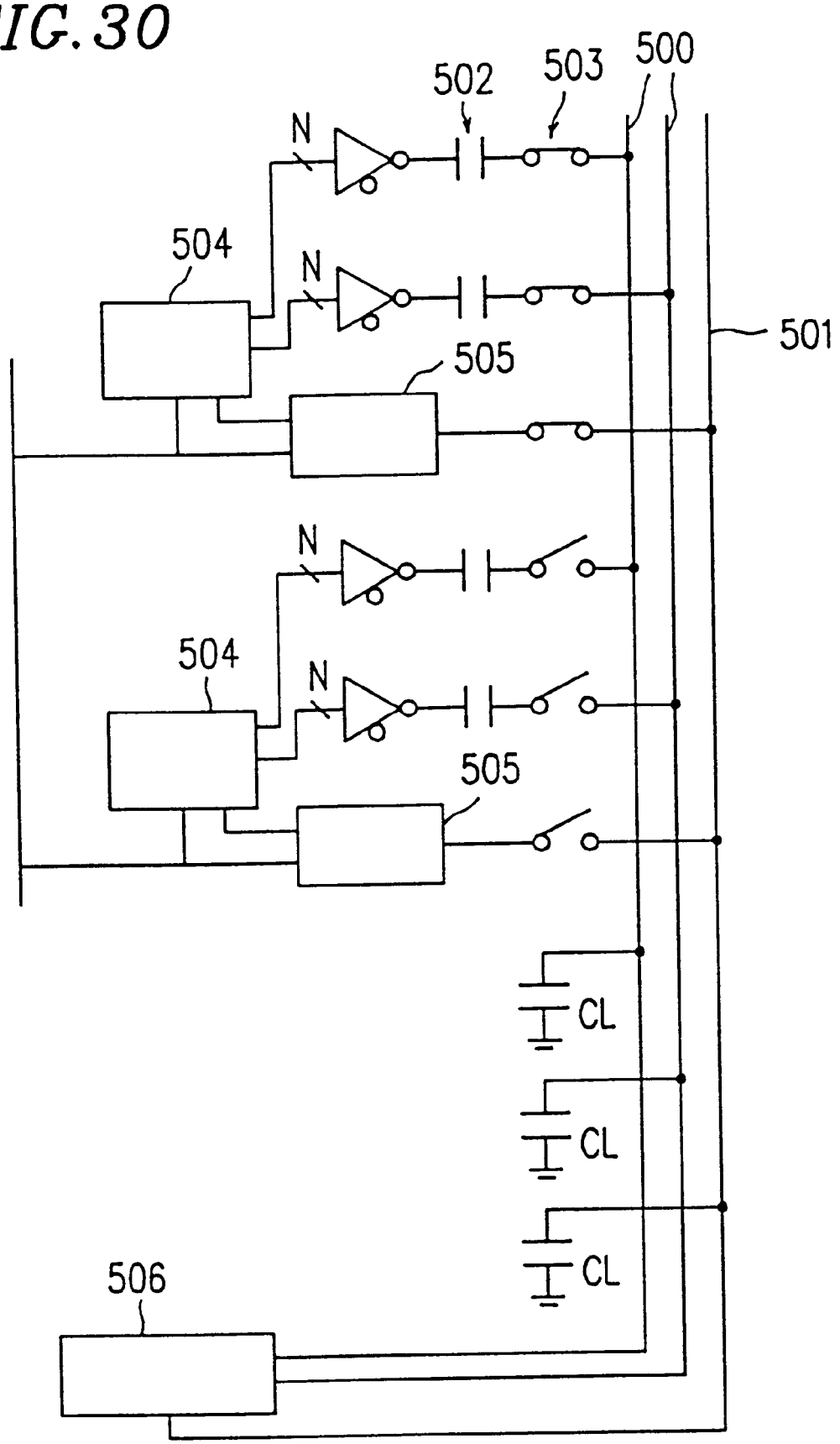
FIG. 30 is a diagram illustrating still another example of the data transfer circuit according to the present invention.

FIG. 30 shows still another example of a data transfer circuit according to the present invention. The data transfer circuit includes a plurality of data buses 500 for transmitting data, a trigger signal path 501 for transmitting a trigger signal, a plurality of data transmission circuits 504 coupled to the data buses 500 via capacitors 502 and switch circuits 503, trigger signal transmission circuits 505 connected to the trigger signal path 501 via switch circuits 503, and a data receiving circuit (reception amplifier) 506 coupled to the data buses 500. One or more data transmission circuits 504 are selectively connected to the data buses 500 via the corresponding capacitors 502 and switch circuits 503. Hereinafter, the operation of this data transfer circuit will be described.

Figure 31A:
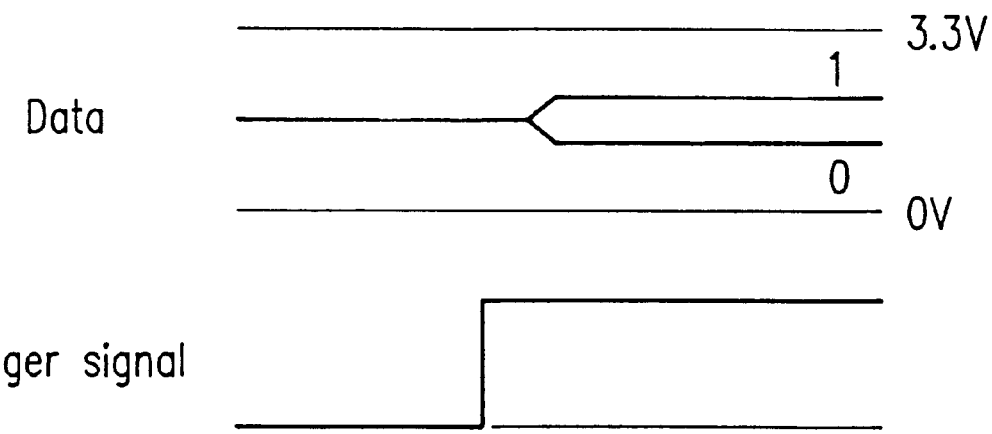
FIG. 31A is a diagram illustrating the operation of the data transfer circuit shown in FIG. 30.
Figure 31B:
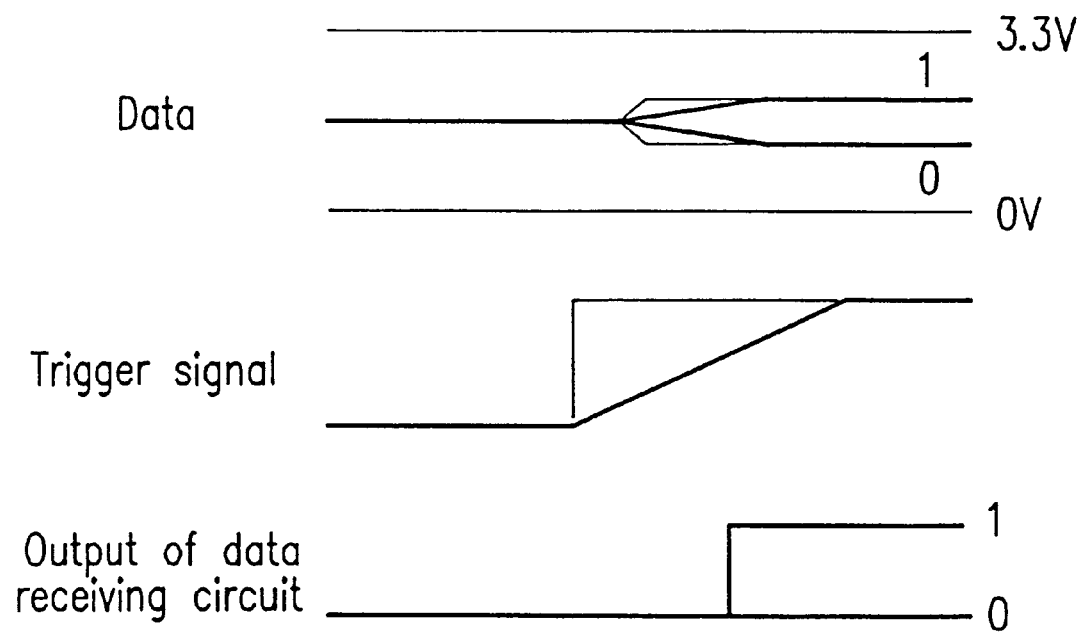
FIG. 31B is a diagram illustrating the operation of the data transfer circuit shown in FIG. 30.

First, both ends of the capacitors 502 and the data buses 500 are precharged at a predetermined potential, e.g., about ½ $V_{cc}$. Next, the switch circuits 503 are selectively allowed to conduct so that the corresponding data transmission circuit 504, coupled to the corresponding capacitor 502, is activated. Then, data as shown in FIG. 31A appears on the data buses 500. The corresponding trigger signal transmission circuit 505 transmits a trigger signal to the trigger signal path 501. The data receiving circuit 506 receives the trigger signal via the trigger signal path 501, and starts an operation for detecting a voltage at the receiving ends of the data buses 500 responsive to the trigger signal. It is preferable to utilize a signal having the above-mentioned negative delay as a trigger signal so that the trigger signal can be transmitted before the data transmission circuit 504 transmits data to the data buses 500. As a result, as shown in FIG. 31B, it is ensured that the time at which the trigger reaches a predetermined level in the vicinity of the data receiving circuit 506 corresponds to the time at which the data becomes established or stable at the receiving ends of the data buses 500. Thus, stable data transmission/reception of data is achieved with optimum timing.

In accordance with the present data transfer circuit, the amplitude of the signal on the data buses 500 is adjusted so as to be sufficiently smaller than the difference between a power level (3.3 volts) and a ground level (0 volts), as shown in FIG. 31A, because the signal amplitude is determined by the capacitances of the capacitors 502 and load capacitors $C_L$. If the data transmission circuits 504 were coupled to the data buses 500 without the capacitors 502 interposed therebetween, the signal amplitude of the signal on the data buses 500 would fully swing between the power level and the ground level. Such full-swinging of the signal results in excessive power being consumed. By adopting the capacitor connection according to the present example, the power consumption can be remarkably reduced.

Figure 32:
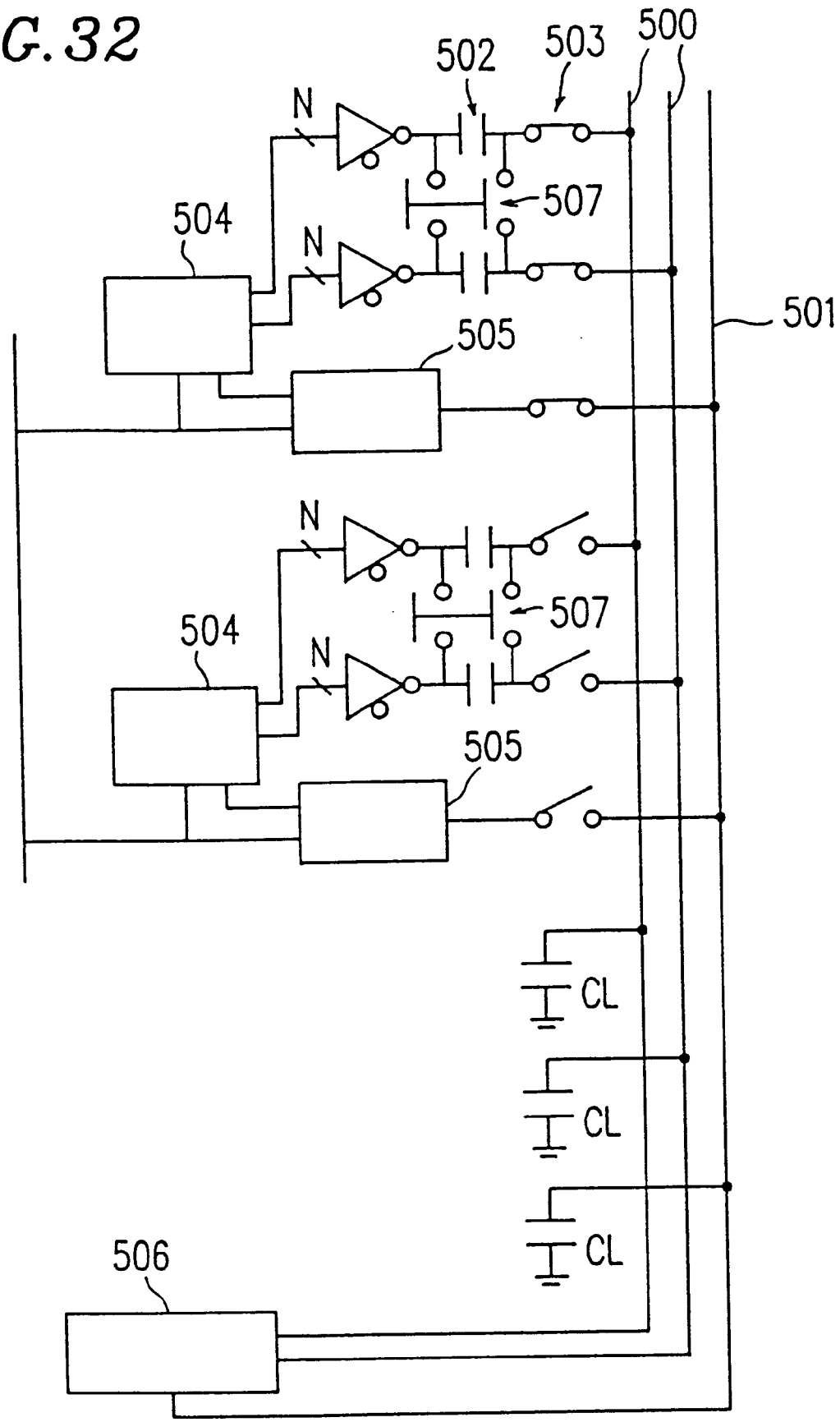
FIG. 32 is a diagram illustrating an improved modification of the data transfer circuit shown in FIG. 30.

FIG. 32 shows an improved modification of the example shown in FIG. 30. In this modification, in order to precharge one end of the capacitors 502 and the data buses 500 at a predetermined potential (e.g., about ½ $V_{cc}$), both ends of a capacitor 502 associated with one of a pair of data buses 500 are coupled to the respective ends of a capacitor 502 associated with the other data bus 500. As a result, a current flows from one of the data buses 500 that is at a higher potential to the data bus 500 that is at a lower potential, thereby equalizing the potentials of the data buses 500. Consequently, charges which are required for the precharging process are prevented from being wasted, thereby resulting in a smaller power consumption.

Figure 33:
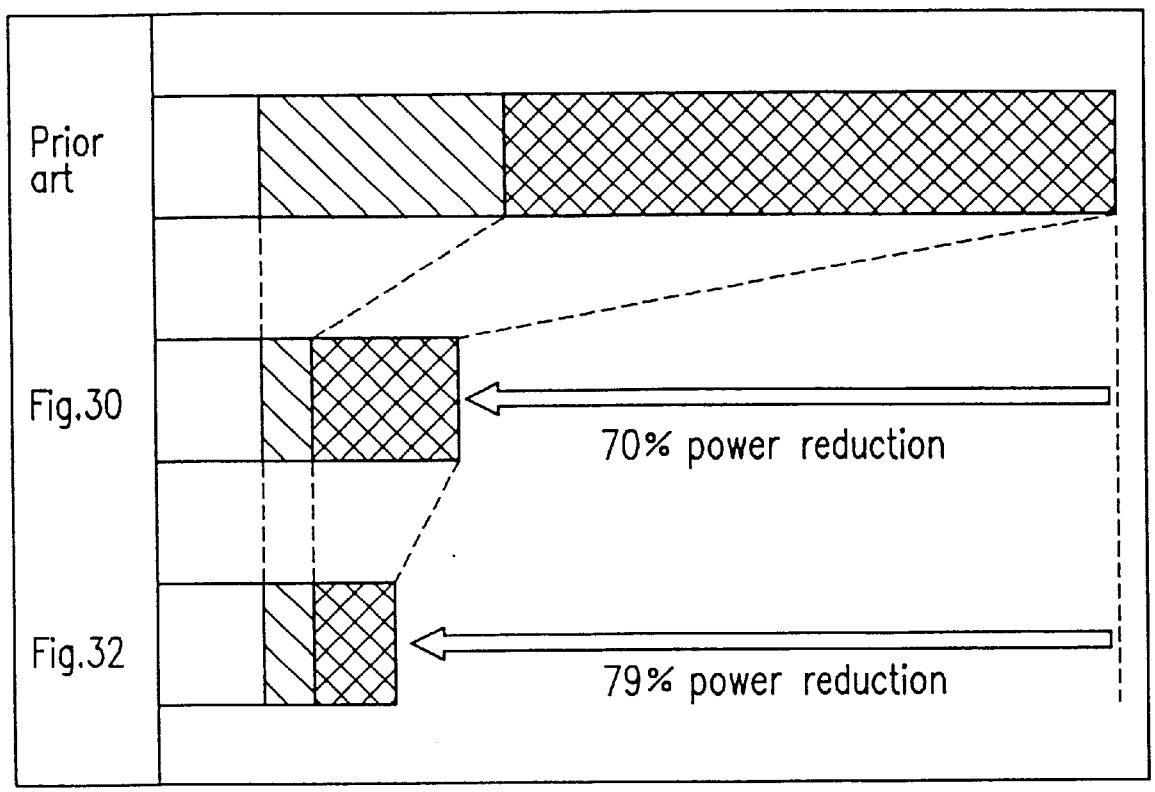
FIG. 33 is a diagram comparing a data transfer circuit according to the present invention and a conventional data transfer circuit in terms of their power consumption.

FIG. 33 schematically shows the power consumption levels of a conventional transfer system and the data transfer systems of the present invention. As seen from FIG. 33, the power consumption of the data transfer circuit shown in FIG. 33 is reduced by 70%, and the power consumption of the data transfer circuit shown in FIG. 32 is reduced by 79% when the circuit operates at a clock frequency of 100 MHz, when the circuits operate with a clock frequency of 100 MHz.

Figure 34A:
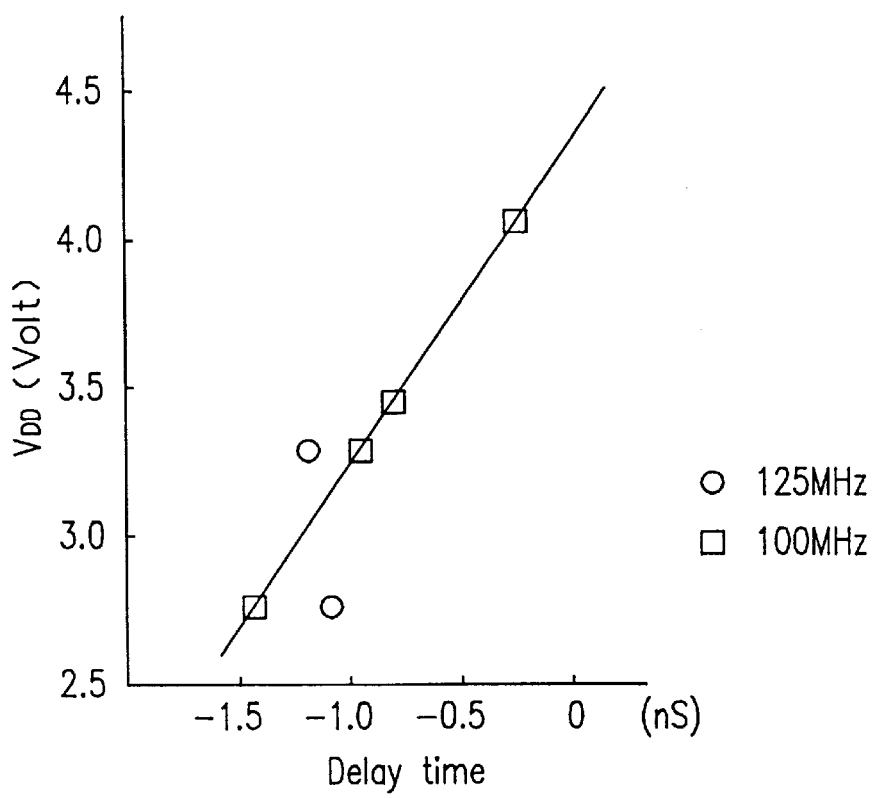
FIG. 34A is a diagram illustrating the relationship between the negative delay time and the supply voltage ($V_{dd}$) in the timing signal generation circuit (negative delay circuit) shown in FIG. 15.
Figure 34B:
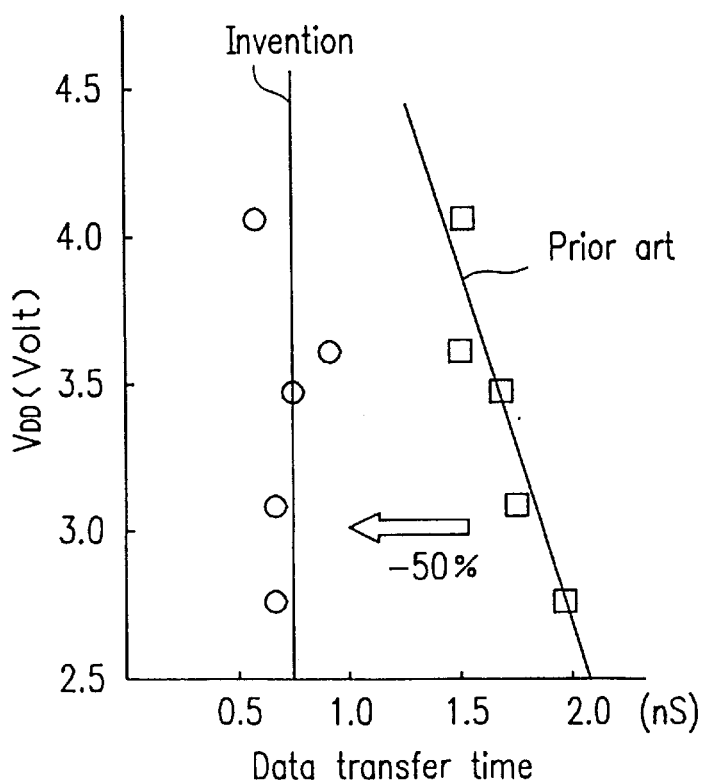
FIG. 34B is a diagram illustrating the relationship between the data transfer time and the supply voltage ($V_{dd}$) in the timing signal generation circuit (negative delay circuit) shown in FIG. 15.

FIG. 34A shows the relationship between the negative delay time and the supply voltage (Vdd) of the timing signal generation circuit (negative delay circuit) shown in FIG. 15. As seen from FIG. 34A, the absolute value of the delay time decreases as the supply voltage (Vdd) increases. By constructing the data transfer circuit in FIG. 32 employing such a negative delay circuit, the time required for transferring data can be reduced as shown in FIG. 34B. In a supply voltage range of about 2.7 volts to 4.0 volts, the data transfer time is reduced to about a half. In addition, the data transfer time substantially does not depend on the supply voltage level.

Figure 35:
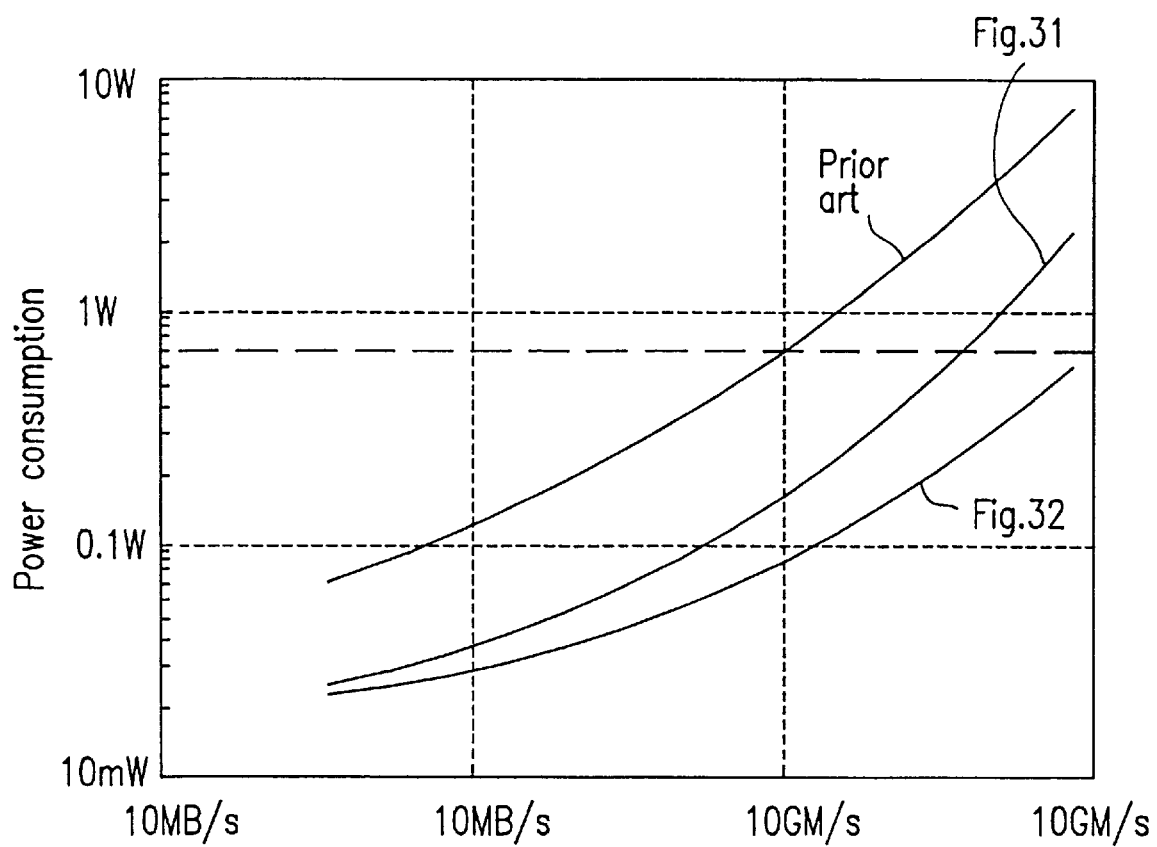
FIG. 35 is a diagram illustrating the relationship between data transfer rates and power consumption.

FIG. 35 shows the relationship between the data transfer rate and the power consumption. As seen from FIG. 35, the power consumption increases as the data transfer rate increases. According to the present invention, a data transfer rate of 10 GB/second can be realized with a power consumption of 500 mW or less. It is significant to the practicality of the system to attain a power consumption of 500 mW or less.

Figure 49:
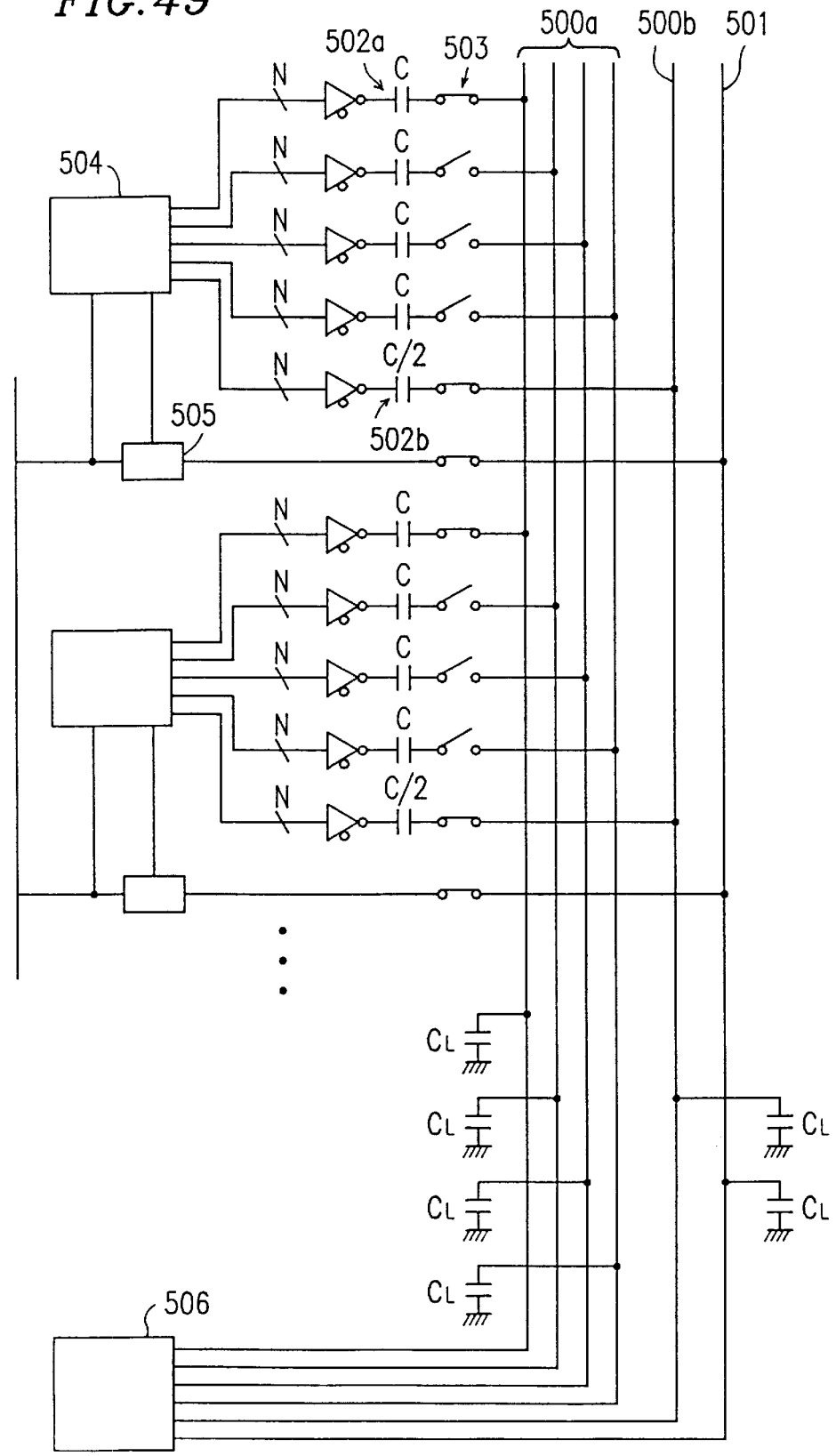
FIG. 49 is a diagram illustrating another improved modification of the data transfer circuit shown in FIG. 30.

FIG. 49 shows another improved modification of the example illustrated in FIG. 30. In this modification, data buses 500a and 500b are employed in place of the data buses 500 in FIG. 30. Data buses 500a and 500b consist of 5 lines and are capable of transferring 4-bit data. The data bus 500b is employed in combination of each of the four data buses 500a to transfer a differential signal. One end of each data bus 500a is connected via a switch to a capacitor 502a having a capacitance C. The data bus 500b is connected via a switch 503 to a capacitor 502b having a capacitance C/2. The data bus 500b is supplied with a reference potential.

Hereinafter, the operation of the present example will be described.

First, both ends of the capacitors 502a and 502b and the data buses 500a and 500b are precharged at a potential Vcc.

Figure 50:
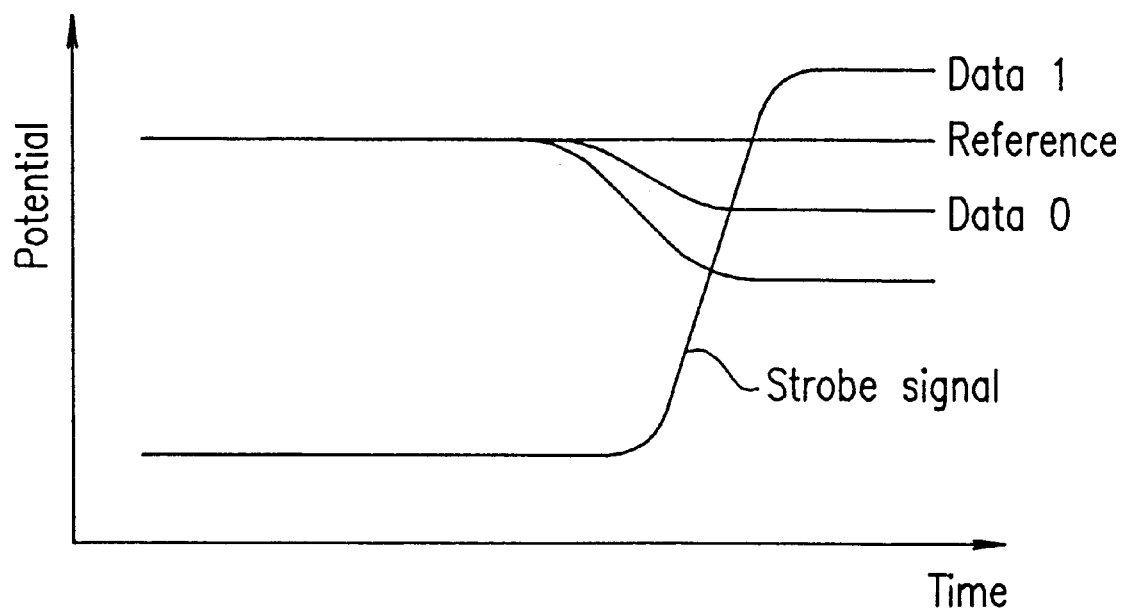
FIG. 50 is a diagram schematically showing changes in potentials of a data bus.

Next, the data transmission circuits 504 functions so that the n-MOS transistors become conductive. When transferring data "0", the potential of the data bus 500a through which the data is to be transferred decreases as shown in FIG. 50. On the other hand, when transferring data "1", the potential of the data bus 500a through which the data is to be transferred is maintained constant without decreasing.

At this time, the potential of the data bus 500b decreases. However, the decrease is small (as shown in FIG. 50) because of the capacitor 502b (having a capacitance C/2) connected to the data bus 500b. Specifically, the decrease in the potential of the data bus 500b is approximately a half of the decrease in the potential of the data bus 500a when transferring data "0". Therefore, the potential of the data bus 500b sufficiently provides a reference potential required for the transfer of a differential signal. Due to the incorporation of the data bus 500b, the transfer of N-bit data requires (N+1) data buses, instead of (2×N) data buses.

EXAMPLE 11

Next, an inter-chip transfer system incorporating a negative delay circuit will be described with reference to FIG. 36.

Figure 36:
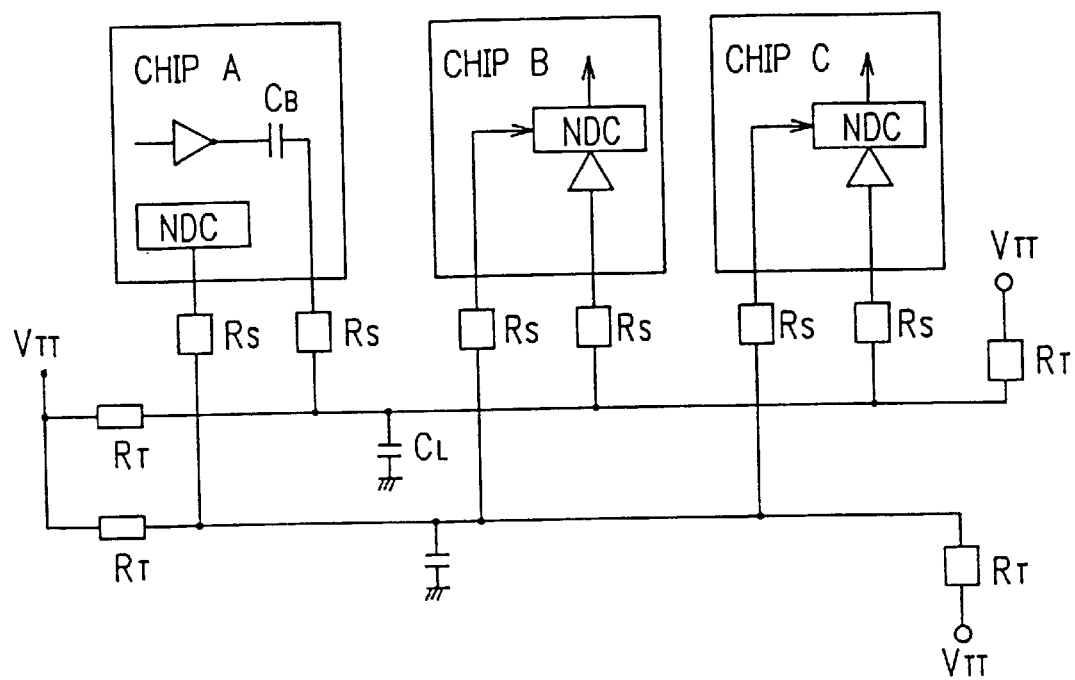
FIG. 36 is a diagram illustrating a semiconductor integrated circuit system according to the present invention.

As shown in FIG. 36, a plurality of semiconductor chips CHIPA, CHIPB, and CHIPC are connected to a capacitance coupling bus line (data transfer line) and a strobe signal line. Each end of the capacitance coupling bus line (coupling the semiconductor chips CHIPA, CHIPB, and CHIPC) and each end of the strobe signal line are connected to a supply source of a terminal voltage (Vtt) via a terminal resistor Rt. The semiconductor chips CHIPA, CHIPB, and CHIPC are each connected to the capacitance coupling bus line via a resistor Rs. The semiconductor chips CHIPA, CHIPB, and CHIPC are each connected to the strobe signal line via a resistor Rs. The resistor Rs functions as a damping resistance for preventing reflection. The resistances Rs can be omitted when the wiring length is so short that the reflection of signals does not constitute a substantial problem.

Now, a case will be described where data is transferred from the semiconductor chip CHIPA to the semiconductor chip CHIPB or semiconductor chip CHIPC. When the data transfer begins, a transceiver in the semiconductor chip CHIPA is first activated, and a coupling capacitor $C_B$ and the damping resistor Rs (for prevention of reflection) function to vary the potential of the capacitor coupling bus line. The varying range of the potential depends on the content of the data to be transferred. Prior to the varying of the potential, a strobe signal is transferred to the semiconductor chips CHIPB and CHIPC by a negative delay circuit (NDC). In response to the strobe signal, the semiconductor chips CHIPB and CHIPC operate to take in the data on the capacitor coupling bus line.

By thus generating a strobe signal using a negative delay circuit, high-speed data transfer between chips on a PCB (Printed Circuit Board) or MCM (Multi Chip Module) becomes possible.

EXAMPLE 12

Figure 37A:
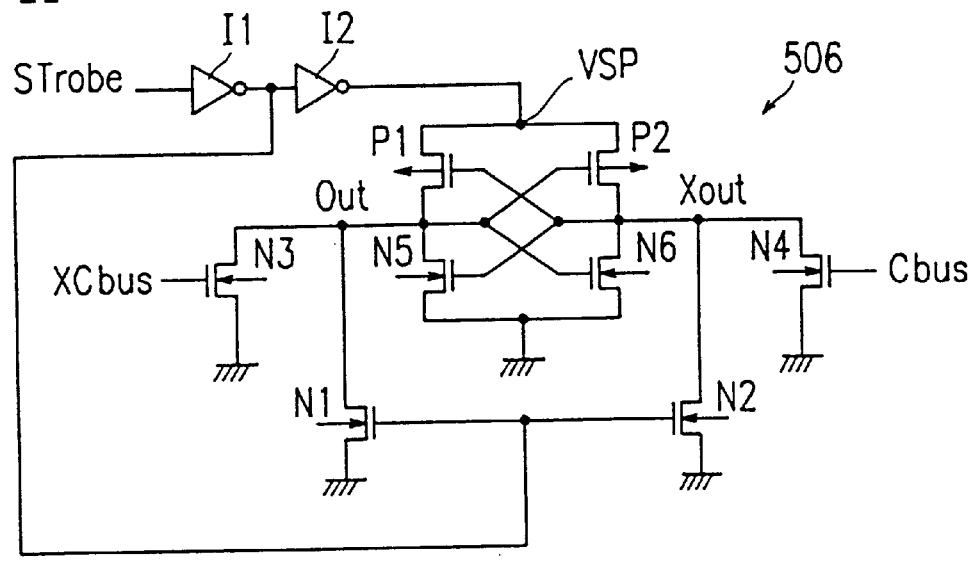
FIG. 37A is a diagram illustrating an exemplary configuration of a data receiving circuit according to the present invention.

FIG. 37A shows an exemplary internal structure of a data receiving circuit 506 (receiver) to be incorporated in the devices shown in FIGS. 30, 32, and 36.

The data receiving circuit 506 includes a differential amplifier. The data receiving circuit 506 senses a fine difference in potential between a pair of data lines and outputs complimentary signals (which are at either a high level or a low level; indicated as Cbus and XCbus in FIG. 37A) to a pair of output terminals OUT and XOUT in accordance with the polarity (i.e., positive or negative) of the detected potential difference.

The differential amplifier in the data receiving circuit 506 is a latch type sense circuit composed of p-type transistors P1 and P2 and n-type transistors N5 and N6.

The signals XCbus and Cbus are input to gates of n-type transistors N3 and N4, respectively. Sources of the n-type transistors N3 and N4 are coupled to a common potential line (e.g., a line for supplying a potential Vss). Drains of the n-type transistors N3 and N4 are coupled to sense nodes (i.e., output terminals OUT and XOUT) of the differential amplifier.

The pair of sense nodes OUT and XOUT are coupled to a common potential line (e.g., a line for supplying a potential Vss) via precharge transistors N1 and N2. When the transistors N1 and N2 conduct, the sense nodes OUT and XOUT are precharged at an initial voltage level (i.e., potential vss according to the present example). Thus, the transistors Ni and N2 function as a means for setting an initial voltage.

A node VSP, which is coupled to sources of the p-type transistors P1 and P2 of the differential amplifier, is coupled to a strobe signal line via two inverters I1 and I2. The strobe signal line is coupled to gates of the transistors N1 and N2 via the first inverter I1. When the potential of the strobe signal line is at the low level, the transistors N1 and N2 conduct, whereby precharging is realized.

Figure 37B:
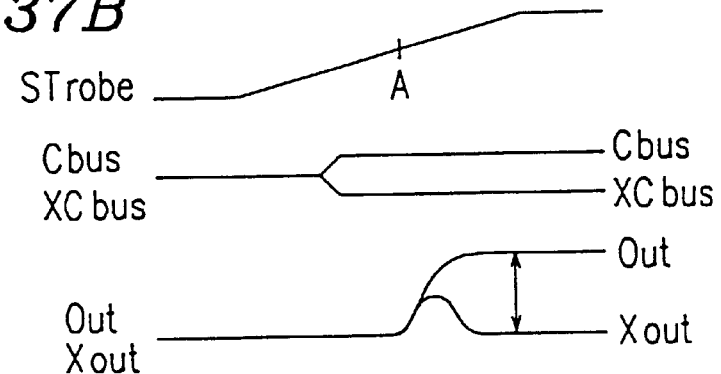
FIG. 37B is a diagram illustrating the operation of the circuit shown in FIG. 37A.

Hereinafter, the operation of the above-described data receiving circuit will be described with reference to FIGS. 37A and 37B.

It is assumed that the sense nodes OUT and XOUT of the differential amplifier are set at an initial voltage (i.e., potential Vss) by precharge. A strobe signal is input to the inverters I1 and I2. When the level of the strobe signal increases from the low level to finally exceed the input level of the inverters I1 and I2 (corresponding to point A shown in FIG. 37B), the data receiving circuit is activated. Thereafter, the potential of the node VSP coupled to the sources of the p-type transistors P1 and P2 also starts increasing, so that the potentials of the output terminals OUT and XOUT also start increasing. The amount of the current which flows through the n-type transistors N3 and N4 depends on the level of the signals XCbus and Cbus applied to the gates of the n-type transistors N3 and N4. As a result, the potentials of the output terminals OUT and XOUT have a difference that is in accordance with the signals XCbus and Cbus. The potential difference is amplified by the differential amplifier so as to become an output signal.

EXAMPLE 13

Figure 38A:
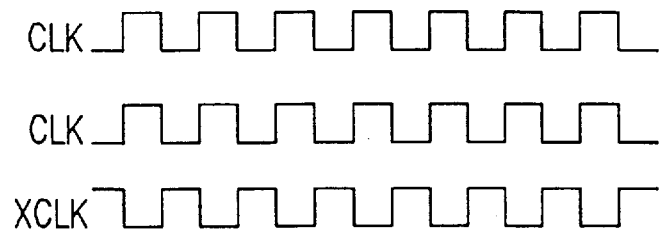
FIG. 38A is a diagram illustrating the waveforms of two-phase clock signals.

FIG. 38A shows an exemplary waveform of a single-phase clock signal and exemplary waveforms of two-phase clock signals. A two-phase clock system operates by using a first clock signal CLK and a second clock signal XCLK obtained by inverting the first clock signal CLK. Therefore, the two-phase clock system realizes a faster operation and higher reliability than is attained by the single-phase clock signal system.

Figure 38B:
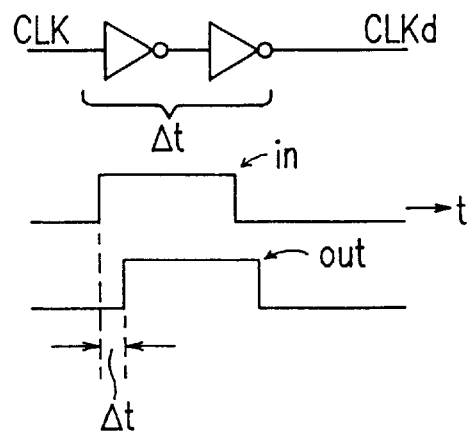
FIG. 38B is a diagram illustrating the delay of a clock signal in a clock relay/transfer device (i.e., a repeater).

As shown in FIG. 38B, in both the single-phase clock system and the two-phase clock system, the phase(s) of the clock signal(s) is delayed every time the clock signal passes through a repeater. This is because the phase of the clock signal is delayed as the clock signal passes through a buffer (composed of two inverters in the repeater by the delay time (Δt) of the buffer. The delay of phase can be reduced by, for example, providing the above-mentioned negative delay circuit (NDC) between the two inverters, as shown in FIG. 38C.

Figure 38C:
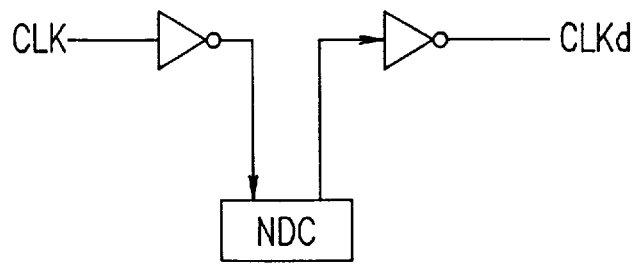
FIG. 38C is a diagram illustrating a single-phase clock relay/transfer device incorporating a negative delay circuit.
Figure 38D:
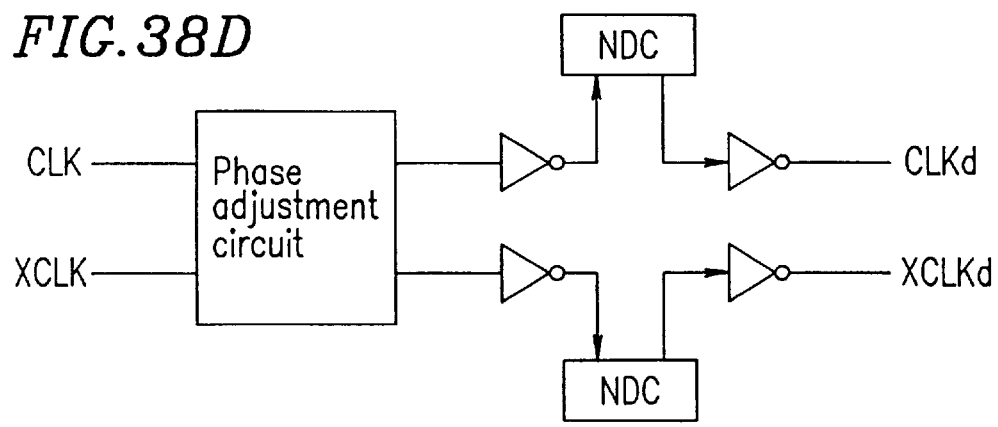
FIG. 38D is a diagram illustrating a multi-phase clock relay/transfer device incorporating a negative delay circuit and a phase adjustment device.

However, in the case of two-phase clock signals, merely providing the same negative delay circuit (NDC) between the two inverters on each clock signal line as shown in FIG. 38C cannot completely eliminate the phase delay. This is because the two clock signals may travel through signal paths of different lengths before they are input to the repeater so that the phases of the two clock signals may have shifted with respect to each other when the signals are input to the repeater. Such a phase offset can cause the circuitry to have a malfunction. In order to eliminate the phase offset, the system according to the present example incorporates a phase adjustment circuit between two clock signal lines as shown in FIG. 38D.

Instead of providing one negative delay circuit for each clock signal line, it is possible to allow two or more clock signal lines to share the same negative delay circuit.

Figure 39A:
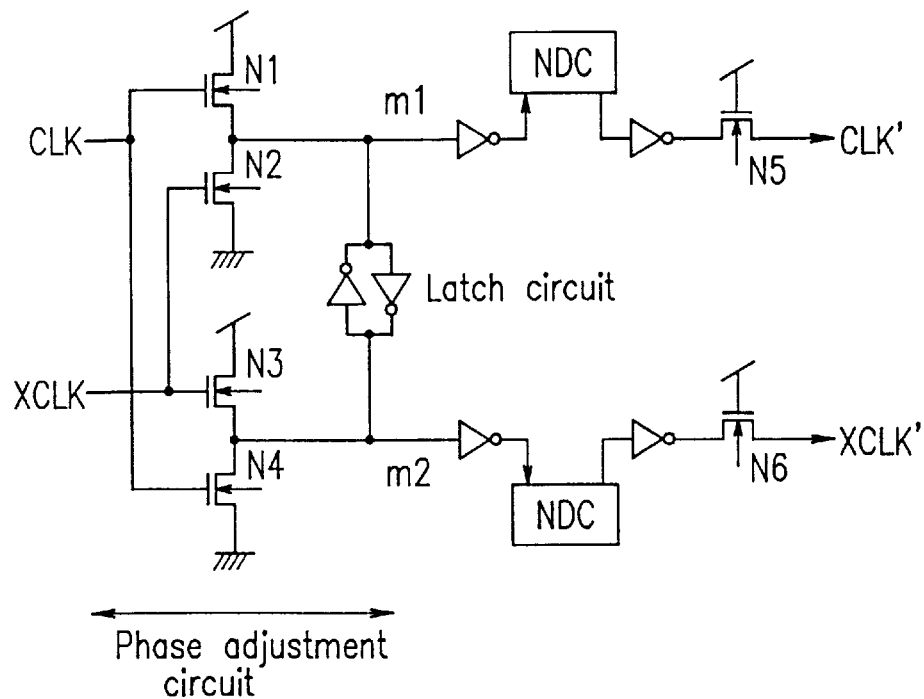
FIG. 39A is a diagram illustrating the details of the multi-phase clock relay/transfer device shown in FIG. 38D.

FIG. 39A is a more detailed diagram showing an exemplary configuration of a repeater including a phase adjustment circuit. The phase adjustment circuit includes four n-type MOS transistors N1 to N4 connected as shown in FIG. 39A and a latch circuit connected to nodes m1 and m2 of the clock signals. The first clock signal CLK is input to the respective gates of the n-type MOS transistors N1 and N4. The second clock signal XCLK is input to the gates of the n-type MOS transistors N2 and N3. The n-type MOS transistors Ni and N2 are serially connected between a power line and a ground line. The n-type MOS transistors N3 and N4 are also serially connected between a power line and a ground line. A junction between the n-type MOS transistors N1 and N2 is connected to the node m1. A junction between the n-type MOS transistors N3 and N4 is connected to the node m2. The latch circuit of the present example is composed of two inverters connected in reverse parallel.

Figure 39B:
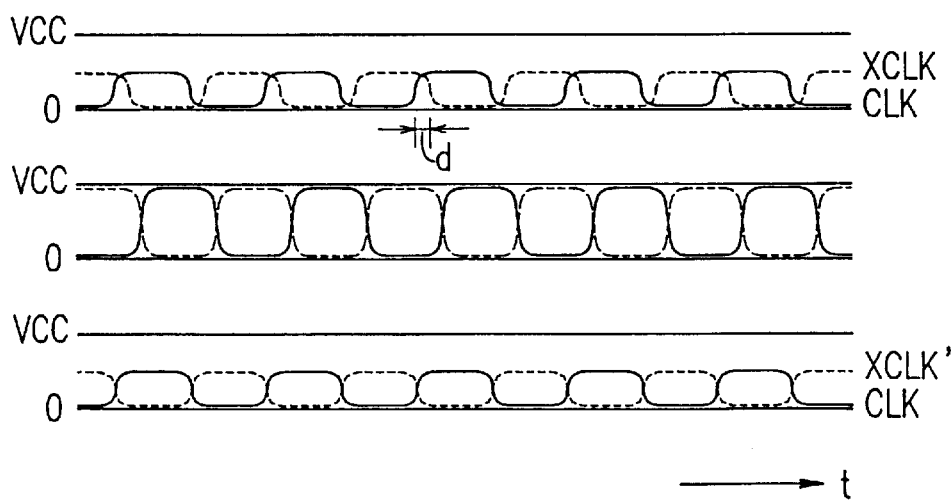
FIG. 39B is a diagram describing the operation of the multi-phase clock relay/transfer device shown in FIG. 39A.

Hereinafter, the operation of the above-mentioned circuit will be described with reference to FIG. 39B. The first clock signal CLK and the second clock signal XCLK are input to the respective gates of the n-type MOS transistors N1 to N4. As shown in FIG. 39B, the first clock signal CLK and the second clock signal XCLK both have a small amplitude, so that they do not fully swing between the potential Vcc and the potential Vss(0).

First, a case will be described where the first clock signal CLK shifts to the high level and the second clock signal XCLK shifts to the low level after a time corresponding to the phase offset (d). When the second clock signal XCLK has shifted to the low level, the potential of the node m1 increases to the potential Vcc and the potential of the node m2 reduces to the potential Vss. The small phase offset d between the first clock signal CLK and the second clock signal XCLK is eliminated by the inversion operation of the latch circuit. The signal waveforms which appear at the nodes m1 and m2 fully swing between the potential Vcc and the potential Vss(0). After the phase offset has been thus eliminated, the clock signals CLK and XCLK are each led through the negative delay circuit NDC so that the phases thereof are shifted toward the minus direction. Since the amplitudes of the clock signals CLK and XCLK are large, the amplitudes of the clock signals CLK and XCLK are reduced by the n-type MOS transistors N5 and N6. Thus, by employing the two-phase signal repeater shown in FIG. 39A, two-phase clock signals having small amplitudes, whose phases coincide with each other and are free from undesirable delay, can be provided. In the two-phase signal repeater, the amplitudes of the clock signals input to the negative delay circuits NDC are increased by the latch circuit. As a result, the delay operation in the negative delay circuits NDC is stably achieved with a high reliability.

EXAMPLE 14

Figure 40A:
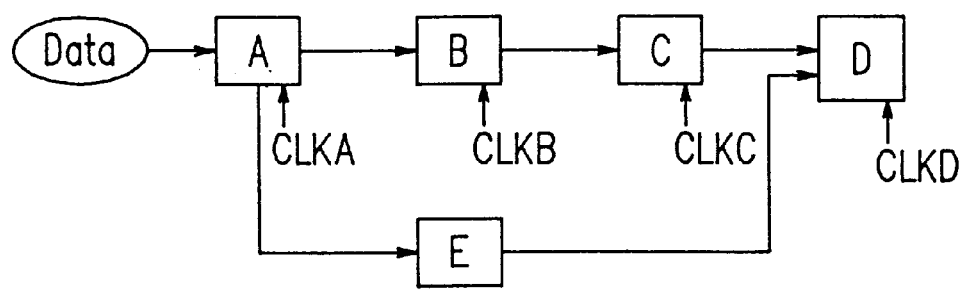
FIG. 40A is a block diagram describing a critical path.

When consecutively performing processes in a number of circuits, the so-called critical path becomes an important factor. FIG. 40A schematically shows a flow of data processes. Data which was processed by a circuit A follows two paths: the first leading through a circuit B, a circuit C, and a circuit D; and the second path leading through a circuit E and the circuit D. Before being processed by the circuit D, the data must travel through both paths. Assuming that the processes performed by the circuits A to D require the same amount of time, it takes longer for the data to travel through the first path than through the second path. The first path is called a critical path because the overall process time of the circuits A to D depends on the first path. Therefore, it is important to increase the speed of the processes performed in the critical path.

The process times of the circuits A to D can be reduced by increasing the operation speed of the entire system.

However, a larger operation speed of the system results in larger power being consumed during a stand-by state and during operations.

The present example employs a negative delay circuit so as to allow the circuits to be in a stand-by state immediately before data is input to the respective circuits. Herein, a stand-by state is defined as a state which consumes somewhat larger power but enables a high-speed operation to be immediately started.

Next, the operation according to the present example will be described with reference to FIGS. 40A and 40B.

A shown in FIG. 40A, clock signals CLKA to CLKD are supplied to circuits A to D respectively. The circuits A to D operate responsive to particular edges of the clock signals CLKA to CLKD.

Figure 40B:
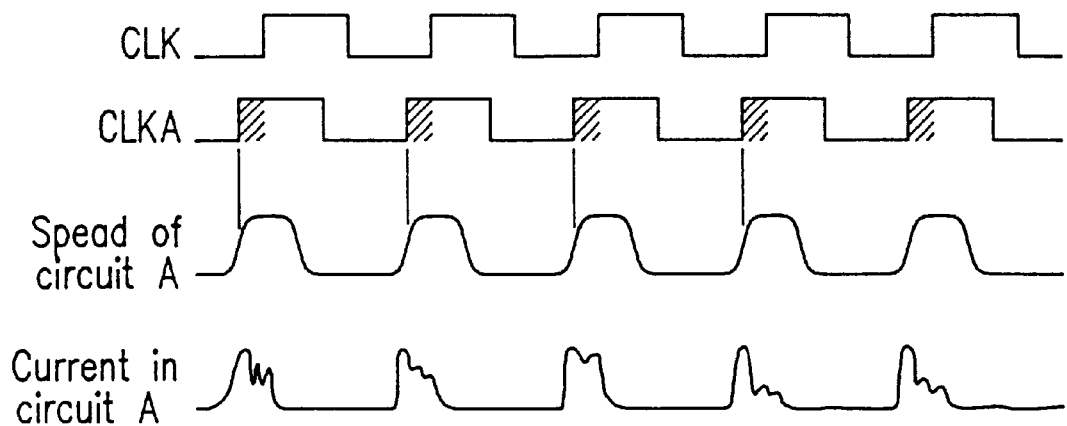
FIG. 40B is a waveform diagram.

For example, the clock signal CLKA, which is received by the circuit A, is a signal obtained by providing a minus delay for a clock signal CLK in a negative delay circuit, as shown in FIG. 40B. A current starts flowing to the circuit A when the clock signal CLKA shifts to the high level, thereby placing the circuit A in a stand-by state enabling a high-speed operation. When the clock signal CLKA shifts to the low level, no current flows to the circuit A. Data is input to the circuit A responsive to an edge of the clock signal CLK.

In accordance with the above configuration, the circuit A is already in a "stand-by" state when the data is input to the circuit A. Similarly, the clock signals CLKB to CLKD obtained delaying the clock signal CLK in the minus direction are input to the circuits B to D, respectively. The delay times of the clock signals CLKA to CLKD are adjusted independently for the circuits A to D, respectively.

According to the present example, the stand-by states of the respective circuits are started in response to rise edges of clock signals. There are conventional techniques for simultaneously starting or stopping the stand-by states of all the circuits included in a selected block. In contrast, the present invention is novel in that it can start or stop the stand-by states of the respective circuits responsive to clock signals in relatively short cycles. This is realized by the generation of clock signals having minus delays with respect to the clock signal CLKA by the negative delay circuits. Thus, it becomes possible to reduce the power consumption while attaining high-speed operation.

Next, a configuration for placing a circuit in a stand-by state for high-speed operation in response to a rise edge of a clock signal will be described with reference to FIGS. 41A, 41B, and 41C.

Figure 41A:
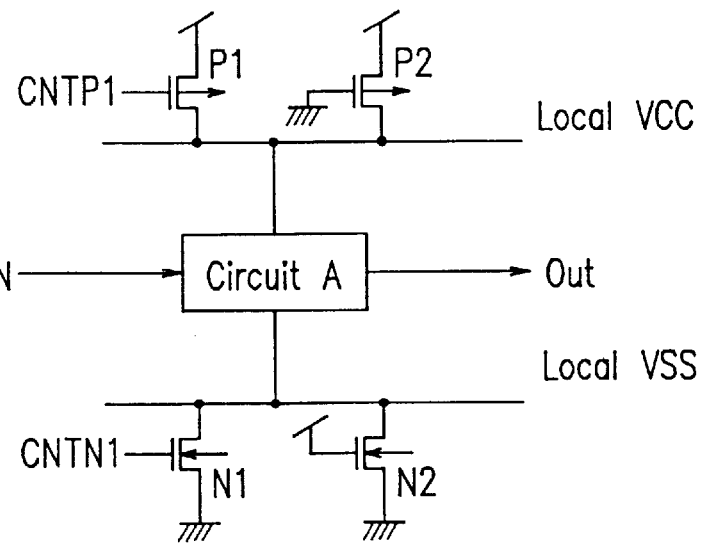
FIG. 41A is a diagram illustrating the configuration of a circuit capable of taking either a stand-by state and a state enabling high-speed operation.

As shown in FIG. 41A, the circuit A is connected between a first local power line for supplying a relatively high supply potential (Vcc) and a second local power line for supplying a relatively low supply potential (Vss). The first local power line Vcc is connected to a first global power line via two switching transistors P1 and P2. The second local power line Vss is connected to a second global power line via two switching transistors N1 and N2.

The switching transistors P1 and N1 are "large size" transistors (i.e., having a large channel width). The transistor P1 conducts in accordance with a control signal CNTP1. The transistor N1 conducts in accordance with a control signal CNTN1. On the other hand, the transistors P2 and the transistors N2 are "small size" transistors (i.e., having a small channel width), and they always conduct.

Before data is input to the circuit A, only the transistors P2 and N2 conduct. Since the internal state of the circuit A does not change, no large current flows therethrough, whereby the power consumption is kept low. Since the potentials of the first and second local power lines Vcc and Vss do not change either, the circuit A is prevented from having malfunctions.

Figure 41B:
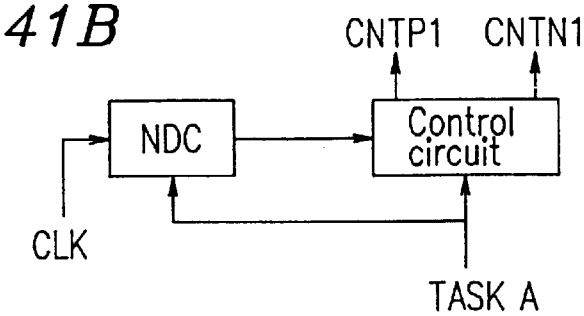
FIG. 41B is a diagram illustrating a control circuit for causing the states of the circuit shown in FIG. 41A to change.
Figure 41C:
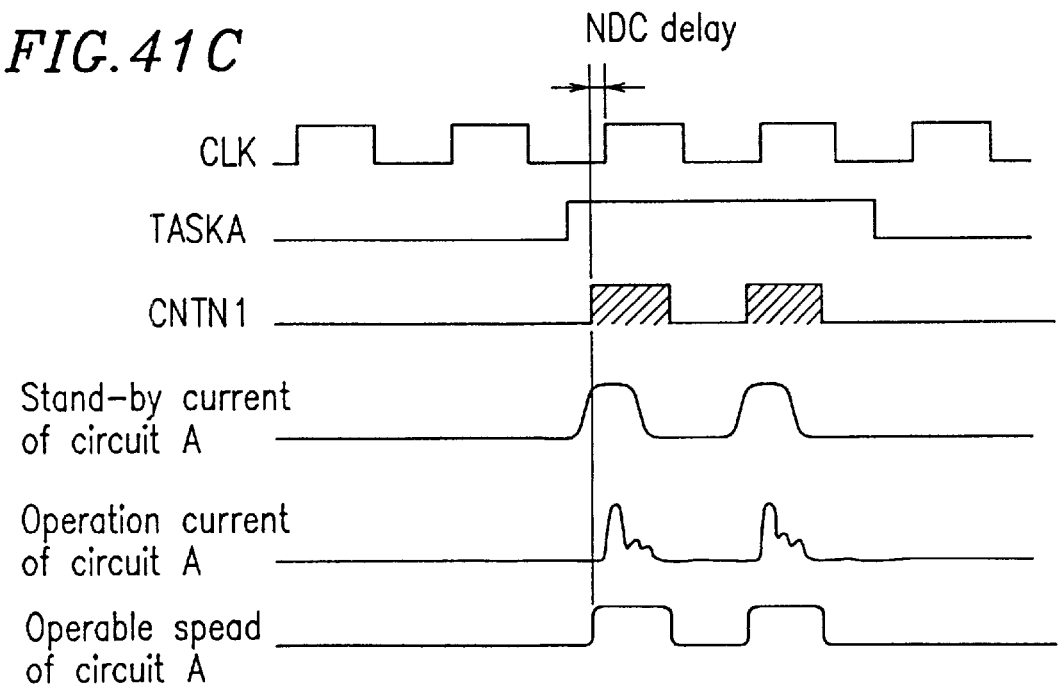
FIG. 41C is a signal waveform diagram.

As shown in FIG. 41B, the control signals CNTN1 and CNTP1 are generated by a control circuit. The control circuit receives a clock signal CLK and a signal TASKA, which indicates that data is arriving, so as to output the control signals CNTN1 and CNTP1. The control signal CLK is input to the control circuit after being delayed in the minus direction in a negative delay circuit (NDC).

Next, the operation of the above circuitry will be described with reference to FIG. 41C.

After receiving the signal TASKA indicating the arrival of data, the control circuit outputs control signals CNTN1 and CNTP1 responsive to a rise edge of the clock signal CLK. The levels of the control signals CNTP1 and CNTN1 are prescribed to be large enough to cause the large-size transistors P1 and N1 to conduct. The control signals CNTP1 and CNTN1 cause the transistors P1 and N1 to start conducting by a predetermined time before data is input to the circuit responsive to a rise edge of the clock signal CLK. The predetermined time can be 1 ns to 10 ns, for example. While the transistors P1 and N1 conduct, a stand-by current flows through the circuit A. The operation speed of the circuit A and the operation current which actually flows through the circuit A are as shown in FIG. 41C.

Thus, while operating the entire semiconductor chip or the entire block, a particular circuit can be selectively placed in a stand-by state (for high-speed operation) for a desired period of time, while minimizing the level of the current flowing through the circuits during other periods. The desired period can be controlled based on the position of the edge of the clock signal. Therefore, it is possible to reduce not only the stand-by current flowing through the entire semiconductor chip, but also the current required for operation. The operation of the circuit A can be further enhanced by prescribing the threshold values of the transistors in the circuit A to be smaller than those of the switching transistors.

In the above-described example, the level of the current flowing through the circuit is adjusted based on the sizes of the switching transistors. Next, an example will be described where the driving power of the transistors are controlled by varying the threshold values thereof with reference to FIGS. 42A, 42B, and 42C.

Figure 42A:
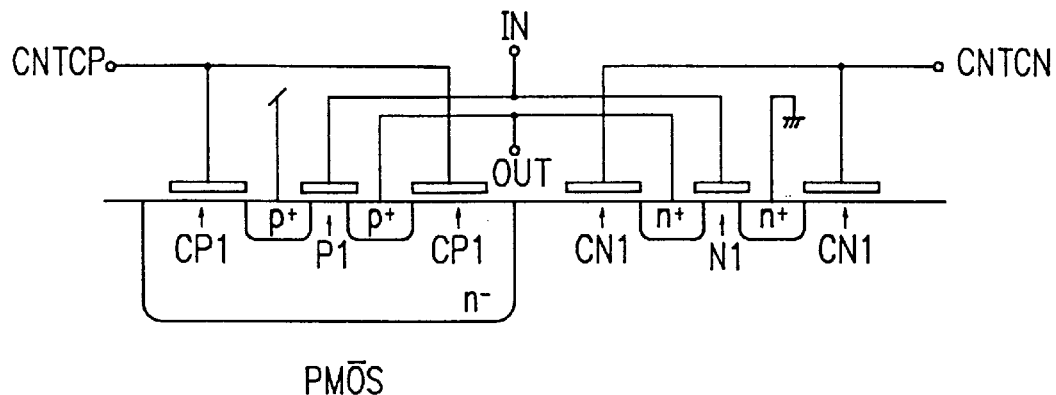
FIG. 42A is a diagram illustrating an exemplary configuration for a transistor having variable capability of supplying a current.

As shown in FIG. 42A, an n-type well is formed in a p-type silicon substrate. Furthermore, a p-type MOS transistor P1 and a capacitor CP1 surrounding the p-type MOS transistor P1 are formed in the n-type well. In a p-type region of the p-type silicon substrate, an n-type MOS transistor N1 and a capacitor CN1 surrounding the n-type MOS transistor N1 are formed.

Figure 42B:
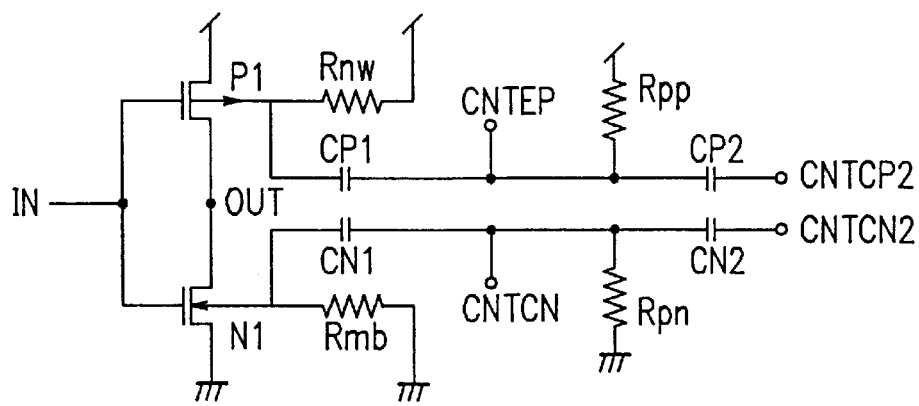
FIG. 42B is an equivalent circuit diagram illustrating the transistor shown in FIG. 42A.

In the equivalent circuit diagram of FIG. 42B, control capacitors CP2 and CN2 are additionally shown.

Figure 42C:
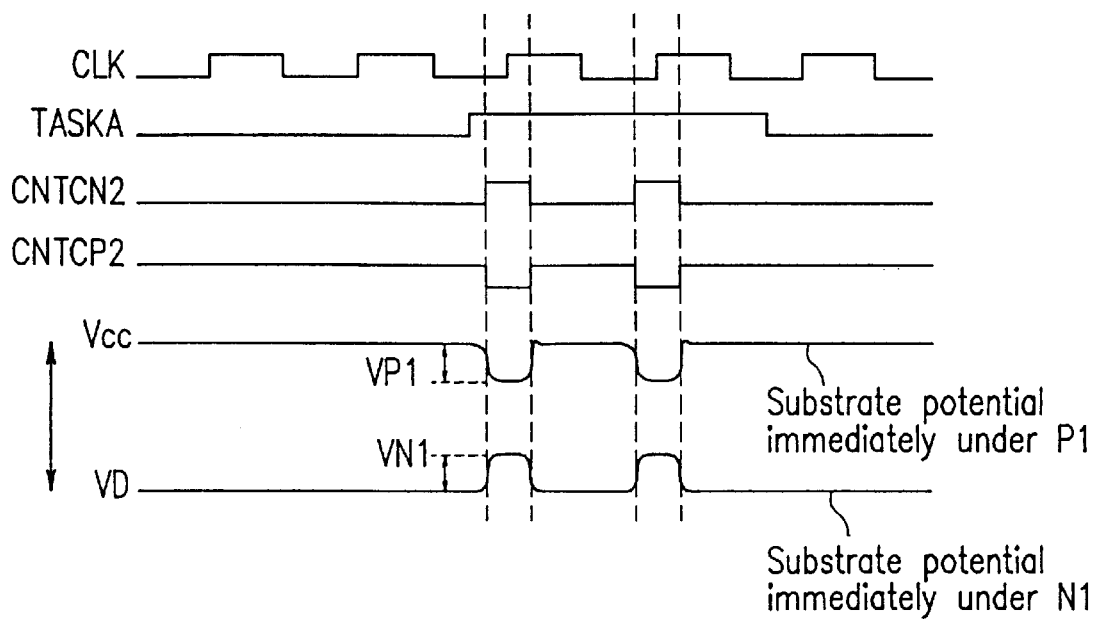
FIG. 42C is a signal waveform diagram.

Control signals CONTN2 and CONTP2 are controlled in the manner shown in FIG. 42C in accordance with a clock signal CLK and a signal TASKA for indicating that data is arriving.

As shown in FIG. 42C, the substrate potential of a portion directly under the transistor P1 and the substrate potential of a portion directly under the transistor N1 vary for a very short period time before and after a clock edge which is activated. The substrate potentials vary so as to be closer to the drain potentials of the transistors. Specifically, the substrate potential of the portion directly under the transistor P1 decreases by VP1, and the substrate potential of the portion directly under the transistor N1 increases by VN1. The substrate potential change VP1 is determined by a ratio between the capacitance of the capacitor CP1 and the capacitance of the capacitor CP2. The substrate potential change VN1 is determined by a ratio between the capacitance of the capacitor CN1 and the capacitance of the capacitor CN2.

When the absolute value of the threshold value Vt of the transistors changes due to the above-mentioned substrate bias effect, the current driving ability of the transistors temporarily increase. This enables a high-speed operation.

In the present example, the substrate potentials of the transistors are instantly changed by utilizing capacitor coupling. However, other configurations are also applicable to the invention.

Figure 43:
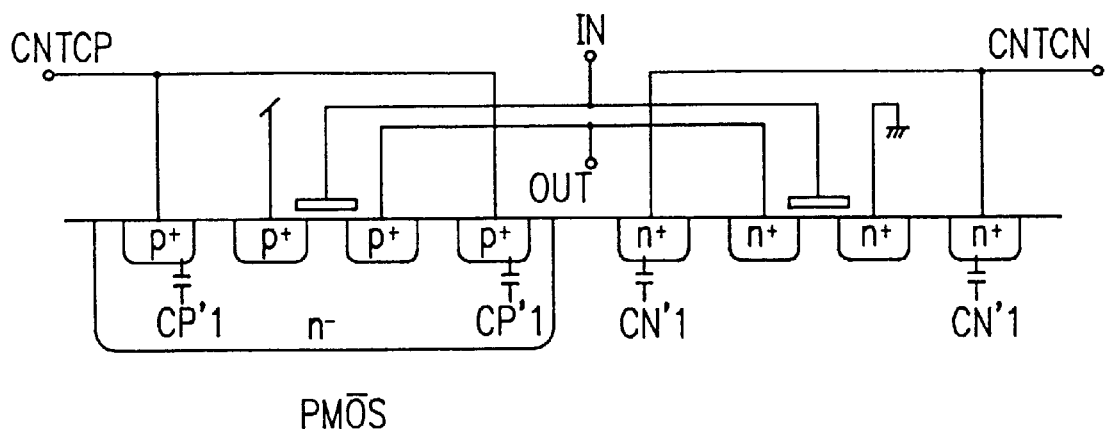
FIG. 43 is a diagram illustrating an exemplary configuration for a transistor having variable capability of supplying a current.

For example, it is applicable to employ p-n junctions in the place of the capacitors CP1 and CN1. FIG. 43 shows a main portion of a semiconductor IC in which capacitances CP'1 and CN'1 based on p-n junctions are formed in the place of the capacitors CP1 and CN1. In this example, an impurity diffused region of the same conductivity type as that of the source/drain regions of each MOS transistor is formed around the MOS transistor. When control signals CNTCP and CNTCN are applied to the impurity diffused regions, the substrate biases of the respective MOS transistors vary, thereby varying the threshold values of the transistors in the above-described manner.

EXAMPLE 15

Various circuits and devices utilizing circuits and methods for generating a timing signal (internal clock signal) according to the present invention have been described. Finally, a circuit according to the present invention will be described in which delay time is adjusted in accordance with the respective scales (load capacitances) of a plurality of circuit blocks.

A typical conventional circuit of this sort utilizes a clock signal output from a PLL circuit or the like, the clock signal branching out in a tree-like divergence so as to be supplied to a plurality of circuit blocks. However, in such a circuit, the capacities of the clock signal lines differ depending on the sizes (load capacitances) of the circuit blocks. Therefore, a number of buffers are typically provided for each circuit block, the number corresponding to the load capacitance thereof, so as to adjust the operation timing among circuit blocks.

Figure 45A:
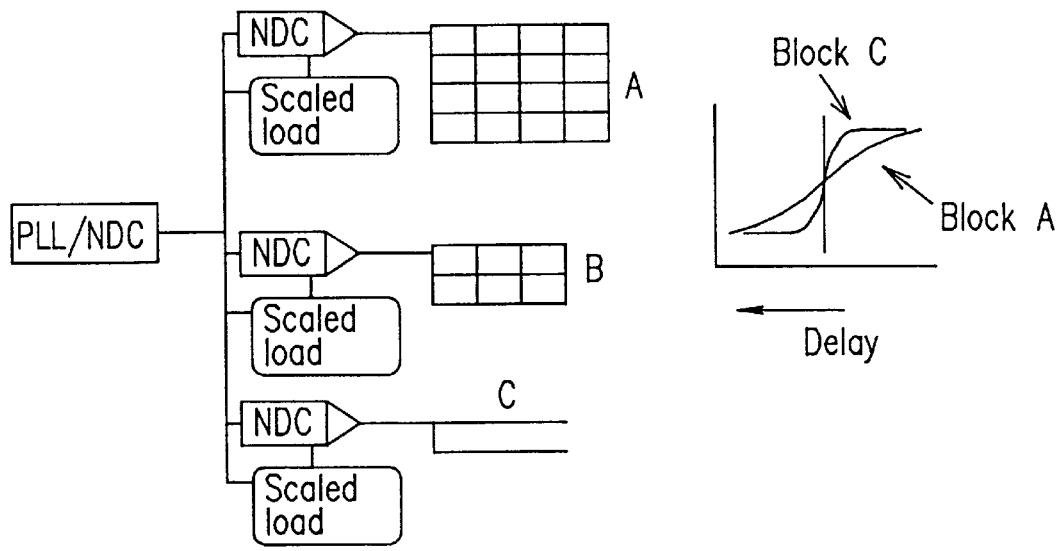
FIG. 45A is a diagram illustrating a system for supplying a timing signal to a plurality of circuit block by utilizing a plurality of timing generation circuits according to the present invention.

On the other hand, according to the present example, the number of buffers (not shown) is kept substantially constant from clock signal line to clock signal line, which have different load capacitances as shown in FIG. 45A.

In order to avoid the problem of skewing (i.e., the blunting of the waveform of the clock signal in a clock signal line having a large load capacitance), a timing signal having an edge created earlier by a time corresponding to the blunting is transmitted to each block. Such a timing signal can be obtained as a clock signal having a negative delay, e.g., a signal which is generated by any of the above-mentioned timing generation circuits (NDC) of the present invention. The amount of time by which the edge of the clock signal is advanced (i.e., how long the negative delay time should be) can be adjusted by means of a scaled load circuit connected to the timing signal generation circuit (NDC) for transmitting a clock signal to each circuit block.

Figure 45B:
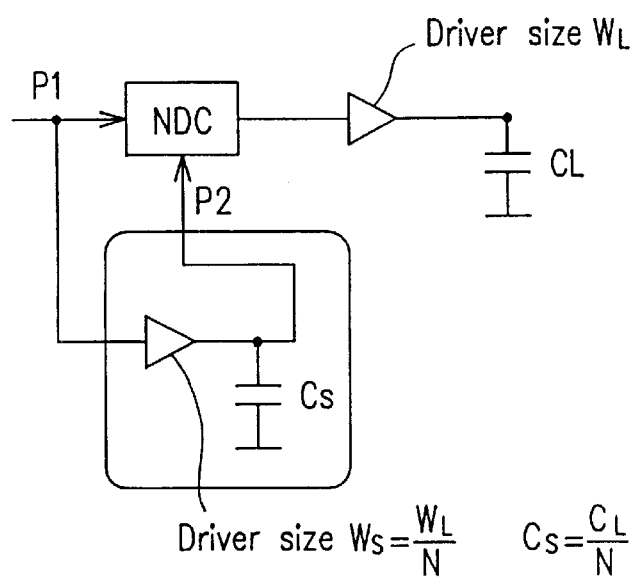
FIG. 45B is a diagram illustrating the configuration of a scaled load circuit.
Figure 46:
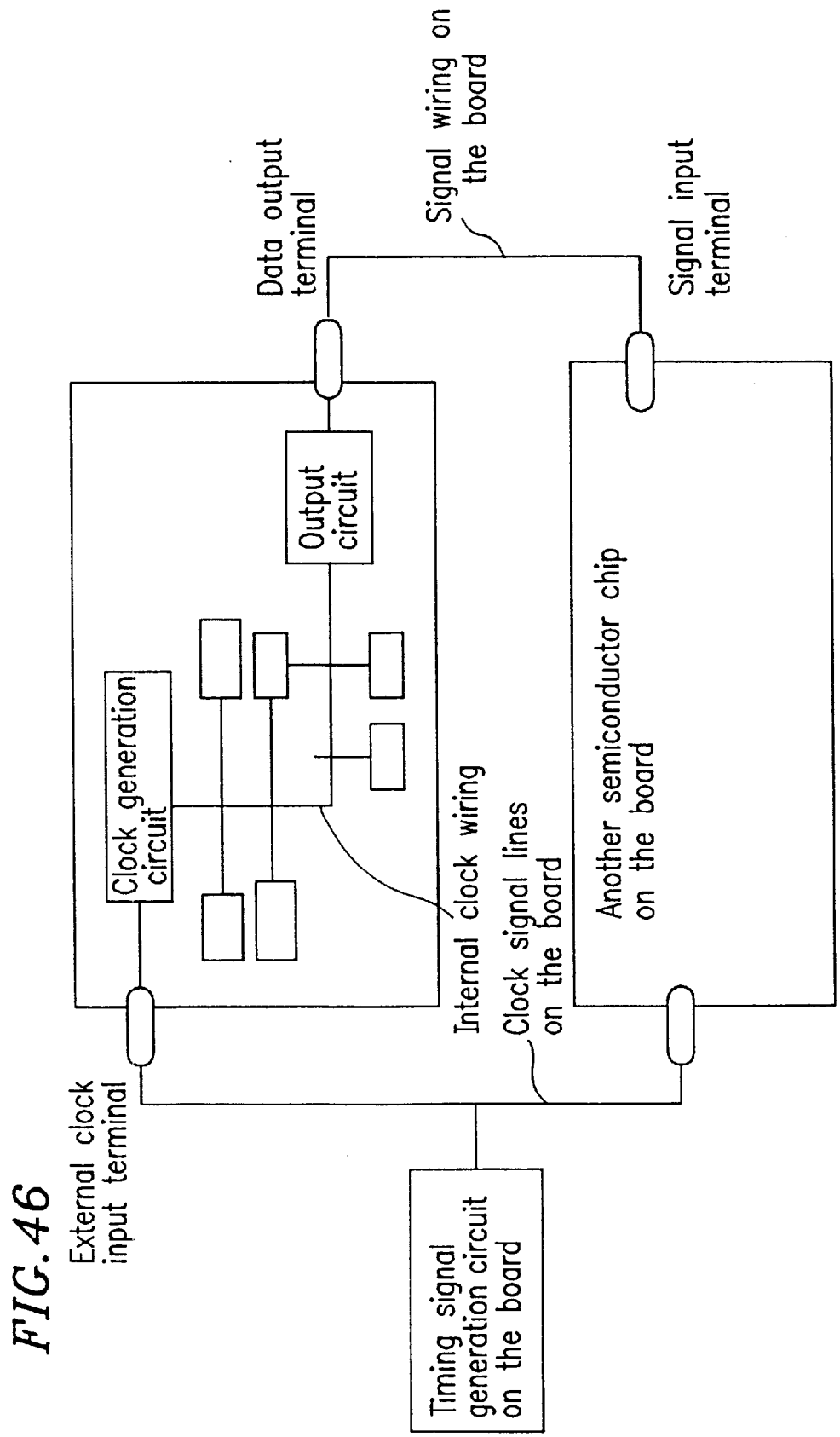
FIG. 46 is a diagram illustrating the configuration of a semiconductor device incorporating a conventional clock signal generation circuit.
Figure 47:
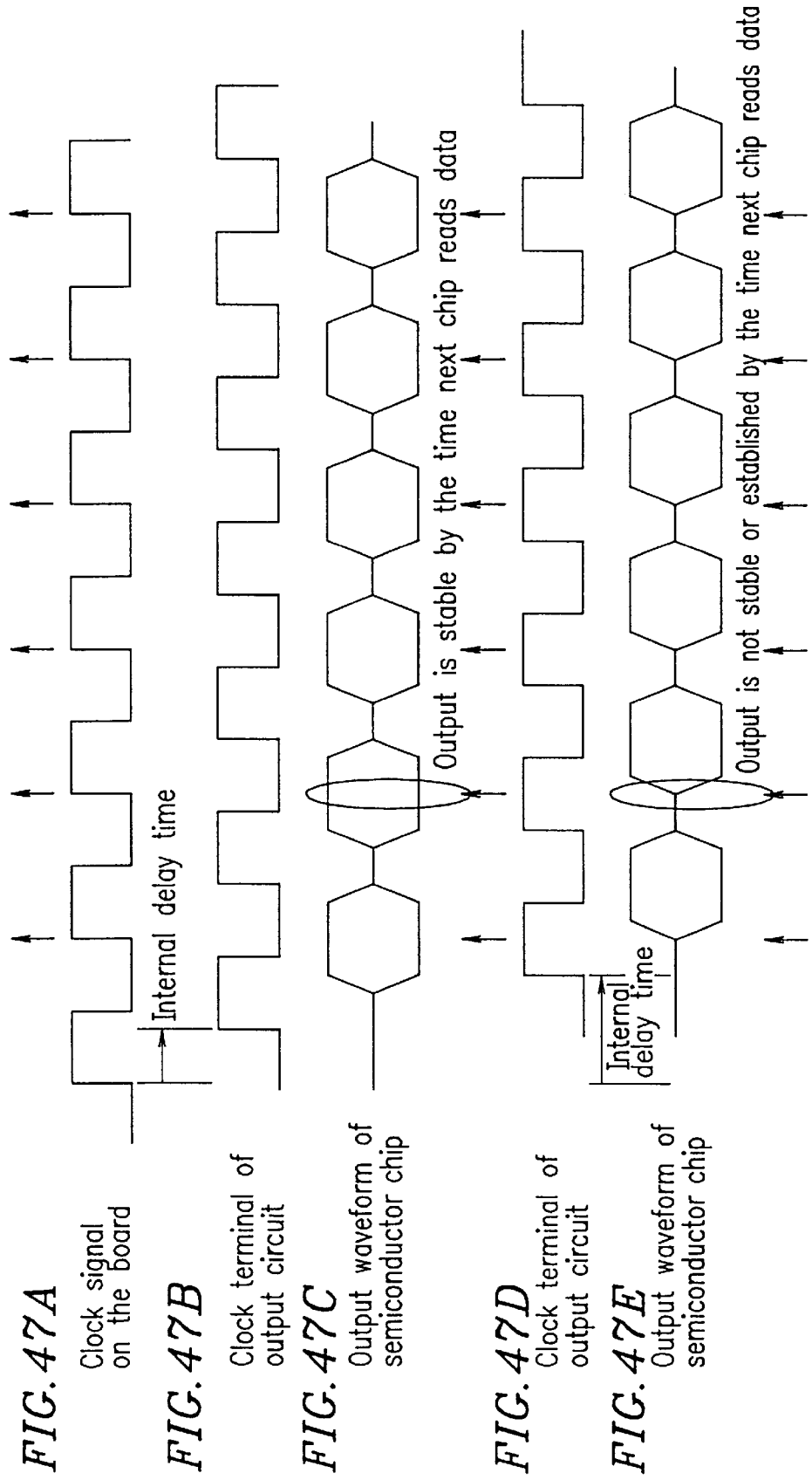
FIG. 47A is a waveform diagram illustrating an external clock signal generated by a timing signal generation circuit on a circuit board.
FIG. 47B is a signal waveform diagram illustrating a signal on a clock terminal of an output circuit having a small internal delay.
FIG. 47C is a signal waveform diagram illustrating a signal from a semiconductor chip having a small internal delay.
FIG. 47D is a signal waveform diagram illustrating a signal on a clock terminal of an output circuit having a large internal delay.
FIG. 47E is a signal waveform diagram illustrating a signal from a semiconductor chip having a large internal delay.
Figure 48:
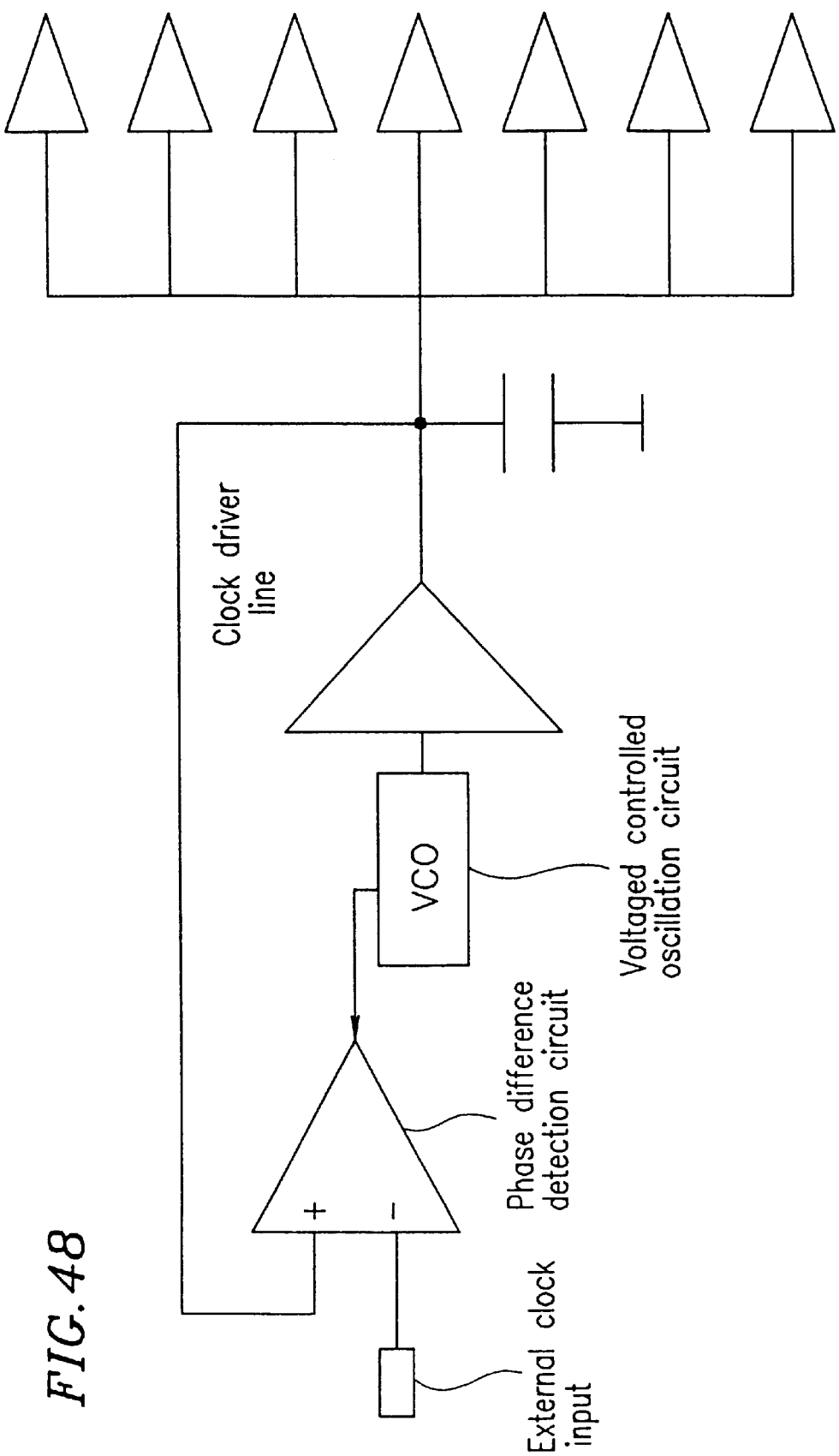
FIG. 48 is a diagram illustrating the configuration of a PLL circuit.

FIG. 45B shows the configuration of the scaled load circuit. The scaled load circuit includes a driver and a capacitor coupled to the output of the driver. The scaled driver receives a reference clock signal P1 and supplies a delayed signal P2 to the timing signal generation circuit (NDC).

Assuming that the driver provided on the clock signal line for each block has a size $W_L$ and a load capacitance $C_L$, its corresponding scaled load circuit includes a driver of a size $W_S = W_L/N$ and a capacitance $C_S = C_L$. By adopting such a configuration, a clock signal which is earlier by an appropriate time in view of the load capacitance $C_L$ can be supplied to each clock block.

Figure 44:
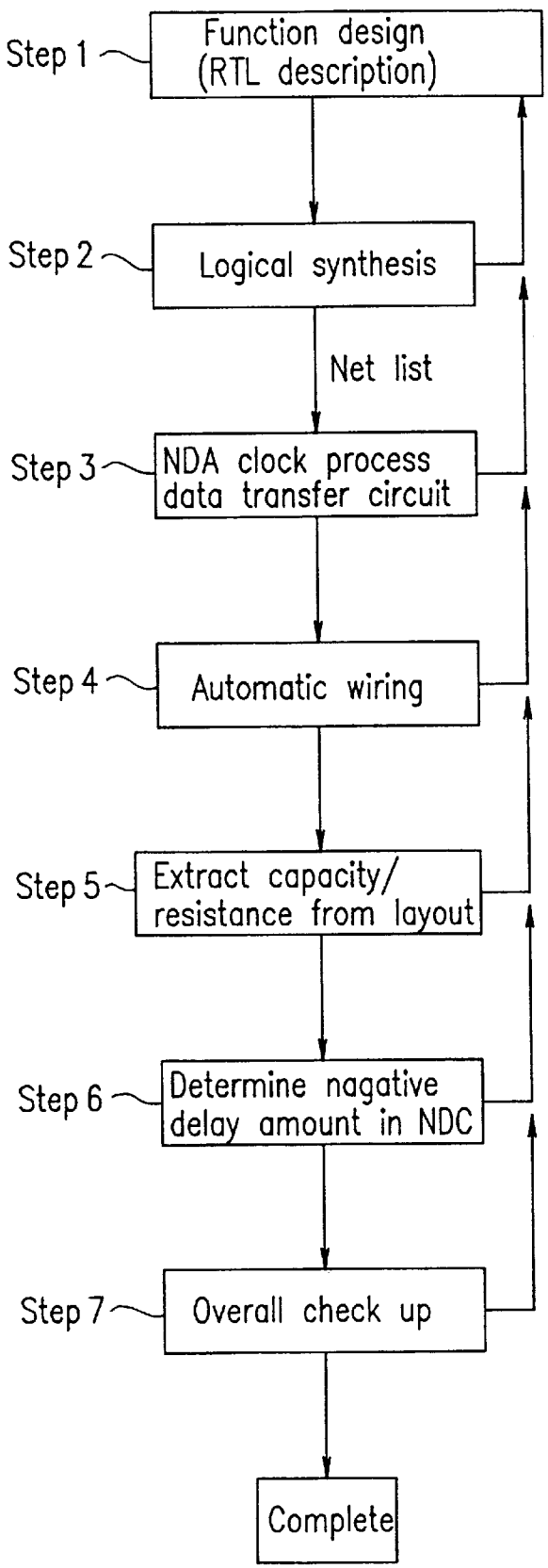
FIG. 44 is a flowchart illustrating layout designing according to the present invention.

Next, a layout design of a semiconductor integrated circuit system including a negative delay circuit will be described with reference to FIG. 44.

First, in Step 1, the function of the system is designed by methods such as RTL (Register Transfer Level), as in a conventional synchronization designing process (RTL description).

In Step 2, the result of the RTL description is input to a logic synthesis tool in order to generate a net list as in the case of a conventional synchronization designing process. In Step 3, the net list is subjected to an appropriate process, whereby components such as clock signal transmission circuits based on negative delay circuits and data transfer circuits based on capacitance connection buses are inserted into the net list. In Step 4, automatic wiring is conducted based on the resultant net list, whereby mask data is obtained.

In Step 5, capacity, wiring resistance, etc., are extracted from the mask data obtained through automatic wiring. The result is utilized in Step 6 so as to determine the magnitude of negative delay to be provided by the negative delay circuits. The negative delay value is input to a negative delay circuit. When determining the magnitude of negative delay, mask options, e.g., contact hole locations, are used.

In Step 7, parameters are again extracted from layout data obtained in the above-mentioned manner so as to perform an overall checkup test, e.g., a simulation test. If the test does not yield any problems, the layout data is complete.

As described above, according to the present invention, a timing signal (internal clock signal) having a pseudo-negative delay time with respect to a reference clock signal (system clock signal) can be generated. As a result, a desired timing signal can be generated within a very short setup time. Moreover, the data transfer time can be minimized, and it becomes possible to switch the clock frequency on-the-fly.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A clock signal generation device, comprising:
    a first delay circuit for generating a first delayed clock edge from a first reference clock edge, the first delayed clock edge being delayed by a predetermined time;
    means for measuring a time difference between the first delayed clock edge and a second reference clock edge, the second reference clock edge occurring later than the first reference clock edge;
    means for storing time difference information concerning the time difference measured by the means for measuring; and
    a second delay circuit for generating a second delayed clock edge from a third reference clock edge, the third reference clock edge occurring later than the first reference clock edge, and the second delayed clock edge being delayed by a time based on the time difference information stored in the means for storing.

2. A clock signal generation device according to claim 1, wherein the second reference clock edge is identical with the third reference clock edge.

3. A clock signal generation device according to claim 1, wherein the means for measuring comprises:

a plurality of serially coupled delay units; and control means for disabling coupling of the delay units in response to the second reference clock edge.

4. A clock signal generation device according to claim 3, wherein each of the delay units comprises an inverter.

5. A clock signal generation device, comprising:

a first delay circuit for generating a first delayed clock edge from a first reference clock edge, the first delayed clock edge being delayed by a predetermined time;

means for measuring a time difference between the first delayed clock edge and a second reference clock edge during a first half of a period of a reference clock signal operatively coupled thereto, the second reference clock edge occurring later than the first reference clock edge;

means for storing time difference information concerning the time difference measured by the means for measuring; and a second delay circuit for generating a second delayed clock edge from a third reference clock edge during a second half of the period of the reference clock signal operatively coupled thereto, the third reference clock edge occurring later than the first reference clock edge, and the second delayed clock edge being delayed by a time based on the time difference information stored in the means for storing.

6. A clock signal generation device according to claim 5, further comprising means for generating a divided clock signal from the reference clock signal, wherein the first half of the period of the reference clock signal is a first half of a period of the divided clock signal and the second half of the period of the reference clock signal is a second half of the period of the divided clock signal.

7. A clock signal generation device according to claim 5, wherein the second reference clock edge is identical with the third reference clock edge.

* * * * *